United States Patent
Yamasaki et al.

(10) Patent No.: US 8,921,688 B2
(45) Date of Patent: Dec. 30, 2014

(54) COMPOSITE FILM FOR SUPERSTRATE SOLAR CELL HAVING CONDUCTIVE FILM AND ELECTROCONDUCTIVE REFLECTIVE FILM FORMED BY APPLYING COMPOSITION CONTAINING METAL NANOPARTICLES AND COMPRISING AIR PORES OF PRESET DIAMETER IN CONTACT SURFACE

(75) Inventors: Kazuhiko Yamasaki, Naka-gun (JP); Toshiharu Hayashi, Naka-gun (JP); Masahide Arai, Naka-gun (JP); Satoko Ogawa, Naka-gun (JP); Yoshiaki Takata, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 834 days.

(21) Appl. No.: 12/733,585
(22) PCT Filed: Sep. 12, 2008
(86) PCT No.: PCT/JP2008/066605
§ 371 (c)(1),
(2), (4) Date: Mar. 10, 2010
(87) PCT Pub. No.: WO2009/035112
PCT Pub. Date: Mar. 19, 2009

(65) Prior Publication Data
US 2010/0218822 A1 Sep. 2, 2010

(30) Foreign Application Priority Data

| | | |
|---|---|---|
| Sep. 12, 2007 | (JP) | 2007-236546 |
| Aug. 8, 2008 | (JP) | 2008-205849 |
| Aug. 8, 2008 | (JP) | 2008-205862 |
| Aug. 8, 2008 | (JP) | 2008-205867 |
| Aug. 8, 2008 | (JP) | 2008-205870 |
| Sep. 2, 2008 | (JP) | 2008-224497 |
| Sep. 2, 2008 | (JP) | 2008-224499 |
| Sep. 2, 2008 | (JP) | 2008-224508 |
| Sep. 2, 2008 | (JP) | 2008-224513 |
| Sep. 2, 2008 | (JP) | 2008-224515 |

(51) Int. Cl.
*H01L 31/00* (2006.01)
*B05D 5/12* (2006.01)
(Continued)

(52) U.S. Cl.
CPC .... *H01L 31/03921* (2013.01); *H01L 31/02168* (2013.01); *H01L 31/02366* (2013.01); *H01L 31/0527* (2013.01); *Y02E 10/52* (2013.01)
USPC .............................................. 136/256; 427/74

(58) Field of Classification Search
CPC ...................... H01L 31/03921; H01L 31/0527; Y02E 10/52
USPC ......................................................... 136/256
See application file for complete search history.

(56) References Cited

U.S. PATENT DOCUMENTS 6,136,228 A * 10/2000 Hirai et al. ..................... 252/512
(Continued)

FOREIGN PATENT DOCUMENTS

EP 0698929 A2 2/1996
(Continued)

OTHER PUBLICATIONS

English machine translation of JP H10-012059 A, 2013.*
(Continued)

*Primary Examiner* — Jonathan Johnson
*Assistant Examiner* — Angelo Trivisonno
(74) *Attorney, Agent, or Firm* — Edwards Wildman Palmer LLP

(57) ABSTRACT

A composite film for a superstrate solar cell or a substrate solar cell has a transparent conductive film and a conductive reflective film, wherein the transparent conductive film is formed by using a wet coating method to apply a transparent conductive film composition or dispersion containing microparticles of a conductive oxide, the conductive reflective film is formed by using a wet coating method to apply a conductive reflective film composition containing metal nanoparticles, the average diameter of holes occurring at the contact surface of the conductive reflective film on either the side of the photovoltaic layer or the side of the transparent conductive film is not more than 100 nm, the average depth at which the holes are positioned is not more than 100 nm, and the number density of the holes is not more than 30 holes/$\mu m^2$.

1 Claim, 5 Drawing Sheets

(51) Int. Cl.
  *H01L 31/0392* (2006.01)
  *H01L 31/0216* (2014.01)
  *H01L 31/0236* (2006.01)
  *H01L 31/052* (2014.01)

(56) References Cited

U.S. PATENT DOCUMENTS

| | | | |
|---|---|---|---|
| 6,366,333 B1 | 4/2002 | Yamamoto et al. | |
| 2005/0062019 A1* | 3/2005 | Yukinobu | 252/500 |
| 2008/0128287 A1* | 6/2008 | Wu et al. | 205/109 |

FOREIGN PATENT DOCUMENTS

| JP | 59-167056 A | | 9/1984 |
|---|---|---|---|
| JP | 02-007476 A | | 1/1990 |
| JP | 02-106077 A | | 4/1990 |
| JP | 03-227576 A | | 10/1991 |
| JP | 05-075154 A | | 3/1993 |
| JP | 05-095127 A | | 4/1993 |
| JP | 06-509910 T | | 11/1994 |
| JP | 07-102177 A | | 4/1995 |
| JP | 08-022722 A | | 1/1996 |
| JP | 08-102227 A | | 4/1996 |
| JP | 09-246577 A | | 9/1997 |
| JP | 09246577 A | * | 9/1997 |
| JP | 09-263716 A | | 10/1997 |
| JP | 10-012059 A | | 1/1998 |
| JP | 10012059 A | * | 1/1998 |
| JP | 10-326903 A | | 12/1998 |
| JP | 11-195801 A | | 7/1999 |
| JP | 2000-239853 A | | 9/2000 |
| JP | 2001-160326 A | | 6/2001 |
| JP | 2003-179241 A | | 6/2003 |
| JP | 2003-327870 A | | 11/2003 |
| JP | 2005-268547 A | | 9/2005 |
| JP | 2005-538518 A | | 12/2005 |
| JP | 2007-019106 A | | 1/2007 |
| JP | 2007-035594 A | | 2/2007 |
| JP | 2008-135190 A | | 6/2008 |
| WO | WO-93/24960 A1 | | 12/1993 |
| WO | WO-2004/024629 A1 | | 3/2004 |
| WO | WO-2008/047641 A1 | | 4/2008 |

OTHER PUBLICATIONS

English translation of JP H10-012059 A, 2013.*
English machine translation of JP H09-246577 A, 2013.*
Office Action mailed Aug. 14, 2012, issued for the Japanese Patent Application No. 2008-224497 and English translation thereof.
Shozo Yanagida et al., "The leading edge of thin-film solar cell development—towards higher efficiency, mass productivity, and more widespread use," NTS Co., Ltd., Mar. 2005, p. 113, Fig. 1(a) and English Translation of Fig. 1(a) on p. 13 thereof.
International Search Report dated Dec. 16, 2008, issued on PCT/JP2008/066605.
Hayashi K. et al., "ZnO/AG Sputtering Deposition on A—Si Solar Cells," World Conference on Photovoltaic Energy. Waikoloa, Dec. 5-9, 1994. [World Conference on Photovoltaic Energy], New York, IEEE, US, vol. Conf. 1, Dec. 5, 1994, pp. 674-677, XP000681335.
Search Report dated Feb. 27, 2013, issued for the European Patent Application No. 08830345.8.
Office Action mailed Jul. 30, 2013, issued for the Japanese patent application No. 2009-182929 and English translation thereof.
Office Action mailed Jul. 30, 2013, issued for the Japanese patent application No. 2009-182932 and English translation thereof.
Notice of Allowance mailed Aug. 6, 2013, issued for the Japanese patent application No. 2009-182930 and English translation thereof.
Office Action mailed Aug. 6, 2013, issued for the Japanese patent application No. 2009-182931 and English translation thereof.
Office Action mailed Aug. 13, 2013, issued for the Japanese patent application No. 2012-213462 and English translation thereof.
Notice of Reasons for Rejection dated Oct. 15, 2013, issued for the Japanese patent application No. 2009-182932 and English translation thereof.

* cited by examiner

COMPOSITE FILM FOR SUPERSTRATE SOLAR CELL HAVING CONDUCTIVE FILM AND ELECTROCONDUCTIVE REFLECTIVE FILM FORMED BY APPLYING COMPOSITION CONTAINING METAL NANOPARTICLES AND COMPRISING AIR PORES OF PRESET DIAMETER IN CONTACT SURFACE

TECHNICAL FIELD

The present invention relates to a composite film having two layers, namely a transparent conductive film and a conductive reflective film, and also to a method for producing such a composite film. More specifically, the present invention relates to a composite film that is ideal for use within a superstrate thin-film solar cell or substrate solar cell, and a method for producing such a composite film.

This application claims priority on Japanese Patent Application No. 2007-236546, filed on Sep. 12, 2007, Japanese Patent Application No. 2008-205849, filed on Aug. 8, 2008, Japanese Patent Application No. 2008-205862, filed on Aug. 8, 2008, Japanese Patent Application No. 2008-205867, filed on Aug. 8, 2008, Japanese Patent Application No. 2008-205870, filed on Aug. 8, 2008, Japanese Patent Application No. 2008-224497, filed on Sep. 2, 2008, Japanese Patent Application No. 2008-224499, filed on Sep. 2, 2008, Japanese Patent Application No. 2008-224508, filed on Sep. 2, 2008, Japanese Patent Application No. 2008-224513, filed on Sep. 2, 2008, and Japanese Patent Application No. 2008-224515, filed on Sep. 2, 2008, the contents of which are incorporated herein by reference.

BACKGROUND ART

Recently, concerns over environmental conservation have lead to considerable research and development in the field of clean energy. Amongst this research, solar cells are attracting much attention due to the limitless nature of the sunlight that acts as the power source, and the fact that solar cells are non-polluting. Conventionally, electric power generation from sunlight using solar cells has employed bulk solar cells, which are prepared by producing bulk crystals of single crystal silicon or polycrystalline, and then slicing these crystals to generate thick sheet-like semiconductors. However, large amounts of time and energy are required to grow the silicon crystals used in these bulk solar cells, and the subsequent production process also requires complex steps. As a result, improving the mass productivity is difficult, and providing low-cost solar cells has proven problematic.

On the other hand, in the case of thin-film semiconductor solar cells (hereafter referred to as "thin-film solar cells") that use a semiconductor such as an amorphous silicon having a thickness of not more than several micrometers, a semiconductor layer of the desired thickness that acts as the photovoltaic layer need simply be formed on an inexpensive substrate of glass or stainless steel or the like. Accordingly, because these thin-film solar cells are thin and lightweight, are cheap to produce, and can be easily produced as large surface area cells, it is thought that they will be the predominant form of solar cells in the future.

Thin-film solar cells are classified as superstrate cells or substrate cells depending on their structure. In a superstrate solar cell, in which the incident light enters the cell from the side of the transparent substrate, the cell typically has a structure in which the substrate, a transparent electrode, a photovoltaic layer, and a back electrode are formed in sequence. In contrast, in a substrate solar cell, a structure is adopted in which the substrate, a back electrode, a photovoltaic layer, and a transparent electrode are formed in sequence. In a superstrate solar cell in which the photovoltaic layer is formed of a silicon-based material, investigations have been conducted into enhancing the electric power generation efficiency by adopting a structure in which a transparent electrode, an amorphous silicon, a polycrystalline silicon, and a back electrode are formed in sequence (for example, see Non-Patent Document 1). In the structure disclosed in Non-Patent Document 1, the amorphous silicon and the polycrystalline silicon constitute the photovoltaic layer.

Particularly in those cases where the photovoltaic layer is formed of a silicon-based material, because the absorption coefficient for the photovoltaic layer is comparatively small, if the photovoltaic layer is formed with a thickness in the order of several micrometers, then a portion of the incident light passes through the photovoltaic layer, and this transmitted light is unable to contribute to electric power generation. Accordingly, generally, either the back electrode is formed as a reflective film, or a reflective film is formed on top of the back electrode, thereby reflecting the light that is transmitted through the photovoltaic layer without undergoing absorption and returning the light to the photovoltaic layer for a second time, thus increasing the electric power generation efficiency.

In previous thin-film solar cell development, the electrode and the reflective film have been formed using a vacuum deposition method such as sputtering or the like. However, because maintaining and operating a large-scale vacuum deposition apparatus requires enormous cost, it is anticipated that lower cost production processes using wet film formation methods will be developed.

As an example of a conductive reflective film formed using a wet film formation method, a method has been disclosed in which a reflective film formed on the back side of the photovoltaic element is formed using an electroless plating method (for example, see Patent Document 1).

Further, a simpler method is also being investigated in which a metal having a high reflectance such as silver is converted to nanoparticles, and these nanoparticles are then applied by a coating method (for example, see Patent Document 2). Furthermore, a method that involves the application of metal nanoparticles has also been disclosed as a method of forming a metal coating having high metallic gloss similar to a plating layer on the surface of a substrate (for example, see Patent Document 3). Moreover, in a superstrate solar cell that employs a substrate-transparent electrode-photovoltaic layer-transparent electrode-back reflective electrode type structure, one example of a method of forming the transparent electrode positioned adjacent to the substrate includes applying a coating liquid containing microparticles of a conductive oxide dispersed within a dispersion medium, and then using a heating method to dry and cure the coating liquid (for example, see Patent Document 4).

However, the electroless plating method disclosed in the aforementioned Patent Document 1 includes steps of forming a plating protective film on the surface, subsequently treating the surface to undergo the plating treatment with a hydrofluoric acid solution, and then dipping the structure in an electroless plating solution, meaning not only is the method complex, but the generation of considerable amounts of waste liquids can be expected.

In the methods of Patent Documents 2 and 3 that involved the application of metal nanoparticles, the reflectance when evaluated from the substrate side of the reflective film applied to the substrate surface (hereafter referred to as "the back side reflectance") tends to be inferior to the reflectance on the exposed surface on the opposite side (hereafter referred to as "the surface reflectance"). It is thought that this difference is because holes are formed between the reflective film and the substrate, and light undergoes repeated reflection within these holes, resulting in a reduction in the reflectance. Further, in those cases where reflected light that has passed through a hole is irradiated onto the substrate at an incident angle that is larger than the critical angle, the reflected light undergoes total reflection at the interface between the hole and the substrate, and it is thought that the reflectance decreases as a result of an increase in this type of total reflection. Furthermore, in the metal nanoparticle coating methods disclosed in Patent Documents 2 and 3, only the conductive reflective film is formed by a coating method, and neither method represents a process in which both the conductive reflective film and the transparent conductive film are formed by a coating method.

In the aforementioned Patent Document 4, the wet deposition method is used only for the transparent conductive film positioned adjacent to the substrate in the superstrate solar cell, and the transparent conductive film positioned adjacent to the back reflective, electrode is formed by a sputtering method that represents a conventionally employed vacuum process.

Non-Patent Document 1: Shozo Yanagida et al., "The leading edge of thin-film solar cell development—towards higher efficiency, mass productivity, and more widespread use", NTS Co., Ltd., March 2005, page 113, FIG. 1(a)

Patent Document 1: Japanese Unexamined Patent Application, First Publication No. Hei 05-95127 (claim 1, paragraph [0015])

Patent Document 2: Japanese Unexamined Patent Application, First Publication No. Hei 09-246577 (paragraph [0035])

Patent Document 3: Japanese Unexamined Patent Application, First Publication No. 2000-239853 (claim 3, paragraph [0009])

Patent Document 4: Japanese Unexamined Patent Application, First Publication No. Hei 10-12059 (paragraphs [0028] and [0029])

DISCLOSURE OF INVENTION

Problems to be Solved by the Invention

A first object of the present invention is to provide a composite film for a superstrate solar cell having a transparent conductive film and a conductive reflective film formed using a wet coating method without causing a deterioration in the back side reflectance.

A second object of the present invention is to provide a composite film for a substrate solar cell having a transparent conductive film and a conductive reflective film formed using a wet coating method, which has a high degree of reflectance.

A third object of the present invention is to provide a process that enables a composite film for a superstrate solar cell or a composite film for a substrate solar cell to be produced comparatively cheaply, by eliminating vacuum processes such as vacuum deposition and sputtering as far as possible, and using a wet coating method.

Means to Solve the Problems

A composite film for a superstrate thin-film solar cell according to a first aspect of the present invention has two layers composed of a transparent conductive film formed on a photovoltaic layer of the superstrate thin-film solar cell and a conductive reflective film formed on top of the transparent conductive film, wherein the transparent conductive film is formed by using a wet coating method to apply a transparent conductive film composition containing microparticles of a conductive oxide, the conductive reflective film is formed by using a wet coating method to apply a conductive reflective film composition containing metal nanoparticles, the average diameter of holes occurring at the substrate-side contact surface of the conductive reflective film is not more than 100 nm, the average depth at which the holes are positioned is not more than 100 nm, and the number density of the holes is not more than 30 holes/$\mu m^2$.

For the composite film for a superstrate thin-film solar cell according to the first aspect of the present invention, the transparent conductive film composition may include either one or both of a polymeric binder and a non-polymeric binder that cure upon heating.

The polymeric binder incorporated within the transparent conductive film composition may be one or more binders selected from the group consisting of acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers.

The polymeric binder incorporated within the transparent conductive film composition may include one or more metal soaps, metal complexes or metal alkoxide hydrolysates of aluminum, silicon, titanium, chromium, manganese, iron, cobalt, nickel, silver, copper, zinc, molybdenum or tin.

The non-polymeric binder incorporated within the transparent conductive film composition may be one or more binders selected from the group consisting of metal soaps, metal complexes, metal alkoxides, halosilanes, 2-alkoxyethanols, β-diketones and alkyl acetates.

The metal contained within the metal soap, metal complex or metal alkoxide that functions as the non-polymeric binder may be aluminum, silicon, titanium, chromium, manganese, iron, cobalt, nickel, silver, copper, zinc, molybdenum, tin, indium or antimony.

The transparent conductive film composition may include one or more coupling agents selected from the group consisting of silane coupling agents, aluminum coupling agents and titanium coupling agents.

The conductive reflective film may include one or more materials selected from the group consisting of polyvinylpyrrolidones, polyvinylpyrrolidone copolymers and water-soluble celluloses.

The proportion of silver among the metal elements contained within the conductive reflective film may be 75% by mass or more.

The thickness of the conductive reflective film may be within a range from 0.05 to 2.0 μm.

Of the metal nanoparticles incorporated within the conductive reflective film, particles having a particle size within a range from 10 to 50 nm may represent a number average of not less than 70%.

The conductive reflective film composition may contain 75% by mass or more of silver nanoparticles as the metal nanoparticles, the metal nanoparticles may be chemically modified with a protective agent having an organic molecular main chain with a carbon skeleton containing 1 to 3 carbon atoms, and the metal nanoparticles may include a number average of not less than 70% of metal nanoparticles for which the primary particle size is within a range from 10 to 100 nm.

The conductive reflective film composition may include at least 0.02% by mass but less than 25% by mass of metal nanoparticles formed from one metal, or a mixed composition or alloy composition containing two or more metals, selected from the group consisting of gold, platinum, palladium, ruthenium, nickel, copper, tin, indium, zinc, iron, chromium and manganese.

The conductive reflective film composition may contain not less than 1% by mass of water and not less than 2% by mass of an alcohol as a dispersion medium.

The conductive reflective film composition may include one or more additives selected from the group consisting of organic polymers, metal oxides, metal hydroxides, organometallic compounds and silicone oils.

The organic polymer contained within the conductive reflective film composition may be one or more polymers selected from the group consisting of polyvinylpyrrolidones, polyvinylpyrrolidone copolymers and water-soluble celluloses.

The metal oxide contained within the conductive reflective film composition may be an oxide or composite oxide containing at least one metal selected from the group consisting of aluminum, silicon, titanium, chromium, manganese, iron, cobalt, nickel, silver, copper, zinc, molybdenum, tin, indium and antimony.

The metal hydroxide contained within the conductive reflective film composition may be a hydroxide containing at least one metal selected from the group consisting of aluminum, silicon, titanium, chromium, manganese, iron, cobalt, nickel, silver, copper, zinc, molybdenum, tin, indium and antimony.

The organometallic compound contained within the conductive reflective film composition may be a metal soap, metal complex or metal alkoxide of at least one metal selected from the group consisting of silicon, titanium, aluminum, antimony, indium, chromium, manganese, iron, cobalt, nickel, silver, copper, zinc, molybdenum and tin.

A method for producing a composite film for a superstrate thin-film solar cell according to the first aspect of the present invention includes forming a transparent conductive coating by using a wet coating method to apply a transparent conductive film composition to a photovoltaic layer of the superstrate thin-film solar cell that has been laminated on a substrate with a first transparent conductive film disposed therebetween, forming a conductive reflective coating by using a wet coating method to apply a conductive reflective film composition to the transparent conductive coating, and subsequently baking the substrate having the transparent conductive coating and the conductive reflective coating formed thereon at a temperature within a range from 130 to 400° C., thereby forming two layers composed of a second transparent conductive film having a thickness of 0.03 to 0.5 µm and a conductive reflective film having a thickness of 0.05 to 2.0 µm.

In the method for producing a composite film for a superstrate thin-film solar cell according to the first aspect of the present invention, the wet coating method may be a spray coating method, dispenser coating method, spin coating method, knife coating method, slit coating method, inkjet coating method, screen printing method, offset printing method or die coating method.

A composite film for a superstrate solar cell according to a second aspect of the present invention has a transparent conductive film formed on a photovoltaic layer of a superstrate thin-film solar cell, and a conductive reflective film formed on top of the transparent conductive film, wherein the transparent conductive film is formed by forming a coating of conductive oxide microparticles by using a wet coating method to apply a dispersion of the conductive oxide microparticles to the photovoltaic layer, impregnating the coating of the conductive oxide microparticles with a binder dispersion using a wet coating method, and subsequently performing baking, the transparent conductive film has a thickness of 0.01 to 0.5 µm in a state where the entire surface of the conductive oxide microparticles layer is covered with the binder layer, the conductive reflective film is formed by using a wet coating method to apply a conductive reflective film composition containing metal nanoparticles to the transparent conductive film and subsequently performing baking, the conductive reflective film has a thickness of 0.05 to 2.0 µm, the average diameter of holes occurring at the contact surface of the conductive reflective film on the side of the photovoltaic layer is not more than 100 nm, the average depth at which the holes are positioned is not more than 100 nm, and the number density of the holes is not more than 30 holes/µm$^2$.

For the composite film for a superstrate solar cell according to the second aspect of the present invention, the binder dispersion may include either one or both of a polymeric binder and a non-polymeric binder that cure upon heating.

The polymeric binder incorporated within the binder dispersion may be one or more binders selected from the group consisting of acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers.

The polymeric binder incorporated within the binder dispersion may include one or more metal soaps, metal complexes or metal alkoxide hydrolysates of aluminum, silicon, titanium, chromium, manganese, iron, cobalt, nickel, silver, copper, zinc, molybdenum or tin.

The non-polymeric binder incorporated within the binder dispersion may be one or more binders selected from the group consisting of alkoxysilanes, halosilanes, 2-alkoxyethanols, β-diketones and alkyl acetates.

The dispersion of the conductive oxide microparticles may include one or more coupling agents selected from the group consisting of silane coupling agents, aluminum coupling agents and titanium coupling agents.

The conductive reflective film may include one or more materials selected from the group consisting of polyvinylpyrrolidones, polyvinylpyrrolidone copolymers and water-soluble celluloses.

The proportion of silver among the metal elements contained within the conductive reflective film may be 75% by mass or more.

The thickness of the conductive reflective film may be within a range from 0.05 to 2.0 µm.

Of the metal nanoparticles incorporated within the conductive reflective film, particles having a particle size within a range from 10 to 50 nm may represent a number average of not less than 70%.

The conductive reflective film may be formed using a conductive reflective film composition, wherein the conductive reflective film composition contains 75% by mass or more of silver nanoparticles as the metal nanoparticles, the metal nanoparticles may be chemically modified with a protective agent having an organic molecular main chain with a carbon skeleton containing 1 to 3 carbon atoms, and the metal nanoparticles include a number average of not less than 70% of metal nanoparticles for which the primary particle size is within a range from 10 to 100 nm.

The conductive reflective film may be formed using a conductive reflective film composition that contains at least 0.02% by mass but less than 25% by mass of metal nanoparticles formed from one metal, or a mixed composition or alloy composition containing two or more metals, selected from the group consisting of gold, platinum, palladium, ruthenium, nickel, copper, tin, indium, zinc, iron, chromium and manganese.

The conductive reflective film may be formed using a conductive reflective film composition that contains not less than 1% by mass of water and not less than 2% by mass of an alcohol as a dispersion medium.

The conductive reflective film may be formed using a conductive reflective film composition that contains one or more additives selected from the group consisting of organic polymers, metal oxides, metal hydroxides, organometallic compounds and silicone oils.

The organic polymer contained within the conductive reflective film composition may be one or more polymers selected from the group consisting of polyvinylpyrrolidones, polyvinylpyrrolidone copolymers and water-soluble celluloses.

The metal oxide contained within the conductive reflective film composition may be an oxide or composite oxide containing at least one metal selected from the group consisting of aluminum, silicon, titanium, chromium, manganese, iron, cobalt, nickel, silver, copper, zinc, molybdenum, tin, indium and antimony.

The metal hydroxide contained within the conductive reflective film composition may be a hydroxide containing at least one metal selected from the group consisting of aluminum, silicon, titanium, chromium, manganese, iron, cobalt, nickel, silver, copper, zinc, molybdenum, tin, indium and antimony.

The organometallic compound contained within the conductive reflective film composition may be a metal soap, metal complex or metal alkoxide of at least one metal selected from the group consisting of silicon, titanium, chromium, manganese, iron, cobalt, nickel, silver, copper, zinc, molybdenum and tin.

A method for producing a composite film for a superstrate solar cell according to the second aspect of the present invention includes forming a transparent conductive coating by using a wet coating method to apply a dispersion of conductive oxide microparticles and a binder dispersion to a photovoltaic layer of the superstrate solar cell that has been laminated on a substrate with a first transparent conductive film disposed therebetween, forming a conductive reflective coating by using a wet coating method to apply a conductive reflective film composition to the transparent conductive coating, and subsequently baking the substrate having the transparent conductive coating and the conductive reflective coating formed thereon at a temperature within a range from 130 to 400° C., thereby forming a composite film having a second transparent conductive film having a thickness of 0.01 to 0.5 µm and a conductive reflective film having a thickness of 0.05 to 2.0 µm, wherein the transparent conductive coating is formed by forming a coating of the conductive oxide microparticles by applying the dispersion of the conductive oxide microparticles, and subsequently impregnating the coating of the conductive oxide microparticles with the binder dispersion using a wet coating method, and the second transparent conductive film has a conductive oxide microparticles layer obtained by baking the coating of the conductive oxide microparticles, and a binder layer obtained by baking the coating of the binder dispersion that covers the entire surface of the conductive oxide microparticles layer.

In the method for producing a composite film for a superstrate solar cell according to the second aspect of the present invention, the wet coating method may be a spray coating method, dispenser coating method, spin coating method, knife coating method, slit coating method, inkjet coating method, screen printing method, offset printing method or die coating method.

A composite film for a substrate solar cell according to a third aspect of the present invention has two layers composed of a conductive reflective film formed on a substrate and a transparent conductive film formed on top of the transparent conductive film, wherein the conductive reflective film is formed by using a wet coating method to apply a conductive reflective film composition containing metal nanoparticles, the transparent conductive film is formed by using a wet coating method to apply a transparent conductive film composition containing microparticles of a conductive oxide, the average diameter of holes occurring at the contact surface of the conductive reflective film on the side of the transparent conductive film is not more than 100 nm, the average depth at which the holes are positioned is not more than 100 nm, and the number density of the holes is not more than 30 holes/µm².

For the composite film for a substrate solar cell according to the third aspect of the present invention, the transparent conductive film composition may include either one or both of a polymeric binder and a non-polymeric binder that cure upon heating.

The polymeric binder incorporated within the transparent conductive film composition may be one or more binders selected from the group consisting of acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers.

The polymeric binder incorporated within the transparent conductive film composition may include one or more metal soaps, metal complexes or metal alkoxide hydrolysates of aluminum, silicon, titanium, chromium, manganese, iron, cobalt, nickel, silver, copper, zinc, molybdenum or tin.

The non-polymeric binder incorporated within the transparent conductive film composition may be one or more binders selected from the group consisting of metal soaps, metal complexes, metal alkoxides, halosilanes, 2-alkoxyethanols, β-diketones and alkyl acetates.

The metal contained within the metal soap, metal complex or metal alkoxide that functions as the non-polymeric binder may be aluminum, silicon, titanium, chromium, manganese, iron, cobalt, nickel, silver, copper, zinc, molybdenum, tin, indium or antimony.

The transparent conductive film composition may include one or more coupling agents selected from the group consisting of silane coupling agents, aluminum coupling agents and titanium coupling agents.

The conductive reflective film may include one or more materials selected from the group consisting of polyvinylpyrrolidones, polyvinylpyrrolidone copolymers and water-soluble celluloses.

The proportion of silver among the metal elements contained within the conductive reflective film may be 75% by mass or more.

The thickness of the conductive reflective film may be within a range from 0.05 to 2.0 µm.

Of the metal nanoparticles incorporated within the conductive reflective film, particles having a particle size within a range from 10 to 50 nm may represent a number average of not less than 70%.

The conductive reflective film composition may contain 75% by mass or more of silver nanoparticles as the metal nanoparticles, the metal nanoparticles may be chemically modified with a protective agent having an organic molecular main chain with a carbon skeleton containing 1 to 3 carbon atoms, and the metal nanoparticles may include a number average of not less than 70% of metal nanoparticles for which the primary particle size is within a range from 10 to 100 nm.

The conductive reflective film composition may include at least 0.02% by mass but less than 25% by mass of metal nanoparticles formed from one metal, or a mixed composition or alloy composition containing two or more metals, selected from the group consisting of gold, platinum, palladium, ruthenium, nickel, copper, tin, indium, zinc, iron, chromium and manganese.

The conductive reflective film composition may contain not less than 1% by mass of water and not less than 2% by mass of an alcohol as a dispersion medium.

The conductive reflective film composition may include one or more additives selected from the group consisting of organic polymers, metal oxides, metal hydroxides, organometallic compounds and silicone oils.

The organic polymer contained within the conductive reflective film composition may be one or more polymers selected from the group consisting of polyvinylpyrrolidones, polyvinylpyrrolidone copolymers and water-soluble celluloses.

The metal oxide contained within the conductive reflective film composition may be an oxide or composite oxide containing at least one metal selected from the group consisting of aluminum, silicon, titanium, chromium, manganese, iron, cobalt, nickel, silver, copper, zinc, molybdenum, tin, indium and antimony.

The metal hydroxide contained within the conductive reflective film composition may be a hydroxide containing at least one metal selected from the group consisting of aluminum, silicon, titanium, chromium, manganese, iron, cobalt, nickel, silver, copper, zinc, molybdenum, tin, indium and antimony.

The organometallic compound contained within the conductive reflective film composition may be a metal soap, metal complex or metal alkoxide of at least one metal selected from the group consisting of silicon, titanium, aluminum, antimony, indium, chromium, manganese, iron, cobalt, nickel, silver, copper, zinc, molybdenum and tin.

A method for producing a composite film for a substrate solar cell according to the third aspect of the present invention includes forming a conductive reflective coating by using a wet coating method to apply a conductive reflective film composition to a substrate, subsequently baking the substrate having the conductive reflective coating formed thereon at a temperature of 130 to 400° C. to form a conductive reflective film, forming a transparent conductive coating by using a wet coating method to apply a transparent conductive film composition to the conductive reflective film, and subsequently baking the substrate having the conductive reflective coating formed thereon at a temperature within a range from 130 to 400° C. to form a transparent conductive film, thereby forming two layers composed of a conductive reflective film having a thickness of 0.05 to 2.0 µm and a transparent conductive film having a thickness of 0.01 to 0.5 µm.

In the method for producing a composite film for a substrate solar cell according to the third aspect of the present invention, the wet coating method may be a spray coating method, dispenser coating method, spin coating method, knife coating method, slit coating method, inkjet coating method, screen printing method, offset printing method or die coating method.

A composite film for a substrate solar cell according to a fourth aspect of the present invention has a conductive reflective film formed on a substrate, and a transparent conductive film formed on top of the conductive reflective film, wherein the conductive reflective film is formed by forming a conductive reflective coating by using a wet coating method to apply a conductive reflective film composition containing metal nanoparticles to the substrate and subsequently baking the conductive reflective coating, the conductive reflective film has a thickness of 0.05 to 2.0 µm, the transparent conductive film is formed by forming a coating of conductive oxide microparticles by using a wet coating method to apply a dispersion of the conductive oxide microparticles to the conductive reflective coating, impregnating the coating of the conductive oxide microparticles with a binder dispersion using a wet coating method, and subsequently performing baking, the transparent conductive film has a thickness of 0.01 to 0.5 µm in a state where the entire surface of the conductive oxide microparticles layer is covered with the binder layer, the average diameter of holes occurring at the contact surface of the conductive reflective film on the side of the transparent conductive film is not more than 100 nm, the average depth at which the holes are positioned is not more than 100 nm, and the number density of the holes is not more than 30 holes/µm$^2$.

For the composite film for a substrate solar cell according to the fourth aspect of the present invention, the binder dispersion may include either one or both of a polymeric binder and a non-polymeric binder that cure upon heating.

The polymeric binder incorporated within the binder dispersion may be one or more binders selected from the group consisting of acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers.

The polymeric binder incorporated within the binder dispersion may include one or more metal soaps, metal complexes or metal alkoxide hydrolysates of aluminum, silicon, titanium, chromium, manganese, iron, cobalt, nickel, silver, copper, zinc, molybdenum or tin.

The non-polymeric binder incorporated within the binder dispersion may be one or more binders selected from the group consisting of alkoxysilanes, halosilanes, 2-alkoxyethanols, β-diketones and alkyl acetates.

The dispersion of the conductive oxide microparticles may include one or more coupling agents selected from the group consisting of silane coupling agents, aluminum coupling agents and titanium coupling agents.

The conductive reflective film may include one or more materials selected from the group consisting of polyvinylpyrrolidones, polyvinylpyrrolidone copolymers and water-soluble celluloses.

The proportion of silver among the metal elements contained within the conductive reflective film may be 75% by mass or more.

The thickness of the conductive reflective film may be within a range from 0.05 to 2.0 µm.

Of the metal nanoparticles incorporated within the conductive reflective film, particles having a particle size within a range from 10 to 50 nm may represent a number average of not less than 70%.

The conductive reflective film may be formed using a conductive reflective film composition, wherein the conductive reflective film composition contains 75% by mass or more of silver nanoparticles as the metal nanoparticles, the metal nanoparticles may be chemically modified with a protective agent having an organic molecular main chain with a carbon skeleton containing 1 to 3 carbon atoms, and the metal nanoparticles include a number average of not less than 70% of metal nanoparticles for which the primary particle size is within a range from 10 to 100 nm.

The conductive reflective film may be formed using a conductive reflective film composition that contains at least 0.02% by mass but less than 25% by mass of metal nanoparticles formed from one metal, or a mixed composition or alloy composition containing two or more metals, selected from the group consisting of gold, platinum, palladium, ruthenium, nickel, copper, tin, indium, zinc, iron, chromium and manganese.

The conductive reflective film may be formed using a conductive reflective film composition that contains not less than 1% by mass of water and not less than 2% by mass of an alcohol as a dispersion medium.

The conductive reflective film may be formed using a conductive reflective film composition that contains one or more additives selected from the group consisting of organic polymers, metal oxides, metal hydroxides, organometallic compounds and silicone oils.

The organic polymer contained within the conductive reflective film composition may be one or more polymers selected from the group consisting of polyvinylpyrrolidones, polyvinylpyrrolidone copolymers and water-soluble celluloses.

The metal oxide contained within the conductive reflective film composition may be an oxide or composite oxide containing at least one metal selected from the group consisting of aluminum, silicon, titanium, chromium, manganese, iron, cobalt, nickel, silver, copper, zinc, molybdenum, tin, indium and antimony.

The metal hydroxide contained within the conductive reflective film composition may be a hydroxide containing at least one metal selected from the group consisting of aluminum, silicon, titanium, chromium, manganese, iron, cobalt, nickel, silver, copper, zinc, molybdenum, tin, indium and antimony.

The organometallic compound contained within the conductive reflective film composition may be a metal soap, metal complex or metal alkoxide of at least one metal selected from the group consisting of silicon, titanium, chromium, manganese, iron, cobalt, nickel, silver, copper, zinc, molybdenum and tin.

A method for producing a composite film for a substrate solar cell according to the fourth aspect of the present invention includes forming a conductive reflective coating by using a wet coating method to apply a conductive reflective film composition to a substrate, subsequently forming a conductive reflective film by baking the substrate having the conductive reflective coating formed thereon at a temperature within a range from 130 to 400° C., forming a transparent conductive coating by using a wet coating method to apply a dispersion of conductive oxide microparticles and a binder dispersion to the conductive reflective coating, and subsequently forming a transparent conductive film by baking the substrate having the transparent conductive coating formed thereon at a temperature within a range from 130 to 400° C., thereby producing a composite film having a transparent conductive film having a thickness of 0.01 to 0.5 µm and a conductive reflective film having a thickness of 0.05 to 2.0 µm, wherein the transparent conductive coating is formed by forming a coating of the conductive oxide microparticles by applying the dispersion of the conductive oxide microparticles, and subsequently impregnating the coating of the conductive oxide microparticles with the binder dispersion using a wet coating method, and the transparent conductive film has a conductive oxide microparticles layer obtained by baking the coating of the conductive oxide microparticles, and a binder layer obtained by baking the coating of the binder dispersion that covers the entire surface of the conductive oxide microparticles layer.

In the method for producing a composite film for a substrate solar cell according to the fourth aspect of the present invention, the wet coating method may be a spray coating method, dispenser coating method, spin coating method, knife coating method, slit coating method, inkjet coating method, screen printing method, offset printing method or die coating method.

A composite film for a superstrate solar cell according to a fifth aspect of the present invention has a transparent conductive film formed on a photovoltaic layer of the superstrate solar cell, and a conductive reflective film formed on top of the transparent conductive film, wherein the transparent conductive film is formed by forming a coating of conductive oxide microparticles by using a wet coating method to apply a dispersion of the conductive oxide microparticles to the photovoltaic layer, impregnating the coating of the conductive oxide microparticles with a binder dispersion using a wet coating method and subsequently performing baking, the transparent conductive film has a first layer containing a binder component on top of the photovoltaic layer and a second layer containing no binder component in which 1 to 30% of the volume of the first layer protrudes from the first layer, the conductive reflective film is formed by using a wet coating method to apply a conductive reflective film composition containing metal nanoparticles to the transparent conductive film and subsequently performing baking, the conductive reflective film has a thickness of 0.05 to 2.0 µm, the average diameter of holes occurring at the contact surface of the conductive reflective film on the side of the photovoltaic layer is not more than 100 nm, the average depth at which the holes are positioned is not more than 100 nm, and the number density of the holes is not more than 30 holes/µm$^2$.

For the composite film for a superstrate solar cell according to the fifth aspect of the present invention, the binder dispersion may include either one or both of a polymeric binder and a non-polymeric binder that cure upon heating.

The polymeric binder incorporated within the binder dispersion may be one or more binders selected from the group consisting of acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers.

The polymeric binder incorporated within the binder dispersion may include one or more metal soaps, metal complexes or metal alkoxide hydrolysates of aluminum, silicon, titanium, chromium, manganese, iron, cobalt, nickel, silver, copper, zinc, molybdenum or tin.

The non-polymeric binder incorporated within the binder dispersion may be one or more binders selected from the group consisting of alkoxysilanes, halosilanes, 2-alkoxyethanols, β-diketones and alkyl acetates.

The dispersion of the conductive oxide microparticles may include one or more coupling agents selected from the group consisting of silane coupling agents, aluminum coupling agents and titanium coupling agents.

The conductive reflective film may include one or more materials selected from the group consisting of polyvinylpyrrolidones, polyvinylpyrrolidone copolymers and water-soluble celluloses.

The proportion of silver among the metal elements contained within the conductive reflective film may be 75% by mass or more.

The thickness of the conductive reflective film may be within a range from 0.05 to 2.0

Of the metal nanoparticles incorporated within the conductive reflective film, particles having a particle size within a range from 10 to 50 nm may represent a number average of not less than 70%.

The conductive reflective film may be formed using a conductive reflective film composition, wherein the conductive reflective film composition contains 75% by mass or more of silver nanoparticles as the metal nanoparticles, the metal nanoparticles may be chemically modified with a protective agent having an organic molecular main chain with a carbon skeleton containing 1 to 3 carbon atoms, and the metal nanoparticles include a number average of not less than 70% of metal nanoparticles for which the primary particle size is within a range from 10 to 100 nm.

The conductive reflective film may be formed using a conductive reflective film composition that contains at least 0.02% by mass but less than 25% by mass of metal nanoparticles formed from one metal, or a mixed composition or alloy composition containing two or more metals, selected from the group consisting of gold, platinum, palladium, ruthenium, nickel, copper, tin, indium, zinc, iron, chromium and manganese.

The conductive reflective film may be formed using a conductive reflective film composition that contains not less than 1% by mass of water and not less than 2% by mass of an alcohol as a dispersion medium.

The conductive reflective film may be formed using a conductive reflective film composition that contains one or more additives selected from the group consisting of organic polymers, metal oxides, metal hydroxides, organometallic compounds and silicone oils.

The organic polymer contained within the conductive reflective film composition may be one or more polymers selected from the group consisting of polyvinylpyrrolidones, polyvinylpyrrolidone copolymers and water-soluble celluloses.

The metal oxide contained within the conductive reflective film composition may be an oxide or composite oxide containing at least one metal selected from the group consisting of aluminum, silicon, titanium, chromium, manganese, iron, cobalt, nickel, silver, copper, zinc, molybdenum, tin, indium and antimony.

The metal hydroxide contained within the conductive reflective film composition may be a hydroxide containing at least one metal selected from the group consisting of aluminum, silicon, titanium, chromium, manganese, iron, cobalt, nickel, silver, copper, zinc, molybdenum, tin, indium and antimony.

The organometallic compound contained within the conductive reflective film composition may be a metal soap, metal complex or metal alkoxide of at least one metal selected from the group consisting of silicon, titanium, chromium, manganese, iron, cobalt, nickel, silver, copper, zinc, molybdenum and tin.

A method for producing a composite film for a superstrate solar cell according to the fifth aspect of the present invention includes forming a transparent conductive coating by using a wet coating method to apply a dispersion of conductive oxide microparticles and a binder dispersion to a photovoltaic layer of the superstrate solar cell that has been laminated on a substrate with a first transparent conductive film disposed therebetween, forming a conductive reflective coating by using a wet coating method to apply a conductive reflective film composition to the transparent conductive coating, and subsequently baking the substrate having the transparent conductive coating and the conductive reflective coating formed thereon at a temperature within a range from 130 to 400° C., thereby forming a composite film having a second transparent conductive film having a thickness of 0.01 to 0.5 µm and a conductive reflective film having a thickness of 0.05 to 2.0 µm, wherein the transparent conductive coating is formed by forming a coating of the conductive oxide microparticles by applying the dispersion of the conductive oxide microparticles, and subsequently impregnating the coating of the conductive oxide microparticles with the binder dispersion using a wet coating method, and the second transparent conductive film has a first layer containing a binder component on top of the photovoltaic layer and a second layer containing no binder component in which 1 to 30% of the volume of the first layer protrudes from the first layer.

In the method for producing a composite film for a superstrate solar cell according to the fifth aspect of the present invention, the wet coating method may be a spray coating method, dispenser coating method, spin coating method, knife coating method, slit coating method, inkjet coating method, screen printing method, offset printing method or die coating method.

Effect of the Invention

The composite film for a superstrate thin-film solar cell according to the first aspect of the present invention has two layers composed of a transparent conductive film formed on a photovoltaic layer of the superstrate thin-film solar cell, and a conductive reflective film formed on top of the transparent conductive film, wherein the transparent conductive film is formed by using a wet coating method to apply a transparent conductive film composition containing conductive oxide microparticles, and the conductive reflective film is formed by using a wet coating method to apply a conductive reflective film composition containing metal nanoparticles. As a result, the transparent conductive film is formed with a lower refractive index than that of a transparent conductive film formed using a vacuum deposition method such as sputtering, meaning an increased reflection effect is achieved at the conductive reflective film, and a satisfactory reflectance can be obtained. Furthermore, the average diameter of holes occurring at the substrate-side contact surface of the conductive reflective film is not more than 100 nm, the average depth at which the holes are positioned is not more than 100 nm, and the number density of the holes is not more than 30 holes/$\mu m^2$. As a result, when a transparent substrate having a transmittance of at least 98% is used, a high diffuse reflectance equivalent to not less than 80% of the theoretical reflectance can be achieved within a wavelength range from 500 to 1,200 nm.

Furthermore, by eliminating vacuum processes such as vacuum deposition and sputtering as far as possible, and using a wet coating method, the composite film can be produced comparatively cheaply.

The composite film for a superstrate solar cell according to the second aspect of the present invention has a transparent conductive film formed on a photovoltaic layer of a superstrate thin-film solar cell, and a conductive reflective film formed on top of the transparent conductive film, wherein the transparent conductive film is formed by forming a coating of conductive oxide microparticles by using a wet coating method to apply a dispersion of the conductive oxide microparticles to the photovoltaic layer, impregnating the coating of the conductive oxide microparticles with a binder dispersion using a wet coating method, and subsequently performing baking, and the transparent conductive film has a thickness of 0.01 to 0.5 µm in a state where the entire surface of the conductive oxide microparticles layer is covered with the binder layer. As a result, an increased reflection effect is achieved at the conductive reflective film, and a satisfactory reflectance can be obtained. Furthermore, the average diameter of holes occurring at the contact surface of the conductive reflective film on the side of the photovoltaic layer is not more than 100 nm, the average depth at which the holes are positioned is not more than 100 nm, and the number density of the holes is not more than 30 holes/µm². As a result, when a transparent substrate having a transmittance of at least 98% is used, a high diffuse reflectance equivalent to not less than 80% of the theoretical reflectance can be achieved within a wavelength range from 500 to 1,200 nm.

Furthermore, by eliminating vacuum processes such as vacuum deposition and sputtering as far as possible, and using a wet coating method, the composite film can be produced comparatively cheaply.

The composite film for a substrate solar cell according to the third aspect of the present invention has two layers composed of a conductive reflective film formed on a substrate and a transparent conductive film formed on top of the conductive reflective film, wherein the conductive reflective film is formed by using a wet coating method to apply a conductive reflective film composition containing metal nanoparticles, and the transparent conductive film is formed by using a wet coating method to apply a transparent conductive film composition containing microparticles of a conductive oxide. As a result, the transparent conductive film is formed with a lower refractive index than that of a transparent conductive film formed using a vacuum deposition method such as sputtering, meaning an increased reflection effect is achieved at the conductive reflective film, and a satisfactory reflectance can be obtained. Furthermore, the average diameter of holes occurring at the contact surface of the conductive reflective film on the side of the transparent conductive film is not more than 100 nm, the average depth at which the holes are positioned is not more than 100 nm, and the number density of the holes is not more than 30 holes/µm². As a result, a high diffuse reflectance equivalent to not less than 80% of the theoretical reflectance can be achieved within a wavelength range from 500 to 1,200 nm.

Furthermore, by eliminating vacuum processes such as vacuum deposition and sputtering as far as possible, and using a wet coating method, the composite film can be produced comparatively cheaply.

The composite film for a substrate solar cell according to the fourth aspect of the present invention has a conductive reflective film formed on a substrate, and a transparent conductive film formed on top of the conductive reflective film, wherein the conductive reflective film is formed by forming a conductive reflective coating by using a wet coating method to apply a conductive reflective film composition containing metal nanoparticles to the substrate and subsequently baking the conductive reflective coating, the conductive reflective film has a thickness of 0.05 to 2.0 µm, the transparent conductive film is formed by forming a coating of conductive oxide microparticles by using a wet coating method to apply a dispersion of the conductive oxide microparticles to the conductive reflective coating, impregnating the coating of the conductive oxide microparticles with a binder dispersion using a wet coating method, and subsequently performing baking, and the transparent conductive film has a thickness of 0.01 to 0.5 µm in a state where the entire surface of the conductive oxide microparticles layer is covered with the binder layer. As a result, an increased reflection effect is achieved at the conductive reflective film, and a satisfactory reflectance can be obtained. Furthermore, the average diameter of holes occurring at the contact surface of the conductive reflective film on the side of the transparent conductive film is not more than 100 nm, the average depth at which the holes are positioned is not more than 100 nm, and the number density of the holes is not more than 30 holes/µm². As a result, when a transparent substrate having a transmittance of at least 98% is used, a high diffuse reflectance equivalent to not less than 80% of the theoretical reflectance can be achieved within a wavelength range from 500 to 1,200 nm.

Furthermore, by eliminating vacuum processes such as vacuum deposition and sputtering as far as possible, and using a wet coating method, the composite film can be produced comparatively cheaply.

The composite film for a superstrate solar cell according to the fifth aspect of the present invention has a transparent conductive film formed on a photovoltaic layer of the superstrate solar cell, and a conductive reflective film formed on top of the transparent conductive film, wherein the transparent conductive film is formed by forming a coating of conductive oxide microparticles by using a wet coating method to apply a dispersion of the conductive oxide microparticles to the photovoltaic layer, impregnating the coating of the conductive oxide microparticles with a binder dispersion using a wet coating method and subsequently performing baking, and the transparent conductive film has a first layer containing a binder component on top of the photovoltaic layer and a second layer containing no binder component in which 1 to 30% of the volume of the first layer protrudes from the first layer. As a result, an increased reflection effect is achieved at the conductive reflective film, and a satisfactory reflectance can be obtained. Furthermore, the average diameter of holes occurring at the contact surface of the conductive reflective film on the side of the photovoltaic layer is not more than 100 nm, the average depth at which the holes are positioned is not more than 100 nm, and the number density of the holes is not more than 30 holes/µm². As a result, when a transparent substrate having a transmittance of at least 98% is used, a high diffuse reflectance equivalent to not less than 80% of the theoretical reflectance can be achieved within a wavelength range from 500 to 1,200 nm.

Furthermore, by eliminating vacuum processes such as vacuum deposition and sputtering as far as possible, and using a wet coating method, the composite film can be produced comparatively cheaply.

DESCRIPTION OF THE REFERENCE SYMBOLS

Figure 1:
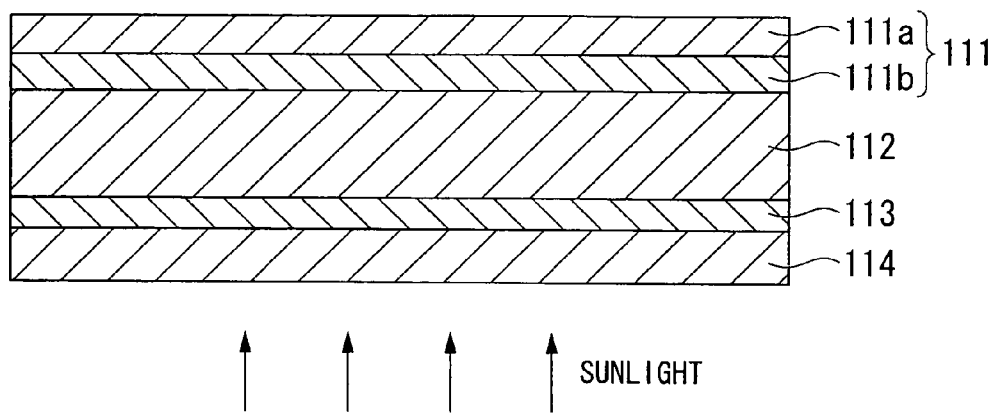
FIG. 1 is a diagram that schematically illustrates a cross-section of a composite film for a superstrate thin-film solar cell according to a first embodiment of the present invention.

111 Composite film
111a Conductive reflective film
111b Second transparent conductive film
112 Photovoltaic layer
114 Substrate
213 Photovoltaic layer
214 Second transparent conductive film
214a Conductive oxide microparticles layer
214b Binder layer
215 Conductive reflective film
311 Substrate
312 Composite film
312a Conductive reflective film
312b Second transparent conductive film
313 Photovoltaic layer
314 First transparent conductive film
411 Substrate
412 Conductive reflective film
413 Second transparent conductive film
413a Conductive oxide microparticles layer
413b Binder layer
513 Photovoltaic layer
514 Second transparent conductive film
514a First layer (first particle layer) of conductive oxide microparticles layer
514b Second layer (second particle layer) of conductive oxide microparticles layer
515 Conductive reflective film

BEST MODE FOR CARRYING OUT THE INVENTION

The best embodiments for carrying out the present invention are described below with reference to the drawings.

First Embodiment

As illustrated in FIG. 1, a superstrate thin-film solar cell typically has a structure in which a first transparent conductive film (the light incident side transparent conductive film) 113 and a photovoltaic layer 112 are laminated sequentially on top of a substrate 114, a second transparent conductive film 111b is formed on top of the photovoltaic layer 112, and a conductive reflective film 111a is then formed on top of the second transparent conductive film 111b.

The first embodiment of the present invention relates to a composite film 111 for a superstrate thin-film solar cell that is composed of two layers, namely, the second transparent conductive film 111b formed on top of the photovoltaic layer 112, and the conductive reflective film 111a formed on top of the second transparent conductive film 111b.

In the composite film 111 according to the first embodiment of the present invention, the second transparent conductive film 111b is formed by using a wet coating method to apply a transparent conductive film composition containing conductive oxide microparticles. If the second transparent conductive film 111b is formed using a vacuum deposition method such as a sputtering method, then the refractive index of the second transparent conductive film is determined by the material used as the target material, and consequently achieving the desired refractive index is problematic for a second transparent conductive film formed using a vacuum deposition method such as sputtering. In contrast, in the case of the second transparent conductive film 111b formed using a wet coating method, because the film is formed by applying a transparent conductive film composition that is a mixture of conductive oxide microparticles and one or more other components, a film formed using such a wet coating method is capable of realizing the desired low refractive index. The refractive index of this second transparent conductive film 111b is typically within a range from 1.5 to 2. A second transparent conductive film 111b having a low refractive index imparts an increased reflection effect to the adjoining conductive reflective film 111a in terms of optical design, and therefore a reflectance can be obtained that is higher than that obtainable for a conductive reflective film adjoining a second transparent conductive film having a high refractive index formed using a conventional vacuum deposition method such as sputtering.

Further, in the composite film 111 of the first embodiment of the present invention, the conductive reflective film 111a is formed by using a wet coating method to apply a conductive reflective film composition containing metal nanoparticles to the second transparent conductive film 111b formed using the wet coating method described above. Accordingly, the formed conductive reflective film 111a exhibits favorable film formability and has a high diffuse reflectance. When a film is formed on a substrate of glass or the like, favorable film formability and a high diffuse reflectance can be achieved even when film formation is conducted using a vacuum deposition method such as a sputtering method, but if a vacuum deposition method such as sputtering is used to form a film on top of the second transparent conductive film 111b that has been formed using a wet coating method, then the residual solvent within the second transparent conductive film 111b tends to exert adverse effects on the formed conductive reflective film, meaning forming a conductive reflective film with a high reflectance is difficult.

In this manner, the composite film 111 according to the first embodiment of the present invention has an improved reflection effect, in terms of optical design, imparted by the second transparent conductive film 111b that has a low refractive index, and a higher reflectance as a result of the favorable film formability and high diffuse reflectance provided by the conductive reflective film 111a.

Moreover, by ensuring that the average diameter of holes occurring at the contact surface of the conductive reflective film 111a on the side of the substrate 114 is not more than 100 nm, the average depth at which the holes are positioned is not more than 100 nm, and the number density of the holes is not more than 30 holes/$\mu m^2$, a conductive reflective film 111a is obtained for which a high diffuse reflectance equivalent to not less than 80% of the theoretical reflectance can be achieved within a wavelength range from 500 to 1,200 nm when a transparent substrate having a transmittance of at least 98% is used. This wavelength range from 500 to 1,200 nm encompasses substantially all convertible wavelengths in those cases where a polycrystalline silicon is used for the photovoltaic layer. The reason for specifying an average diameter for the holes of not more than 100 nm is that, generally, a reflectance spectrum exhibits high reflectance at the long wavelength side of the spectrum and lower reflectance at the short wavelength side, and if the average diameter of the holes exceeds 100 nm, then the inflexion point at which the reflectance starts to decrease tends to shift to a longer wavelength, meaning a favorable reflectance may become unobtainable. Furthermore, the reason for specifying an average depth for the holes of not more than 100 nm is that if the average depth of the holes exceeds 100 nm, then the gradient (slope) of the reflectance spectrum tends to increase, meaning a favorable reflectance may be unobtainable. The reason for specifying a number density for the holes of not more than 30 holes/$\mu m^2$ is that if the number density of the holes exceeds 30 holes/$\mu m^2$, then the reflectance at the long wavelength side of the spectrum tends to decrease, meaning a favorable reflectance may be unobtainable.

The average diameter of the holes is preferably within a range from 5 to 100 nm, the average depth at which the holes are positioned is preferably within a range from 5 to 100 nm, and the number density of the holes is preferably within a range from 2 to 30 holes/$\mu m^2$. If the values for the average diameter of the holes, the average depth at which the holes are positioned, and the number density of the holes are less than the lower limits of the above ranges, then during sintering, the elimination of gas generated by decomposition of the organic molecules of the protective agent used to chemically modify the silver nanoparticles tends to be inadequate, and as a result, there is a possibility that the remaining organic molecule residues may cause reductions in the conductivity and the reflectance of the conductive reflective film.

The conductive reflective film that constitutes part of the composite film contains one or more materials selected from the group consisting of polyvinylpyrrolidones, polyvinylpyrrolidone copolymers and water-soluble celluloses, and this facilitates the setting of the average diameter of holes occurring at the contact surface of the conductive reflective film on the side of the second transparent conductive film to not more than 100 nm, the average depth to not more than 100 nm, and the number density to not more than 30 holes/$\mu m^2$. Furthermore, in the conductive reflective film that constitutes part of the composite film, because the proportion of silver among the metal elements contained within the film is 75% by mass or more, a high reflectance can be achieved. If this proportion is less than 75%, then the reflectance of the conductive reflective film formed using the composition tends to decrease. Furthermore, because the thickness of the conductive reflective film that constitutes part of the composite film is within a range from 0.05 to 2.0 $\mu m$, an electrode surface resistance value of the level required of a solar cell can be obtained. Moreover, of the metal nanoparticles incorporated within the conductive reflective film that constitutes part of the composite film, because particles having a particle size within a range from 10 to 50 nm represent a number average of not less than 70%, favorable conductivity and a high reflectance are obtained.

The transparent conductive film composition used in forming the second transparent conductive film of the first embodiment of the present invention contains conductive oxide microparticles, and is a composition in which these conductive oxide microparticles are dispersed within a dispersion medium.

As the conductive oxide microparticles incorporated within the transparent conductive film composition, tin oxide powders of ITO (Indium Tin Oxide) and ATO (Antimony Tin Oxide: antimony-doped tin oxide), and zinc oxide powders containing one or more elements selected from the group consisting of Al, Co, Fe, In, Sn and Ti are preferred, and of these, ITO, ATO, AZO (Aluminum Zinc Oxide: aluminum-doped zinc oxide), IZO (Indium Zinc Oxide: indium-doped zinc oxide) and TZO (Tin Zinc Oxide: tin-doped zinc oxide) are particularly desirable. Furthermore, the proportion of the conductive oxide microparticles within the solid fraction of the transparent conductive film composition is preferably within a range from 50 to 90% by mass. The reason for specifying a conductive oxide microparticles proportion within the above range is that at proportions less than the lower limit of the range, the conductivity tends to decrease, whereas if the proportion exceeds the upper limit of the range, the adhesion tends to deteriorate undesirably. Within the above range, a proportion of 70 to 90% by mass is particularly desirable. Furthermore, in terms of ensuring favorable stability within the dispersion medium, the average particle size of the conductive oxide microparticles is preferably within a range from 10 to 100 nm, and more preferably from 20 to 60 nm.

The transparent conductive film composition is a composition that includes either one or both of a polymeric binder and a non-polymeric binder that cure upon heating. Examples of the polymeric binder include acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers. Furthermore, the polymeric binder preferably includes one or more metal soaps, metal complexes or metal alkoxide hydrolysates of aluminum, silicon, titanium, chromium, manganese, iron, cobalt, nickel, silver, copper, zinc, molybdenum or tin. Examples of the non-polymeric binder include metal soaps, metal complexes, metal alkoxides, halosilanes, 2-alkoxyethanols, β-diketones and alkyl acetates. Further, the metal contained within the metal soap, metal complex or metal alkoxide is typically aluminum, silicon, titanium, chromium, manganese, iron, cobalt, nickel, silver, copper, zinc, molybdenum, tin, indium or antimony. These polymeric binders and non-polymeric binders cure upon heating, making it possible to form a second transparent conductive film having a low haze and low volume resistivity at low temperature. The amount of these binders, reported as a proportion of the solid fraction within the transparent conductive film composition, is preferably within a range from 5 to 50% by mass, and is more preferably within a range from 10 to 30% by mass.

A coupling agent is preferably added to the transparent conductive film composition depending on the other components used. This coupling agent has the functions of improving the bonding between the conductive microparticles and the binder, and improving the adhesion between the second transparent conductive film formed from this transparent conductive film composition and the layers or conductive reflective film laminated on the substrate. Examples of the coupling agent include silane coupling agents, aluminum coupling agents and titanium coupling agents.

Examples of the silane coupling agents include vinyltriethoxysilane, γ-glycidoxypropyltrimethoxysilane, and γ-methacryloxypropyltrimethoxysilane. Examples of the aluminum coupling agents include the aluminum coupling agent containing acetoalkoxy groups illustrated below in formula (1). Furthermore, examples of the titanium coupling agents include the titanium coupling agents having dialkyl pyrophosphite groups illustrated below in formulas (2) to (4), and the titanium coupling agent having a dialkyl phosphite group illustrated below in formula (5).

[Chemical Formula 1]

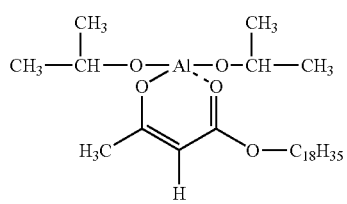
(1)

[Chemical Formula 2]

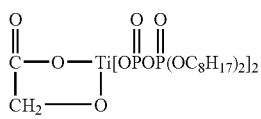
(2)

[Chemical Formula 3]

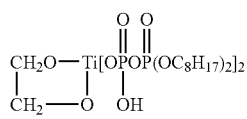
(3)

[Chemical Formula 4]

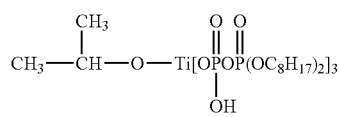
(4)

[Chemical Formula 5]

$$(C_8H_{17}O)_4Ti[P(OC_{13}H_{27})_2OH] \quad (5)$$

The amount of the coupling agent, reported as a proportion of the solid fraction within the transparent conductive film composition, is preferably within a range from 0.2 to 5% by mass, and is more preferably within a range from 0.5 to 2% by mass.

Examples of the dispersion medium used in forming the transparent conductive film composition include not only water, but also alcohols such as methanol, ethanol, isopropyl alcohol and butanol, ketones such as acetone, methyl ethyl ketone, cyclohexanone and isophorone, hydrocarbons such as toluene, xylene, hexane and cyclohexane, amides such as N,N-dimethylformamide and N,N-dimethylacetamide, sulfoxides such as dimethylsulfoxide, glycols such as ethylene glycol, and glycol ethers such as ethyl cellosolve. In order to obtain favorable film formability, the proportion of the dispersion medium within the composition is preferably within a range from 80 to 99% by mass.

Furthermore, depending on the components used, the addition of a resistance reducer or a water-soluble cellulose derivative or the like may also be preferable. The resistance reducer is preferably one or more materials selected from the group consisting of mineral acid salts and organic acid salts of cobalt, iron, indium, nickel, lead, tin, titanium and zinc. Specific examples include a mixture of nickel acetate and ferric chloride, a mixture of zinc naphthenate, tin octylate and antimony chloride, a mixture of indium nitrate and lead acetate, and a mixture of titanium acetylacetate and cobalt octylate. The amount of these resistance reducers is preferably 0.2 to 15% by mass relative to the mass of the conductive oxide powder. A water-soluble cellulose derivative is a non-ionic surfactant, but compared with other surfactants, has an extremely powerful ability to disperse the conductive oxide powder even when added in a very small amount. Furthermore, addition of a water-soluble cellulose derivative also improves the transparency of the formed second transparent conductive film. Specific examples of the water-soluble cellulose derivative include hydroxypropylcellulose and hydroxypropylmethylcellulose. The amount added of the water-soluble cellulose derivative is preferably within a range from 0.2 to 5% by mass.

The conductive reflective film composition used in forming the conductive reflective film of the first embodiment of the present invention is a composition composed of metal nanoparticles dispersed within a dispersion medium. The metal nanoparticles typically include at least 75% by mass, and preferably 80% by mass or more of silver nanoparticles. The reason for specifying an amount of silver nanoparticles of at least 75% by mass relative to 100% by mass of all the metal nanoparticles is because at an amount less than 75% by mass, the reflectance of the conductive reflective film formed using this composition tends to decrease. Furthermore, the silver nanoparticles are chemically modified with a protective agent having an organic molecular main chain with a carbon skeleton containing 1 to 3 carbon atoms.

The reason for restricting the number of carbon atoms within the carbon skeleton of the organic molecular main chain of the protective agent used for chemically modifying the metal nanoparticles to a number within a range from 1 to 3 is because if the number of carbon atoms is 4 or greater, then the protective agent becomes difficult to eliminate or decompose (detach and combust) under the heat used during the baking process, meaning a large amount of organic residue tends to remain within the film, which subsequently degenerates or degrades, causing reductions in the conductivity and reflectance of the conductive reflective film.

The silver nanoparticles include a number average of not less than 70%, and preferably not less than 75%, of silver nanoparticles having a primary particle size within a range from 10 to 50 nm. The reason for ensuring that the amount of metal nanoparticles having a primary particle size within a range from 10 to 50 nm is a number average of not less than 70% relative to 100% of all the metal nanoparticles is because if this number average is less than 70%, then the specific surface area of the metal nanoparticles increases and the proportion of the particles composed of organic matter increases, meaning that even if the organic molecules are readily eliminated or decomposed (detached and combusted) under the heat used during baking, because the amount of organic molecules is large, a large amount of organic residue tends to remain within the film, and this residue may subsequently degenerate or degrade, causing reductions in the conductivity and reflectance of the conductive reflective film, or the particle size distribution of the metal nanoparticles may broaden considerably, making the density of the conductive reflective film prone to a reduction that causes a deterioration in the conductivity and reflectance of the conductive reflective film. Moreover, another reason for specifying a primary particle size for the metal nanoparticles of 10 to 50 nm is that statistical analyses reveal that metal nanoparticles having a primary particle size within a range from 10 to 50 nm correlate with improved stability over time.

The metal nanoparticles other than the silver nanoparticles are metal nanoparticles formed from one metal, or a mixed composition or alloy composition containing two or more metals, selected from the group consisting of gold, platinum, palladium, ruthenium, nickel, copper, tin, indium, zinc, iron, chromium and manganese, and the amount of these metal nanoparticles other than the silver nanoparticles, relative to 100% by mass of all the metal nanoparticles, is at least 0.02% by mass but less than 25% by mass, and preferably within a range from 0.03 to 20% by mass. The reason for restricting the amount of the metal nanoparticles other than silver nanoparticles to at least 0.02% by mass but less than 25% by mass relative to 100% by mass of all the metal nanoparticles is because if the amount is less than 0.02% by mass, then although no particular problems arise, amounts within the range from 0.02 to 25% by mass still produce results for the conductivity and reflectance of the conductive reflective film following a weather resistance test (a test that involves standing for 1,000 hours in a constant temperature and humidity chamber at a temperature of 100° C. and a humidity of 50%) that display no deterioration from the results prior to the weather resistance test, whereas on the other hand, if the amount is 25% by mass or greater, then the conductivity and reflectance of the conductive reflective film immediately following baking tend to decrease, and the conductivity and reflectance of the conductive reflective film following a weather resistance test tend to be inferior to the conductivity and reflectance of the conductive reflective film prior to the weather resistance test.

The conductive reflective film composition used in forming the conductive reflective film of the first embodiment of the present invention includes one or more additives selected from the group consisting of organic polymers, metal oxides, metal hydroxides, organometallic compounds and silicone oils. A metal oxide, metal hydroxide, organometallic compound or silicone oil incorporated within the composition as an additive improves the adhesion to the second transparent conductive film with no loss of conductivity, either due to chemical bonding or an anchoring effect relative to the second transparent conductive film, or due to an improvement in the wettability between the metal nanoparticles and the second transparent conductive film during the baking step.

If the conductive reflective film is formed using a composition that contains none of the above metal oxides and the like, then the surface roughness of the formed conductive reflective film increases, but in order to optimize the photovoltaic conversion efficiency, specific conditions must be satisfied for the uneven shape of the surface of the conductive reflective film, and simply increasing the surface roughness does not necessarily enable the formation of a conductive reflective film surface having superior photovoltaic conversion efficiency. By appropriate adjustment of the variety and concentration and the like of the metal oxide, as described for the first embodiment of the present invention, a surface having a surface roughness that optimizes the photovoltaic conversion efficiency can be formed.

The amount of the additives is typically within a range from 0.1 to 20%, and preferably from 0.2 to 10%, of the mass of the silver nanoparticles within the metal nanoparticles. If the amount of these additives is less than 0.1%, then there is a possibility that holes having a large average diameter may be generated, and the density of the holes may increase. An amount of the additives exceeding 20% tends to exert an adverse effect on the conductivity of the formed conductive reflective film, and may result in a volume resistivity exceeding $2 \times 10^{-5}$ Ω·cm.

As the organic polymer used as an additive, one or more polymers selected from the group consisting of polyvinylpyrrolidone (hereafter also abbreviated as PVP), PVP copolymers and water-soluble celluloses are used. Specific examples of the PVP copolymers include PVP-methacrylate copolymers, PVP-styrene copolymers and PVP-vinyl acetate copolymers. Further, examples of the water-soluble celluloses include cellulose ethers such as hydroxypropylmethylcellulose, methylcellulose and hydroxyethylmethylcellulose.

Examples of the metal oxide used as an additive include oxides or composite oxides containing at least one metal selected from the group consisting of aluminum, silicon, titanium, chromium, manganese, iron, cobalt, nickel, silver, copper, zinc, molybdenum, tin, indium and antimony. Specific examples of the composite oxides include ITO, ATO and IZO.

Examples of the metal hydroxide used as an additive include hydroxides containing at least one metal selected from the group consisting of aluminum, silicon, titanium, chromium, manganese, iron, cobalt, nickel, silver, copper, zinc, molybdenum, tin, indium and antimony.

Examples of the organometallic compound used as an additive include metal soaps, metal complexes and metal alkoxides of at least one metal selected from the group consisting of silicon, titanium, aluminum, antimony, indium, chromium, manganese, iron, cobalt, nickel, silver, copper, zinc, molybdenum and tin. Examples of the metal soaps include chromium acetate, manganese formate, iron citrate, cobalt formate, nickel acetate, silver citrate, copper acetate, copper citrate, tin acetate, zinc acetate, zinc oxalate and molybdenum acetate. Furthermore, examples of the metal complexes include a zinc acetylacetonate complex, chromium acetylacetonate complex and nickel acetylacetonate complex. Examples of the metal alkoxides include titanium isopropoxide, methyl silicate, isocyanatopropyltrimethoxysilane and aminopropyltrimethoxysilane.

Examples of the silicone oil used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the first embodiment of the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The dispersion medium used in forming the conductive reflective film composition is preferably composed of an alcohol or an alcohol-containing aqueous solution. Examples of alcohols that may be used as the dispersion medium include one or more alcohols selected from the group consisting of methanol, ethanol, propanol, butanol, ethylene glycol, propylene glycol, diethylene glycol, glycerol, isobornylhexanol and erythritol. The alcohol-containing aqueous solution preferably contains, relative to 100% by mass of the entire dispersion medium, not less than 1% by mass, and preferably 2% by mass or more of water, and not less than 2% by mass, and preferably 3% by mass or more of an alcohol. For example, in those cases where the dispersion medium is composed solely of water and an alcohol, if the medium contains 2% by mass of water, then the alcohol content is 98% by mass, whereas if the medium contains 2% by mass of the alcohol, then the water content is 98% by mass. The reason for specifying a water content of not less than 1% by mass relative to 100% by mass of the entire dispersion medium is because if the water content is less than 1% by mass, then the film obtained by using a wet coating method to apply the conductive reflective film composition tends to be difficult to sinter at low temperatures, and the conductivity and reflectance of the film following baking tend to deteriorate. The reason for specifying an alcohol content of not less than 2% by mass relative to 100% by mass of the entire dispersion medium is because if the alcohol content is less than 2% by mass, then in a similar manner to that described above, the film obtained by using a wet coating method to apply the composition tends to be difficult to sinter at low temperatures, and the conductivity and reflectance of the film following baking tend to deteriorate.

Moreover, the dispersion medium, namely the protective molecules that chemically modify the surface of the metal nanoparticles, preferably contains one or both of a hydroxyl group (—OH) and a carbonyl group (—C=O). If a hydroxyl group (—OH) is incorporated within the protective agent that chemically modifies the metal nanoparticles such as the silver nanoparticles, then the composition exhibits excellent dispersion stability, and even low-temperature sintering of the coating yields an effective action. If a carbonyl group (—C=O) is incorporated within the protective agent that chemically modifies the metal nanoparticles such as the silver nanoparticles, then in a similar manner to that described above, the composition exhibits excellent dispersion stability, and even low-temperature sintering of the coating yields an effective action.

Examples of the method used for producing the conductive reflective film composition include the methods outlined below.

(a) The case where the number of carbon atoms within the carbon skeleton of the organic molecular main chain of the protective agent used for chemically modifying the silver nanoparticles is set to 3

Firstly, silver nitrate is dissolved in water such as deionized water to prepare a metal salt aqueous solution. In a separate preparation, sodium citrate is dissolved in water such as deionized water to prepare an aqueous solution of sodium citrate having a concentration of 10 to 40%, and ferrous sulfate in a particulate or powder form is then added directly to, and dissolved in, the sodium citrate aqueous solution under a stream of an inert gas such as nitrogen gas, thus preparing a reducing agent aqueous solution containing a 3:2 molar ratio of citrate ions and ferrous ions. Subsequently, with the reducing agent aqueous solution undergoing constant stirring under a stream of the above inert gas, the metal salt aqueous solution described above is added dropwise to the reducing agent aqueous solution and mixed thoroughly. During this process, it is preferable that the concentrations of the solutions are altered so that the amount added of the metal salt aqueous solution is not more than 1/10th of the amount of the reducing agent aqueous solution, as this ensures that the reaction temperature can be maintained within a range from 30 to 60° C. even if the added metal salt aqueous solution is at room temperature. Further, the mixing ratio between the two aqueous solutions is preferably adjusted so that the equivalent amount of ferrous ions added as the reducing agent is three times the equivalent amount of the metal ions, in other words, (number of mols of metal ions within the metal salt aqueous solution)×(valency of metal ions)=3×(ferrous ions within the reducing agent aqueous solution). Following completion of the dropwise addition of the metal salt aqueous solution, stirring of the resulting mixed liquid is continued for a further 10 to 300 minutes, thus forming a dispersion composed of a metal colloid. This dispersion is left to stand at room temperature, the precipitated metal nanoparticle aggregates are isolated by decantation and/or centrifugal separation and the like, water such as deionized water is added to the isolated nanoparticle aggregates to form a dispersion, a demineralization treatment is conducted using ultrafiltration, and displacement washing is then performed using an alcohol, so as to achieve a metal (silver) content within a range from 2.5 to 50% by mass. Subsequently, by separating the very coarse particles using a centrifugal separator with appropriate adjustment of the centrifugal power, silver nanoparticles are prepared in which those particles having a primary particle size within a range from 10 to 50 nm represent a number average of not less than 70%. In other words, the silver nanoparticles are prepared such that relative to 100% of all the silver nanoparticles, the proportion of silver nanoparticles having a primary particle size within a range from 10 to 50 nm represents a number average of not less than 70%. By using this method, a dispersion is obtained in which the number of carbon atoms within the carbon skeleton of the organic molecular main chain of the protective agent chemically modifying the silver nanoparticles is 3.

Subsequently, the resulting dispersion is adjusted so that the final metal content (silver content) relative to 100% by mass of the dispersion is within a range from 2.5 to 95% by mass. Further, in those cases where the dispersion medium is an alcohol-containing aqueous solution, the amounts of the water and the alcohol within the medium are preferably adjusted to amounts of not less than 1% and not less than 2% respectively. Furthermore, in those cases where further additives are included within the composition, one or more additives selected from the group consisting of organic polymers, metal oxides, metal hydroxides, organometallic compounds and silicone oils are added in the desired proportions. The amount of these additives is adjusted so as to satisfy a range from 0.1 to 20% by mass relative to 100% by mass of the obtained composition. This enables a composition to be obtained in which silver nanoparticles, which have been chemically modified with a protective agent having an organic molecular main chain in which the number of carbon atoms within the carbon skeleton is 3, are dispersed within the dispersion medium.

(b) The case where the number of carbon atoms within the carbon skeleton of the organic molecular main chain of the protective agent used for chemically modifying the silver nanoparticles is set to 2

With the exception of replacing the sodium citrate used when preparing the reducing agent aqueous solution with sodium malate, a dispersion is prepared in the same manner as (a) above. This enables a dispersion to be obtained in which the number of carbon atoms within the carbon skeleton of the organic molecular main chain that chemically modifies the silver nanoparticles is 2.

(c) The case where the number of carbon atoms within the carbon skeleton of the organic molecular main chain of the protective agent used for chemically modifying the silver nanoparticles is set to 1

With the exception of replacing the sodium citrate used when preparing the reducing agent aqueous solution with sodium glycolate, a dispersion is prepared in the same manner as (a) above. This enables a dispersion to be obtained in which the number of carbon atoms within the carbon skeleton of the organic molecular main chain that chemically modifies the silver nanoparticles is 1.

(d) The case where the number of carbon atoms within the carbon skeleton of the organic molecular main chain of the protective agent used for chemically modifying metal nanoparticles other than silver nanoparticles is set to 3

Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used when preparing the metal salt aqueous solution with chlorauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate, a dispersion is prepared in the same manner as (a) above. This enables a dispersion to be obtained in which the number of carbon atoms within the carbon skeleton of the organic molecular main chain of the protective agent that chemically modifies the metal nanoparticles other than silver nanoparticles is 3.

In those cases where the number of carbon atoms within the carbon skeleton of the organic molecular main chain of the protective agent used for chemically modifying metal nanoparticles other than silver nanoparticles is set to either 1 or 2, a dispersion is prepared in the same manner as either (b) or (c) above, with the exception of replacing the silver nitrate used when preparing the metal salt aqueous solution with one of the other metal salts listed above. This enables a dispersion to be obtained in which the number of carbon atoms within the carbon skeleton of the organic molecular main chain of the protective agent that chemically modifies the metal nanoparticles other than silver nanoparticles is either 1 or 2.

In those cases where silver nanoparticles and metal nanoparticles other than silver nanoparticles are combined as the metal nanoparticles, then for example, if the dispersion containing silver nanoparticles produced using the above method (a) is deemed the first dispersion, and the dispersion containing metal nanoparticles other than silver nanoparticles produced using the above method (d) is deemed the second dispersion, a dispersion may be prepared by mixing at least 75% by mass of the first dispersion and less than 25% by mass of the second dispersion so that the combination of the first and second dispersions totals 100% by mass. The first dispersion is not restricted to a dispersion containing silver nanoparticles produced using the above method (a), and a dispersion containing silver nanoparticles produced using the above method (b) or a dispersion containing silver nanoparticles produced using the above method (c) may also be used.

Next is a description of a method for producing a composite film according to the first embodiment of the present invention.

In the method for producing a composite film according to the first embodiment of the present invention, first, a wet coating method is used to apply the above transparent conductive film composition to a photovoltaic layer of a superstrate solar cell that has been laminated on a substrate with a first transparent conductive film disposed therebetween. This application is conducted so that the thickness following baking is within a range from 0.03 to 0.5 µm, and preferably from 0.05 to 0.1 µm. Subsequently, the applied coating is dried at a temperature of 20 to 120° C., and preferably 25 to 60° C., for a period of 1 to 30 minutes, and preferably 2 to 10 minutes. This completes the formation of a transparent conductive coating. Next, a wet coating method is used to apply the above conductive reflective film composition to the transparent conductive coating. This application is conducted so that the thickness following baking is within a range from 0.05 to 2.0 µm, and preferably from 0.1 to 1.5 µm. The applied coating is then dried at a temperature of 20 to 120° C., and preferably 25 to 60° C., for a period of 1 to 30 minutes, and preferably 2 to 10 minutes. This completes the formation of a conductive reflective coating. As the above substrate, either a transparent substrate composed of a glass, a ceramic or a polymer material, or a transparent laminate composed of two or more types of material selected from the group consisting of glass, ceramics, polymer materials and silicon can be used. Examples of polymer material substrates include substrates formed from an organic polymer such as a polyimide or PET (polyethylene terephthalate).

Moreover, the wet coating method mentioned above is preferably one of a spray coating method, dispenser coating method, spin coating method, knife coating method, slit coating method, inkjet coating method, screen printing method, offset printing method or die coating method, although this list is not exhaustive, and any appropriate method may be used.

Spray coating is a method in which either the dispersion is converted to a fine mist using compressed air and then applied to the substrate, or the dispersion itself is pressurized and converted to a fine mist that is then applied to the substrate. Dispenser coating is a method in which, for example, the dispersion is placed inside an injector, and the dispersion is then discharged, from a fine nozzle at the tip of the injector and applied to the substrate by depressing the injector piston. Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife while the substrate is moved horizontally in the downstream direction. Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing. Screen printing is a method in which a gauze is used as a patterning material, and the dispersion is transferred to the substrate through a print image formed on the gauze. Offset printing is a printing method that utilizes the water repellency of ink, wherein the dispersion applied to a plate is not adhered directly to the substrate, but is rather first transferred from the plate to a rubber sheet, before being subsequently transferred from the rubber sheet to the substrate. Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

Finally, the substrate having the coatings formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes. The reason for conducting the application of the transparent conductive film composition so that the thickness of the second transparent conductive film following baking is within a range from 0.03 to 0.5 µm is because if the thickness following baking is less than 0.03 µm or greater than 0.5 µm, then a satisfactory improvement in the reflection cannot be obtained. Furthermore, the reason for conducting the application of the conductive reflective film composition so that the thickness of the conductive reflective film following baking is within a range from 0.05 to 2.0 µm is because if the thickness is less than 0.05 µm, then the surface resistance value becomes overly high, making it difficult to obtain the level of conductivity required of a solar cell electrode, whereas if the thickness exceeds 2.0

μm, then although there are no concerns in terms of the resulting properties, the amount of material used is more than is necessary, resulting in unnecessary material waste.

The reason for specifying a baking temperature for the substrate having the coatings formed thereon within a range from 130 to 400° C. is because at temperatures lower than 130° C., a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. In contrast, if the temperature exceeds 400° C., then any merit associated with conducting the production using a low-temperature process is lost. In other words, the production costs increase, and the productivity tends to decrease. Furthermore, amorphous silicon solar cells, microcrystalline silicon solar cells, and hybrid silicon solar cells that use both these forms of silicon are particularly susceptible to heat, and a high temperature during the baking step causes a deterioration in the conversion efficiency.

The reason for specifying a baking time within a range from 5 to 60 minutes for the substrate having the coatings formed thereon is because if the baking time is less than the lower limit of this range, then a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. Although lengthening the baking time beyond the upper limit of the above range has no adverse effects on the composite film properties, it results in an unnecessary increase in production costs and decrease in productivity. Moreover, the conversion efficiency of the solar cell also tends to deteriorate.

The composite film of the first embodiment of the present invention can be formed in the manner described above. In this manner, by using a wet coating method, the production process according to the first embodiment of the present invention is able to eliminate vacuum processes such as vacuum deposition and sputtering as far as possible, meaning the composite film can be produced comparatively cheaply.

Second Embodiment

A superstrate thin-film solar cell generally has a structure in which a first transparent conductive film (the light incident side transparent conductive film) and a photovoltaic layer are laminated sequentially on top of a substrate, a second transparent conductive film is formed on top of the photovoltaic layer, and a conductive reflective film is then formed on top of the second transparent conductive film.

The second embodiment of the present invention relates to a composite film for a superstrate solar cell having a second transparent conductive film formed on a photovoltaic layer of the superstrate solar cell, and a conductive reflective film formed on top of the second transparent conductive film.

Figure 2:
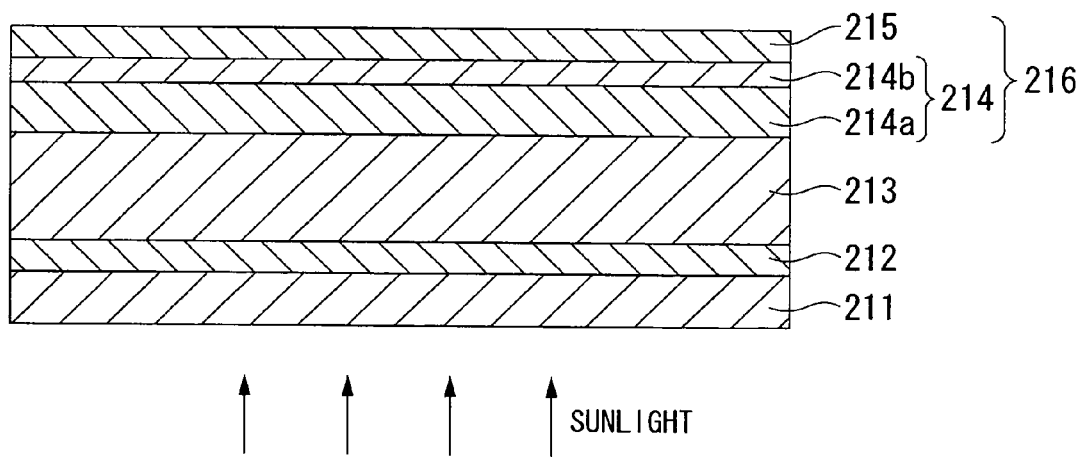
FIG. 2 is a diagram that schematically illustrates a cross-section of a composite film for a superstrate solar cell according to a second embodiment of the present invention.

FIG. 2 is a diagram that schematically illustrates a cross-section of the composite film according to the second embodiment of the present invention. As illustrated in FIG. 2, the special features of the structure of the composite film 216 of the second embodiment of the present invention are (1) that a second transparent conductive film 214 is formed by forming a coating of conductive oxide microparticles by using a wet coating method to apply a dispersion of the conductive oxide microparticles to a photovoltaic layer 213, impregnating the coating of the conductive oxide microparticles with a binder dispersion using a wet coating method, and subsequently performing baking, and (2) that the second transparent conductive film 214 has a thickness of 0.01 to 0.5 μm in a state where the entire surface of a conductive oxide microparticles layer 214a is covered with a binder layer 214b.

If the second transparent conductive film is formed using a vacuum deposition method such as a sputtering method, then the refractive index of the second transparent conductive film is determined by the material used as the target material, and consequently achieving the desired refractive index is problematic for a second transparent conductive film formed using a vacuum deposition method such as sputtering. In contrast, in the case of a second transparent conductive film formed using a wet coating method, because the film is generally formed by applying a composition that is a mixture of conductive oxide microparticles and one or more other components, a film formed using such a wet coating method is capable of realizing the desired low refractive index by appropriate adjustment of the components within the composition. The refractive index of this second transparent conductive film is typically within a range from 1.5 to 2. A second transparent conductive film having a low refractive index imparts an increased reflection effect to the adjoining conductive reflective film in terms of optical design, and therefore a conductive reflective film adjoining a second transparent conductive film formed using a wet coating method exhibits a higher reflectance than that obtainable for a conductive reflective film adjoining a second transparent conductive film having a high refractive index formed using a conventional vacuum deposition method such as sputtering.

One example of a second transparent conductive film formed using a wet coating method is a simple second transparent conductive film formed by applying a composition prepared by combining conductive oxide microparticles and a binder component, and subsequently baking the applied coating. On the other hand, the second transparent conductive film in the composite film according to the second embodiment of the present invention is formed by first forming a coating of conductive oxide microparticles containing no binder component on the photovoltaic layer, subsequently applying a binder dispersion containing no conductive oxide microparticles to the layer of the conductive oxide microparticles, and then performing baking at a predetermined temperature. In other words, as illustrated in FIG. 2, the second transparent conductive film 214 of the composite film according to the second embodiment of the present invention has the binder layer 214b that contains no conductive oxide microparticles as the upper layer. Further, the lower layer near the interface with the photovoltaic layer 213 is composed of the conductive oxide microparticles layer 214a, which is totally covered with the binder layer 214b, and contains a portion of the binder dispersion that impregnates the conductive oxide microparticles layer when the binder dispersion is applied. Upon baking, a portion of the particles within this conductive oxide microparticles layer 214a undergo sintering, thereby ensuring a high degree of conductivity.

In the composite film of the second embodiment of the present invention, by forming the second transparent conductive film with the structure described above, the level of adhesion with the underlying photovoltaic layer can be improved compared with a composite film having a simple second transparent conductive film formed using a composition containing both the conductive oxide microparticles and a binder component. Furthermore, because the composite film is formed with the entire surface of the conductive oxide microparticles layer covered with the binder layer, change in the film over time is minimal.

The thickness of the second transparent conductive film 214 is within a range from 0.01 to 0.5 μm, whereas the thickness of the conductive reflective film 215 is within a range from 0.05 to 2.0 μm.

Furthermore, the conductive reflective film 215 is formed by using a wet coating method to apply a conductive reflective film composition containing metal nanoparticles to the second transparent conductive film 214. Accordingly, the formed conductive reflective film exhibits favorable film formability and has a high diffuse reflectance. When a film is formed on a substrate of glass or the like, favorable film formability and a high diffuse reflectance can be achieved even when film formation is conducted using a vacuum deposition method such as a sputtering method, but if a vacuum deposition method such as sputtering is used to form a film on top of a second transparent conductive film that has been formed using a wet coating method, then the residual solvent within the second transparent conductive film tends to exert adverse effects on the formed conductive reflective film, meaning forming a conductive reflective film with a high reflectance is difficult.

In this manner, the composite film according to the second embodiment of the present invention yields a very high reflectance, due to an improved reflection effect, in terms of optical design, imparted by the second transparent conductive film of low refractive index formed using a wet coating method, as well as favorable film formability and high diffuse reflectance provided by the conductive reflective film.

Moreover, the average diameter of holes occurring at the contact surface of the conductive reflective film 215 on the side of the photovoltaic layer 213 is not more than 100 nm, the average depth at which the holes are positioned is not more than 100 nm, and the number density of the holes is not more than 30 holes/μm$^2$. When a transparent substrate having a transmittance of at least 98% is used, a conductive reflective film is obtained for which a high diffuse reflectance equivalent to not less than 80% of the theoretical reflectance can be achieved within a wavelength range from 500 to 1,200 nm. This wavelength range from 500 to 1,200 nm encompasses substantially all convertible wavelengths in those cases where a polycrystalline silicon is used for the photovoltaic layer. The reason for specifying an average diameter for the holes of not more than 100 nm is that, generally, a reflectance spectrum exhibits high reflectance at the long wavelength side of the spectrum and lower reflectance at the short wavelength side, and if the average diameter of the holes exceeds 100 nm, then the inflexion point at which the reflectance starts to decrease tends to shift to a longer wavelength, meaning a favorable reflectance may become unobtainable. Furthermore, the reason for specifying an average depth for the holes of not more than 100 nm is that if the average depth of the holes exceeds 100 nm, then the gradient (slope) of the reflectance spectrum tends to increase, meaning a favorable reflectance may be unobtainable. The reason for specifying a number density for the holes of not more than 30 holes/μm$^2$ is that if the number density of the holes exceeds 30 holes/μm$^2$, then the reflectance at the long wavelength side of the spectrum tends to decrease, meaning a favorable reflectance may be unobtainable.

The average diameter of the holes is preferably within a range from 5 to 100 nm, the average depth at which the holes are positioned is preferably within a range from 5 to 100 nm, and the number density of the holes is preferably within a range from 2 to 30 holes/μm$^2$. If the values for the average diameter of the holes, the average depth at which the holes are positioned, and the number density of the holes are less than the lower limits of the above ranges, then during sintering, the elimination of gas generated by decomposition of the organic molecules of the protective agent used to chemically modify the silver nanoparticles may be inadequate, and as a result, there is a possibility that the remaining organic molecule residues may cause reductions in the conductivity and the reflectance of the conductive reflective film.

Furthermore, the conductive reflective film that constitutes part of the composite film contains one or more materials selected from the group consisting of polyvinylpyrrolidones, polyvinylpyrrolidone copolymers and water-soluble celluloses, and this facilitates the setting of the average diameter of holes occurring at the contact surface of the conductive reflective film on the side of the second transparent conductive film to not more than 100 nm, the average depth to not more than 100 nm, and the number density to not more than 30 holes/μm$^2$. Furthermore, in the conductive reflective film that constitutes part of the composite film, because the proportion of silver among the metal elements contained within the film is 75% by mass or more, a high reflectance can be achieved. If this proportion is less than 75%, then the reflectance of the conductive reflective film formed using the composition tends to decrease. Furthermore, because the thickness of the conductive reflective film that constitutes part of the composite film is within a range from 0.05 to 2.0 μm, an electrode surface resistance value of the level required of a solar cell can be obtained. Moreover, of the metal nanoparticles incorporated within the conductive reflective film that constitutes part of the composite film, because particles having a particle size within a range from 10 to 50 nm represent a number average of not less than 70%, favorable conductivity and a high reflectance are obtained.

During the formation of the conductive oxide microparticles layer that constitutes part of the second transparent conductive film, conductive oxide microparticles such as tin oxide powders of ITO (Indium Tin Oxide) and ATO (Antimony Tin Oxide: antimony-doped tin oxide), and zinc oxide powders containing one or more elements selected from the group consisting of Al, Co, Fe, In, Sn and Ti can be used favorably, and of these, ITO, ATO, AZO (Aluminum Zinc Oxide: aluminum-doped zinc oxide), IZO (Indium Zinc Oxide: indium-doped zinc oxide) and TZO (Tin Zinc Oxide: tin-doped zinc oxide) are particularly desirable. In terms of ensuring satisfactory conductivity and favorable film formability, the average particle size of the conductive oxide microparticles is preferably within a range from 2 to 100 nm, and more preferably from 5 to 50 nm.

The conductive oxide microparticles layer is formed by preparing a dispersion containing the conductive oxide microparticles dispersed within a dispersion medium, and then using a wet coating method to apply this dispersion. Examples of the dispersion medium include not only water, but also alcohols such as methanol, ethanol, isopropyl alcohol and butanol, ketones such as acetone, methyl ethyl ketone, cyclohexanone and isophorone, hydrocarbons such as toluene, xylene, hexane and cyclohexane, amides such as N,N-dimethylformamide and N,N-dimethylacetamide, sulfoxides such as dimethylsulfoxide, glycols such as ethylene glycol, and glycol ethers such as ethyl cellosolve. In order to obtain favorable film formability, the proportion of the dispersion medium within the dispersion is preferably within a range from 50 to 99.99% by mass. The proportion of the conductive oxide microparticles within the dispersion is preferably within a range from 0.01 to 50% by mass. The reason for specifying a proportion of conductive oxide microparticles that satisfies the above range is because at proportions less than the lower limit of the above range, forming a uniform film becomes difficult, whereas if the proportion exceeds the above upper limit, forming a conductive reflective film having a thickness of not more than 500 nm becomes problematic.

A coupling agent is preferably added to the dispersion of the conductive oxide microparticles depending on the other components used. This coupling agent has the functions of improving the bonding between the conductive microparticles and the binder, and improving the adhesion between the second transparent conductive film and the photovoltaic layer or the conductive reflective film. Examples of the coupling agent include silane coupling agents, aluminum coupling agents and titanium coupling agents.

Examples of the silane coupling agents include vinyltriethoxysilane, γ-glycidoxypropyltrimethoxysilane, and γ-methacryloxypropyltrimethoxysilane. Examples of the aluminum coupling agents include the aluminum coupling agent containing acetoalkoxy groups illustrated below in formula (6). Furthermore, examples of the titanium coupling agents include the titanium coupling agents having dialkyl pyrophosphite groups illustrated below in formulas (7) to (9), and the titanium coupling agent having a dialkyl phosphite group illustrated below in formula (10).

[Chemical Formula 6]

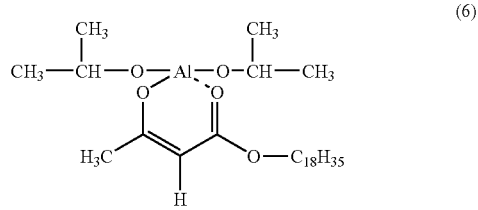

(6)

[Chemical Formula 7]

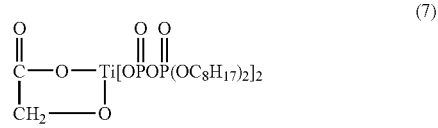

(7)

[Chemical Formula 8]

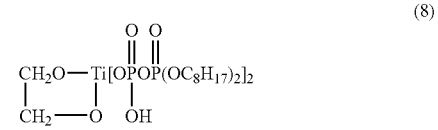

(8)

[Chemical Formula 9]

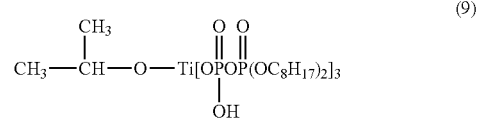

(9)

[Chemical Formula 10]

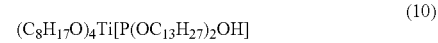

(10)

The binder dispersion includes, as a binder component, either one or both of a polymeric binder and a non-polymeric binder that cure upon heating. Examples of the polymeric binder include acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers. Furthermore, the polymeric binder preferably includes one or more metal soaps, metal complexes or metal alkoxide hydrolysates of aluminum, silicon, titanium, chromium, manganese, iron, cobalt, nickel, silver, copper, zinc, molybdenum or tin. Examples of the non-polymeric binder include metal soaps, metal complexes, metal alkoxides, halosilanes, 2-alkoxyethanols, β-diketones and alkyl acetates. Further, the metal contained within the metal soap, metal complex or metal alkoxide is typically aluminum, silicon, titanium, chromium, manganese, iron, cobalt, nickel, silver, copper, zinc, molybdenum, tin, indium or antimony. These polymeric binders and non-polymeric binders cure upon heating, making it possible to form a second transparent conductive film having a low haze and low volume resistivity at low temperature. The amount of these binders within the binder dispersion is preferably within a range from 0.01 to 50% by mass, and is more preferably within a range from 0.5 to 20% by mass.

During preparation of the binder dispersion, it is preferable to use the same dispersion medium as that used in preparing the dispersion used for forming the conductive oxide microparticles layer. In order to ensure formation of a uniform film, the amount of the dispersion medium is preferably within a range from 50 to 99.99% by mass.

Furthermore, depending on the components used, the addition of a resistance reducer or a water-soluble cellulose derivative or the like may also be preferable. The resistance reducer is preferably one or more materials selected from the group consisting of mineral acid salts and organic acid salts of cobalt, iron, indium, nickel, lead, tin, titanium and zinc. Specific examples include a mixture of nickel acetate and ferric chloride, a mixture of zinc naphthenate, tin octylate and antimony chloride, a mixture of indium nitrate and lead acetate, and a mixture of titanium acetylacetate and cobalt octylate. The amount of these resistance reducers is preferably 0.1 to 10% by mass. Addition of a water-soluble cellulose derivative improves the transparency of the formed second transparent conductive film. Specific examples of the water-soluble cellulose derivative include hydroxypropylcellulose and hydroxypropylmethylcellulose. The amount added of the water-soluble cellulose derivative is preferably within a range from 0.1 to 10% by mass.

The conductive reflective film composition used in forming the conductive reflective film of the second embodiment of the present invention is a composition composed of metal nanoparticles dispersed within a dispersion medium. The metal nanoparticles typically include at least 75% by mass, and preferably 80% by mass or more of silver nanoparticles. The reason for specifying an amount of silver nanoparticles of at least 75% by mass relative to 100% by mass of all the metal nanoparticles is because at an amount less than 75% by mass, the reflectance of the conductive reflective film formed using this composition tends to decrease. Furthermore, the silver nanoparticles are chemically modified with a protective agent having an organic molecular main chain with a carbon skeleton containing 1 to 3 carbon atoms.

The reason for restricting the number of carbon atoms within the carbon skeleton of the organic molecular main chain of the protective agent used for chemically modifying the metal nanoparticles to a number within a range from 1 to 3 is because if the number of carbon atoms is 4 or greater, then the protective agent becomes difficult to eliminate or decompose (detach and combust) under the heat used during the baking process, meaning a large amount of organic residue tends to remain within the film, which subsequently degenerates or degrades, causing reductions in the conductivity and reflectance of the conductive reflective film.

The silver nanoparticles include a number average of not less than 70%, and preferably not less than 75%, of silver nanoparticles having a primary particle size within a range from 10 to 50 nm. The reason for ensuring that the amount of metal nanoparticles having a primary particle size within a range from 10 to 50 nm is a number average of not less than 70% relative to 100% of all the metal nanoparticles is because if this number average is less than 70%, then the specific surface area of the metal nanoparticles increases and the proportion of the particles composed of organic matter increases, meaning that even if the organic molecules are readily eliminated or decomposed (detached and combusted) under the heat used during baking, because the amount of organic molecules is large, a large amount of organic residue tends to remain within the film, and this residue may subsequently degenerate or degrade, causing reductions in the conductivity and reflectance of the conductive reflective film, or the particle size distribution of the metal nanoparticles may broaden considerably, making the density of the conductive reflective film prone to a reduction that causes a deterioration in the conductivity and reflectance of the conductive reflective film. Moreover, another reason for specifying a primary particle size for the metal nanoparticles of 10 to 50 nm is that statistical analyses reveal that metal nanoparticles having a primary particle size within a range from 10 to 50 nm correlate with improved stability over time.

The metal nanoparticles other than the silver nanoparticles are metal nanoparticles formed from one metal, or a mixed composition or alloy composition containing two or more metals, selected from the group consisting of gold, platinum, palladium, ruthenium, nickel, copper, tin, indium, zinc, iron, chromium and manganese, and the amount of these metal nanoparticles other than the silver nanoparticles, relative to 100% by mass of all the metal nanoparticles, is at least 0.02% by mass but less than 25% by mass, and preferably within a range from 0.03 to 20% by mass. The reason for restricting the amount of the metal nanoparticles other than silver nanoparticles to at least 0.02% by mass but less than 25% by mass relative to 100% by mass of all the metal nanoparticles is because if the amount is less than 0.02% by mass, then although no particular problems arise, amounts within the range from 0.02 to 25% by mass still produce results for the conductivity and reflectance of the conductive reflective film following a weather resistance test (a test that involves standing for 1,000 hours in a constant temperature and humidity chamber at a temperature of 100° C. and a humidity of 50%) that display no deterioration from the results prior to the weather resistance test, whereas on the other hand, if the amount is 25% by mass or greater, then the conductivity and reflectance of the conductive reflective film immediately following baking tend to decrease, and the conductivity and reflectance of the conductive reflective film following a weather resistance test tend to be inferior to the conductivity and reflectance of the conductive reflective film prior to the weather resistance test.

Furthermore, the conductive reflective film composition includes one or more additives selected from the group consisting of organic polymers, metal oxides, metal hydroxides, organometallic compounds and silicone oils. A metal oxide, metal hydroxide, organometallic compound or silicone oil incorporated within the composition as an additive improves the adhesion to the second transparent conductive film with no loss of conductivity, either due to chemical bonding or an anchoring effect relative to the second transparent conductive film, or due to an improvement in the wettability between the metal nanoparticles and the second transparent conductive film during the baking step.

If the conductive reflective film is formed using a composition that contains none of the above metal oxides and the like, then the surface roughness of the formed conductive reflective film increases, but in order to optimize the photovoltaic conversion efficiency, specific conditions must be satisfied for the uneven shape of the surface of the conductive reflective film, and simply increasing the surface roughness does not necessarily enable the formation of a conductive reflective film surface having superior photovoltaic conversion efficiency. By appropriate adjustment of the variety and concentration and the like of the metal oxide, as described for the second embodiment of the present invention, a surface having a surface roughness that optimizes the photovoltaic conversion efficiency can be formed.

The amount of the additives is typically within a range from 0.1 to 20%, and preferably from 0.2 to 10%, of the mass of the silver nanoparticles within the metal nanoparticles. If the amount of these additives is less than 0.1%, then there is a possibility that holes having a large average diameter may be generated, and the density of the holes may increase. An amount of the additives exceeding 20% tends to exert an adverse effect on the conductivity of the formed conductive reflective film, and may result in a volume resistivity exceeding $2 \times 10^{-5}$ Ω·cm.

As the organic polymer used as an additive, one or more polymers selected from the group consisting of polyvinylpyrrolidone (hereafter also abbreviated as PVP), PVP copolymers and water-soluble celluloses are used. Specific examples of the PVP copolymers include PVP-methacrylate copolymers, PVP-styrene copolymers and PVP-vinyl acetate copolymers. Further, examples of the water-soluble celluloses include cellulose ethers such as hydroxypropylmethylcellulose, methylcellulose and hydroxyethylmethylcellulose.

Examples of the metal oxide used as an additive include oxides or composite oxides containing at least one metal selected from the group consisting of aluminum, silicon, titanium, chromium, manganese, iron, cobalt, nickel, silver, copper, zinc, molybdenum, tin, indium and antimony. Specific examples of the composite oxides include ITO, ATO and IZO.

Examples of the metal hydroxide used as an additive include hydroxides containing at least one metal selected from the group consisting of aluminum, silicon, titanium, chromium, manganese, iron, cobalt, nickel, silver, copper, zinc, molybdenum, tin, indium and antimony.

Examples of the organometallic compound used as an additive include metal soaps, metal complexes and metal alkoxides of at least one metal selected from the group consisting of silicon, titanium, aluminum, antimony, indium, chromium, manganese, iron, cobalt, nickel, silver, copper, zinc, molybdenum and tin. Examples of the metal soaps include chromium acetate, manganese formate, iron citrate, cobalt formate, nickel acetate, silver citrate, copper acetate, copper citrate, tin acetate, zinc acetate, zinc oxalate and molybdenum acetate. Furthermore, examples of the metal complexes include a zinc acetylacetonate complex, chromium acetylacetonate complex and nickel acetylacetonate complex. Examples of the metal alkoxides include titanium isopropoxide, methyl silicate, isocyanatopropyltrimethoxysilane and aminopropyltrimethoxysilane.

Examples of the silicone oil used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the second embodiment of the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The dispersion medium used in forming the conductive reflective film composition is preferably composed of an alcohol or an alcohol-containing aqueous solution. Examples of alcohols that may be used as the dispersion medium include one or more alcohols selected from the group consisting of methanol, ethanol, propanol, butanol, ethylene glycol, propylene glycol, diethylene glycol, glycerol, isobornylhexanol and erythritol. The alcohol-containing aqueous solution preferably contains, relative to 100% by mass of the entire dispersion medium, not less than 1% by mass, and preferably 2% by mass or more of water, and not less than 2% by mass, and preferably 3% by mass or more of an alcohol. For example, in those cases where the dispersion medium is composed solely of water and an alcohol, if the medium contains 2% by mass of water, then the alcohol content is 98% by mass, whereas if the medium contains 2% by mass of the alcohol, then the water content is 98% by mass. The reason for specifying a water content of not less than 1% by mass relative to 100% by mass of the entire dispersion medium is because if the water content is less than 1% by mass, then the film obtained by using a wet coating method to apply the conductive reflective film composition tends to be difficult to sinter at low temperatures, and the conductivity and reflectance of the film following baking tend to deteriorate. The reason for specifying an alcohol content of not less than 2% by mass relative to 100% by mass of the entire dispersion medium is because if the alcohol content is less than 2% by mass, then in a similar manner to that described above, the film obtained by using a wet coating method to apply the composition tends to be difficult to sinter at low temperatures, and the conductivity and reflectance of the film following baking tend to deteriorate.

Moreover, the dispersion medium, namely the protective molecules that chemically modify the surface of the metal nanoparticles, preferably contains one or both of a hydroxyl group (—OH) and a carbonyl group (—C=O). If a hydroxyl group (—OH) is incorporated within the protective agent that chemically modifies the metal nanoparticles such as the silver nanoparticles, then the composition exhibits excellent dispersion stability, and even low-temperature sintering of the coating yields an effective action. If a carbonyl group (—C=O) is incorporated within the protective agent that chemically modifies the metal nanoparticles such as the silver nanoparticles, then in a similar manner to that described above, the composition exhibits excellent dispersion stability, and even low-temperature sintering of the coating yields an effective action.

Examples of the method used for producing the conductive reflective film composition include the methods outlined below.

(a) The case where the number of carbon atoms within the carbon skeleton of the organic molecular main chain of the protective agent used for chemically modifying the silver nanoparticles is set to 3

Firstly, silver nitrate is dissolved in water such as deionized water to prepare a metal salt aqueous solution. In a separate preparation, sodium citrate is dissolved in water such as deionized water to prepare an aqueous solution of sodium citrate having a concentration of 10 to 40%, and ferrous sulfate in a particulate or powder form is then added directly to, and dissolved in, the sodium citrate aqueous solution under a stream of an inert gas such as nitrogen gas, thus preparing a reducing agent aqueous solution containing a 3:2 molar ratio of citrate ions and ferrous ions. Subsequently, with the reducing agent aqueous solution undergoing constant stirring under a stream of the above inert gas, the metal salt aqueous solution described above is added dropwise to the reducing agent aqueous solution and mixed thoroughly. During this process, it is preferable that the concentrations of the solutions are altered so that the amount added of the metal salt aqueous solution is not more than 1/10th of the amount of the reducing agent aqueous solution, as this ensures that the reaction temperature can be maintained within a range from 30 to 60° C. even if the added metal salt aqueous solution is at room temperature. Further, the mixing ratio between the two aqueous solutions is preferably adjusted so that the equivalent amount of ferrous ions added as the reducing agent is three times the equivalent amount of the metal ions, in other words, (number of mols of metal ions within the metal salt aqueous solution)×(valency of metal ions)=3×(ferrous ions within the reducing agent aqueous solution). Following completion of the dropwise addition of the metal salt aqueous solution, stirring of the resulting mixed liquid is continued for a further 10 to 300 minutes, thus forming a dispersion composed of a metal colloid. This dispersion is left to stand at room temperature, the precipitated metal nanoparticle aggregates are isolated by decantation and/or centrifugal separation and the like, water such as deionized water is added to the isolated nanoparticle aggregates to form a dispersion, a demineralization treatment is conducted using ultrafiltration, and displacement washing is then performed using an alcohol, so as to achieve a metal (silver) content within a range from 2.5 to 50% by mass. Subsequently, by separating the very coarse particles using a centrifugal separator with appropriate adjustment of the centrifugal power, silver nanoparticles are prepared in which those particles having a primary particle size within a range from 10 to 50 nm represent a number average of not less than 70%. In other words, the silver nanoparticles are prepared such that relative to 100% of all the silver nanoparticles, the proportion of silver nanoparticles having a primary particle size within a range from 10 to 50 nm represents a number average of not less than 70%. By using this method, a dispersion is obtained in which the number of carbon atoms within the carbon skeleton of the organic molecular main chain of the protective agent chemically modifying the silver nanoparticles is 3.

Subsequently, the resulting dispersion is adjusted so that the final metal content (silver content) relative to 100% by mass of the dispersion is within a range from 2.5 to 95% by mass. Further, in those cases where the dispersion medium is an alcohol-containing aqueous solution, the amounts of the water and the alcohol within the medium are preferably adjusted to amounts of not less than 1% and not less than 2% respectively. Furthermore, in those cases where further additives are included within the composition, one or more additives selected from the group consisting of organic polymers, metal oxides, metal hydroxides, organometallic compounds and silicone oils are added in the desired proportions. The amount of these additives is adjusted so as to satisfy a range from 0.1 to 20% by mass relative to 100% by mass of the obtained composition. This enables a composition to be obtained in which silver nanoparticles, which have been chemically modified with a protective agent having an organic molecular main chain in which the number of carbon atoms within the carbon skeleton is 3, are dispersed within the dispersion medium.

(b) The case where the number of carbon atoms within the carbon skeleton of the organic molecular main chain of the protective agent used for chemically modifying the silver nanoparticles is set to 2

With the exception of replacing the sodium citrate used when preparing the reducing agent aqueous solution with sodium malate, a dispersion is prepared in the same manner as (a) above. This enables a dispersion to be obtained in which the number of carbon atoms within the carbon skeleton of the organic molecular main chain that chemically modifies the silver nanoparticles is 2.

(c) The case where the number of carbon atoms within the carbon skeleton of the organic molecular main chain of the protective agent used for chemically modifying the silver nanoparticles is set to 1

With the exception of replacing the sodium citrate used when preparing the reducing agent aqueous solution with sodium glycolate, a dispersion is prepared in the same manner as (a) above. This enables a dispersion to be obtained in which the number of carbon atoms within the carbon skeleton of the organic molecular main chain that chemically modifies the silver nanoparticles is 1.

(d) The case where the number of carbon atoms within the carbon skeleton of the organic molecular main chain of the protective agent used for chemically modifying metal nanoparticles other than silver nanoparticles is set to 3

Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used when preparing the metal salt aqueous solution with chloroauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate, a dispersion is prepared in the same manner as (a) above. This enables a dispersion to be obtained in which the number of carbon atoms within the carbon skeleton of the organic molecular main chain of the protective agent that chemically modifies the metal nanoparticles other than silver nanoparticles is 3.

In those cases where the number of carbon atoms within the carbon skeleton of the organic molecular main chain of the protective agent used for chemically modifying metal nanoparticles other than silver nanoparticles is set to either 1 or 2, a dispersion is prepared in the same manner as either (b) or (c) above, with the exception of replacing the silver nitrate used when preparing the metal salt aqueous solution with one of the other metal salts listed above. This enables a dispersion to be obtained in which the number of carbon atoms within the carbon skeleton of the organic molecular main chain of the protective agent that chemically modifies the metal nanoparticles other than silver nanoparticles is either 1 or 2.

In those cases where silver nanoparticles and metal nanoparticles other than silver nanoparticles are combined as the metal nanoparticles, then for example, if the dispersion containing silver nanoparticles produced using the above method (a) is deemed the first dispersion, and the dispersion containing metal nanoparticles other than silver nanoparticles produced using the above method (d) is deemed the second dispersion, a dispersion may be prepared by mixing at least 75% by mass of the first dispersion and less than 25% by mass of the second dispersion so that the combination of the first and second dispersions totals 100% by mass. The first dispersion is not restricted to a dispersion containing silver nanoparticles produced using the above method (a), and a dispersion containing silver nanoparticles produced using the above method (b) or a dispersion containing silver nanoparticles produced using the above method (c) may also be used.

Next is a description of a method for producing a composite film according to the second embodiment of the present invention.

Figure 3:
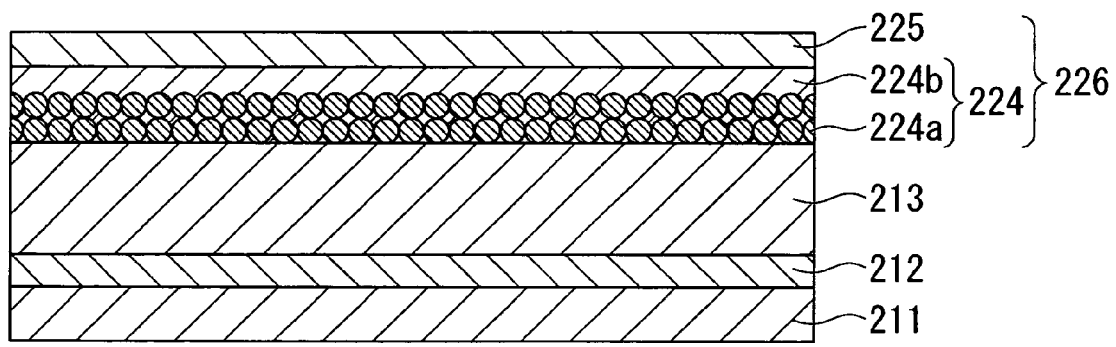
FIG. 3 is a diagram that schematically illustrates a cross-section of the composite film for a superstrate solar cell of the second embodiment of the present invention prior to baking.

In the production process according to the second embodiment of the present invention, as illustrated in FIG. 3, a conductive oxide microparticles coating 224a is first formed by using a wet coating method to apply the aforementioned dispersion, prepared by dispersing conductive oxide microparticles in a dispersion medium, to a photovoltaic layer 213 of a superstrate thin-film solar cell that has been laminated on a substrate 211 with a first transparent conductive film 212 disposed therebetween. This coating 224a is then dried at a temperature of 20 to 120° C., and preferably 25 to 60° C., for a period of 1 to 30 minutes, and preferably 2 to 10 minutes.

Subsequently, the conductive oxide microparticles coating 224a is impregnated with the aforementioned binder dispersion using a wet coating method, with the application conducted so that the entire surface of the conductive oxide microparticles coating 224a is covered with a binder dispersion coating 224b. Furthermore, the application is preferably conducted so that the mass of the binder component within the applied binder dispersion, relative to the total mass of microparticles contained within the applied conductive oxide microparticles coating, is a mass ratio (mass of binder component within applied binder dispersion/mass of conductive oxide microparticles) within a range from 0.5 to 10. If the mass ratio is less than the lower limit of the above range, then obtaining satisfactory adhesion is difficult, whereas if the mass ratio exceeds the upper limit of the range, then the surface resistance is likely to increase. This mass ratio is most preferably within a range from 0.5 to 3. The coating is dried at a temperature of 20 to 120° C., and preferably 25 to 60° C., for a period of 1 to 30 minutes, and preferably 2 to 10 minutes. Application of the above conductive oxide microparticles dispersion and the binder dispersion is conducted so that the thickness of the second transparent conductive film following baking is within a range from 0.01 to 0.5 µm, and preferably from 0.03 to 0.1 µm. In this manner, a transparent conductive coating 224 composed of the conductive oxide microparticles coating 224a and the binder dispersion coating 224b is formed.

Subsequently, the aforementioned conductive reflective film composition is applied to the transparent conductive coating 224 using a wet coating method. This application is conducted so that the thickness following baking is within a range from 0.05 to 2.0 µm, and preferably from 0.1 to 1.5 µm. The applied coating is then dried at a temperature of 20 to 120° C., and preferably 25 to 60° C., for a period of 1 to 30 minutes, and preferably 2 to 10 minutes. This completes the formation of a conductive reflective coating 225.

The wet coating method is preferably one of a spray coating method, dispenser coating method, spin coating method, knife coating method, slit coating method, inkjet coating method, screen printing method, offset printing method or die coating method, although this list is not exhaustive, and any appropriate method may be used.

Spray coating is a method in which either the dispersion is converted to a fine mist using compressed air and then applied to the substrate, or the dispersion itself is pressurized and converted to a fine mist that is then applied to the substrate. Dispenser coating is a method in which, for example, the dispersion is placed inside an injector, and the dispersion is then discharged from a fine nozzle at the tip of the injector and applied to the substrate by depressing the injector piston. Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife while the substrate is moved horizontally in the downstream direction. Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing. Screen printing is a method in which a gauze is used as a patterning material, and the dispersion is transferred to the substrate through a print image formed on the gauze. Offset printing is a printing method that utilizes the water repellency of ink, wherein the dispersion applied to a plate is not adhered directly to the substrate, but is rather first transferred from the plate to a rubber sheet, before being subsequently transferred from the rubber sheet to the substrate. Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

Finally, the substrate 211 having the coating 226 formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes. The reason for conducting the applications of the conductive oxide microparticles dispersion and the binder dispersion so that the thickness of the second transparent conductive film following baking is within a range from 0.01 to 0.5 μm is because if the thickness following baking is less than the lower limit of this range, then formation of a uniform film becomes difficult, whereas if the thickness exceeds the upper limit of the range, the amount of material used is more than is necessary, resulting in unnecessary material waste. The reason for conducting the application of the conductive reflective film composition so that the thickness of the conductive reflective film following baking is within a range from 0.05 to 2.0 μm is because if the thickness is less than 0.05 μm, then the surface resistance value becomes overly high, making it difficult to obtain the level of conductivity required of a solar cell electrode, whereas if the thickness exceeds 2.0 μm, then although there are no concerns in terms of the resulting properties, the amount of material used is more than is necessary, resulting in unnecessary material waste.

The reason for specifying a baking temperature within a range from 130 to 400° C. is because at temperatures lower than 130° C., a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. In contrast, if the temperature exceeds 400° C., then any merit associated with conducting the production using a low-temperature process is lost. In other words, the production costs increase, and the productivity tends to decrease. Furthermore, amorphous silicon solar cells, microcrystalline silicon solar cells, and hybrid silicon solar cells that use both these forms of silicon are particularly susceptible to heat, and a high temperature during the baking step causes a deterioration in the conversion efficiency.

The reason for specifying a baking time within a range from 5 to 60 minutes for the substrate having the coatings formed thereon is because if the baking time is less than the lower limit of this range, a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. Although lengthening the baking time beyond the upper limit of the above range has no adverse effects on the composite film properties, it results in an unnecessary increase in production costs and decrease in productivity. Moreover, the conversion efficiency of the solar cell also tends to deteriorate.

The composite film of the second embodiment of the present invention can be formed in the manner described above. In this manner, by using a wet coating method, the production process according to the second embodiment of the present invention is able to eliminate vacuum processes such as vacuum deposition and sputtering as far as possible, meaning the composite film can be produced comparatively cheaply.

Third Embodiment

Figure 4:
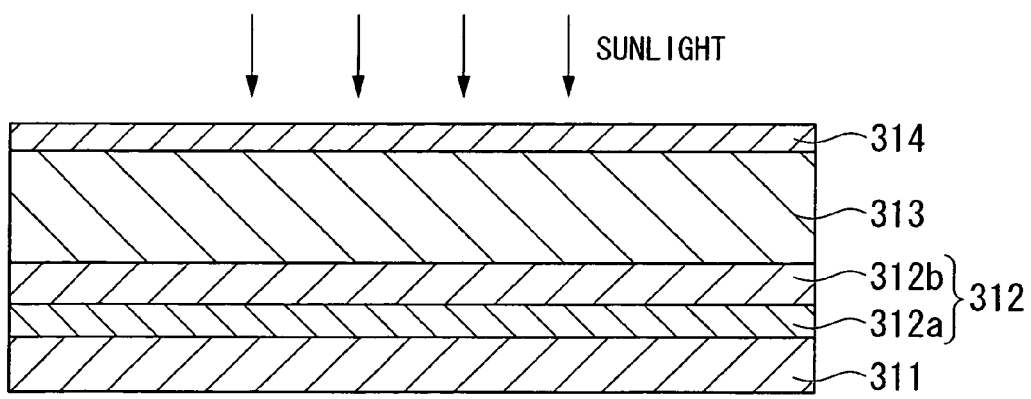
FIG. 4 is a diagram that schematically illustrates a cross-section of a composite film for a substrate solar cell according to a third embodiment of the present invention.

As illustrated in FIG. 4, a substrate thin-film solar cell typically has a structure in which a composite film 312 is formed on top of a substrate 311, and a photovoltaic layer 313 and a first transparent conductive film (the light incident side transparent conductive film) 314 are laminated sequentially on top of the composite film 312. The composite film 312 includes a conductive reflective film 312a formed on the substrate 311 and a second transparent conductive film 312b formed on the conductive reflective film 312a.

The third embodiment of the present invention relates to a composite film 312 for a substrate solar cell that is composed of two layers, namely, the conductive reflective film 312a formed on the substrate 311 and the second transparent conductive film 312b formed on the conductive reflective film 312a.

In the composite film 312 of the third embodiment of the present invention, the conductive reflective film 312a is formed by using a wet coating method to apply a conductive reflective film composition containing metal nanoparticles to the substrate 311. Accordingly, the conductive reflective film 312a exhibits favorable film formability and has a high diffuse reflectance.

Furthermore, in the composite film 312 according to the third embodiment of the present invention, the second transparent conductive film 312b is formed by using a wet coating method to apply a transparent conductive film composition containing conductive oxide microparticles. If the second transparent conductive film is formed using a vacuum deposition method such as a sputtering method, then the refractive index of the second transparent conductive film is determined by the material used as the target material, and consequently achieving the desired refractive index is problematic for a second transparent conductive film formed using a vacuum deposition method such as sputtering. In contrast, in the case of the second transparent conductive film 312b formed using a wet coating method, because the film is formed by applying a transparent conductive film composition that is a mixture of conductive oxide microparticles and one or more other components, a film formed using such a wet coating method is capable of realizing the desired low refractive index. The refractive index of this second transparent conductive film 312b is typically within a range from 1.5 to 2. A second transparent conductive film 312b having a low refractive index imparts an increased reflection effect to the adjoining conductive reflective film 312a in terms of optical design, and therefore the conductive reflective film 312a adjoining this second transparent conductive film 312b has a higher reflectance than that of a conductive reflective film adjoining a second transparent conductive film having a high refractive index formed using a conventional vacuum deposition method such as sputtering.

In this manner, the composite film 312 according to the third embodiment of the present invention has an improved reflection effect, in terms of optical design, imparted by the second transparent conductive film 312b that has a low refractive index, and a higher reflectance as a result of the favorable film formability and high diffuse reflectance provided by the conductive reflective film 312a.

Moreover, by ensuring that the average diameter of holes occurring at the contact surface of the conductive reflective film 312a on the side of the second transparent conductive film 312b is not more than 100 nm, the average depth at which the holes are positioned is not more than 100 nm, and the number density of the holes is not more than 30 holes/$\mu m^2$, a conductive reflective film 312a is obtained for which a high diffuse reflectance equivalent to not less than 80% of the theoretical reflectance can be achieved within a wavelength range from 500 to 1,200 nm when a transparent substrate having a transmittance of at least 98% is used. This wavelength range from 500 to 1,200 nm encompasses substantially all convertible wavelengths in those cases where a polycrystalline silicon is used for the photovoltaic layer. The reason for specifying an average diameter for the holes of not more than 100 nm is that, generally, a reflectance spectrum exhibits high reflectance at the long wavelength side of the spectrum and lower reflectance at the short wavelength side, and if the average diameter of the holes exceeds 100 nm, then the inflexion point at which the reflectance starts to decrease tends to shift to a longer wavelength, meaning a favorable reflectance may become unobtainable. Furthermore, the reason for specifying an average depth for the holes of not more than 100 nm is that if the average depth of the holes exceeds 100 nm, then the gradient (slope) of the reflectance spectrum tends to increase, meaning a favorable reflectance may be unobtainable. The reason for specifying a number density for the holes of not more than 30 holes/$\mu m^2$ is that if the number density of the holes exceeds 30 holes/$\mu m^2$, then the reflectance at the long wavelength side of the spectrum tends to decrease, meaning a favorable reflectance may be unobtainable.

The average diameter of the holes is preferably within a range from 5 to 100 nm, the average depth at which the holes are positioned is preferably within a range from 5 to 100 nm, and the number density of the holes is preferably within a range from 2 to 30 holes/$\mu m^2$. If the values for the average diameter of the holes, the average depth at which the holes are positioned, and the number density of the holes are less than the lower limits of the above ranges, then during sintering, the elimination of gas generated by decomposition of the organic molecules of the protective agent used to chemically modify the silver nanoparticles may be inadequate, and as a result, there is a possibility that the remaining organic molecule residues may cause reductions in the conductivity and the reflectance of the conductive reflective film.

The conductive reflective film that constitutes part of the composite film contains one or more materials selected from the group consisting of polyvinylpyrrolidones, polyvinylpyrrolidone copolymers and water-soluble celluloses, and this facilitates the setting of the average diameter of holes occurring at the contact surface of the conductive reflective film on the side of the second transparent conductive film to not more than 100 nm, the average depth to not more than 100 nm, and the number density to not more than 30 holes/$\mu m^2$. Furthermore, in the conductive reflective film that constitutes part of the composite film, because the proportion of silver among the metal elements contained within the film is 75% by mass or more, a high reflectance can be achieved. If this proportion is less than 75%, then the reflectance of the conductive reflective film formed using the composition tends to decrease. Furthermore, because the thickness of the conductive reflective film that constitutes part of the composite film is within a range from 0.05 to 2.0 $\mu$m, an electrode surface resistance value of the level required of a solar cell can be obtained. Moreover, of the metal nanoparticles incorporated within the conductive reflective film that constitutes part of the composite film, because particles having a particle size within a range from 10 to 50 nm represent a number average of not less than 70%, favorable conductivity and a high reflectance are obtained.

The transparent conductive film composition used in forming the second transparent conductive film of the third embodiment of the present invention contains conductive oxide microparticles, and is a composition in which these conductive oxide microparticles are dispersed within a dispersion medium.

As the conductive oxide microparticles incorporated within the transparent conductive film composition, tin oxide powders of ITO (Indium Tin Oxide) and ATO (Antimony Tin Oxide: antimony-doped tin oxide), and zinc oxide powders containing one or more elements selected from the group consisting of Al, Co, Fe, In, Sn and Ti are preferred, and of these, ITO, ATO, AZO (Aluminum Zinc Oxide: aluminum-doped zinc oxide), IZO (Indium Zinc Oxide: indium-doped zinc oxide) and TZO (Tin Zinc Oxide: tin-doped zinc oxide) are particularly desirable. Furthermore, the proportion of the conductive oxide microparticles within the solid fraction of the transparent conductive film composition is preferably within a range from 50 to 90% by mass. The reason for specifying a conductive oxide microparticles proportion within the above range is that at proportions less than the lower limit of the range, the conductivity tends to decrease, whereas if the proportion exceeds the upper limit of the range, the adhesion tends to deteriorate undesirably. Within the above range, a proportion of 70 to 90% by mass is particularly desirable. Furthermore, in terms of ensuring favorable stability within the dispersion medium, the average particle size of the conductive oxide microparticles is preferably within a range from 10 to 100 nm, and more preferably from 20 to 60 nm.

The transparent conductive film composition is a composition that includes either one or both of a polymeric binder and a non-polymeric binder that cure upon heating. Examples of the polymeric binder include acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers. Furthermore, the polymeric binder preferably includes one or more metal soaps, metal complexes or metal alkoxide hydrolysates of aluminum, silicon, titanium, chromium, manganese, iron, cobalt, nickel, silver, copper, zinc, molybdenum or tin. Examples of the non-polymeric binder include metal soaps, metal complexes, metal alkoxides, halosilanes, 2-alkoxyethanols, β-diketones and alkyl acetates. Further, the metal contained within the metal soap, metal complex or metal alkoxide is typically aluminum, silicon, titanium, chromium, manganese, iron, cobalt, nickel, silver, copper, zinc, molybdenum, tin, indium or antimony. These polymeric binders and non-polymeric binders cure upon heating, making it possible to form a second transparent conductive film having a low haze and low volume resistivity at low temperature. The amount of these binders, reported as a proportion of the solid fraction within the transparent conductive film composition, is preferably within a range from 5 to 50% by mass, and is more preferably within a range from 10 to 30% by mass.

A coupling agent is preferably added to the transparent conductive film composition depending on the other components used. This coupling agent has the functions of improving the bonding between the conductive microparticles and the binder, and improving the adhesion between the second transparent conductive film formed from this transparent conductive film composition and the conductive reflective film or photovoltaic layer. Examples of the coupling agent include silane coupling agents, aluminum coupling agents and titanium coupling agents.

Examples of the silane coupling agents include vinyltriethoxysilane, γ-glycidoxypropyltrimethoxysilane, and γ-methacryloxypropyltrimethoxysilane. Examples of the aluminum coupling agents include the aluminum coupling agent containing acetoalkoxy groups illustrated below in formula (11). Furthermore, examples of the titanium coupling agents include the titanium coupling agents having dialkyl pyrophosphite groups illustrated below in formulas (12) to (14), and the titanium coupling agent having a dialkyl phosphite group illustrated below in formula (15).

[Chemical Formula 11]

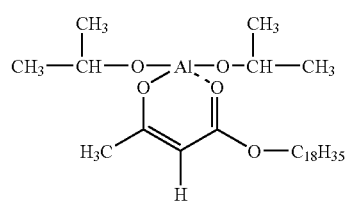

(11)

[Chemical Formula 12]

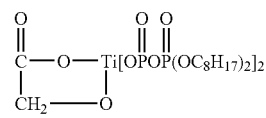

(12)

[Chemical Formula 13]

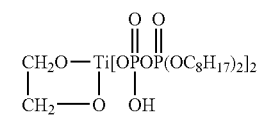

(13)

[Chemical Formula 14]

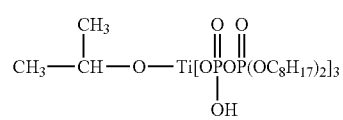

(14)

[Chemical Formula 15]

(15)

The amount of the coupling agent, reported as a proportion of the solid fraction within the transparent conductive film composition, is preferably within a range from 0.2 to 5% by mass, and is more preferably within a range from 0.5 to 2% by mass.

Examples of the dispersion medium used in forming the transparent conductive film composition include not only water, but also alcohols such as methanol, ethanol, isopropyl alcohol and butanol, ketones such as acetone, methyl ethyl ketone, cyclohexanone and isophorone, hydrocarbons such as toluene, xylene, hexane and cyclohexane, amides such as N,N-dimethylformamide and N,N-dimethylacetamide, sulfoxides such as dimethylsulfoxide, glycols such as ethylene glycol, and glycol ethers such as ethyl cellosolve. In order to obtain favorable film formability, the proportion of the dispersion medium within the composition is preferably within a range from 80 to 99% by mass.

Furthermore, depending on the components used, the addition of a resistance reducer or a water-soluble cellulose derivative or the like may also be preferable. The resistance reducer is preferably one or more materials selected from the group consisting of mineral acid salts and organic acid salts of cobalt, iron, indium, nickel, lead, tin, titanium and zinc. Specific examples include a mixture of nickel acetate and ferric chloride, a mixture of zinc naphthenate, tin octylate and antimony chloride, a mixture of indium nitrate and lead acetate, and a mixture of titanium acetylacetate and cobalt octylate. The amount of these resistance reducers is preferably 0.2 to 15% by mass relative to the mass of the conductive oxide powder. A water-soluble cellulose derivative is a non-ionic surfactant, but compared with other surfactants, has an extremely powerful ability to disperse the conductive oxide powder even when added in a very small amount. Furthermore, addition of a water-soluble cellulose derivative also improves the transparency of the formed second transparent conductive film. Specific examples of the water-soluble cellulose derivative include hydroxypropylcellulose and hydroxypropylmethylcellulose. The amount added of the water-soluble cellulose derivative is preferably within a range from 0.2 to 5% by mass.

The conductive reflective film composition used in forming the conductive reflective film within the composite film of the third embodiment of the present invention is a composition composed of metal nanoparticles dispersed within a dispersion medium. The metal nanoparticles typically include at least 75% by mass, and preferably 80% by mass or more of silver nanoparticles. The reason for specifying an amount of silver nanoparticles of at least 75% by mass relative to 100% by mass of all the metal nanoparticles is because at an amount less than 75% by mass, the reflectance of the conductive reflective film formed using this composition tends to decrease. Furthermore, the silver nanoparticles are chemically modified with a protective agent having an organic molecular main chain with a carbon skeleton containing 1 to 3 carbon atoms.

The reason for restricting the number of carbon atoms within the carbon skeleton of the organic molecular main chain of the protective agent used for chemically modifying the metal nanoparticles to a number within a range from 1 to 3 is because if the number of carbon atoms is 4 or greater, then the protective agent becomes difficult to eliminate or decompose (detach and combust) under the heat used during the baking process, meaning a large amount of organic residue tends to remain within the film, which subsequently degenerates or degrades, causing reductions in the conductivity and reflectance of the conductive reflective film.

The silver nanoparticles include a number average of not less than 70%, and preferably not less than 75%, of silver nanoparticles having a primary particle size within a range from 10 to 50 nm. The reason for ensuring that the amount of metal nanoparticles having a primary particle size within a range from 10 to 50 nm is a number average of not less than 70% relative to 100% of all the metal nanoparticles is because if this number average is less than 70%, then the specific surface area of the metal nanoparticles increases and the proportion of the particles composed of organic matter increases, meaning that even if the organic molecules are readily eliminated or decomposed (detached and combusted) under the heat used during baking, because the amount of organic molecules is large, a large amount of organic residue tends to remain within the film, and this residue may subsequently degenerate or degrade, causing reductions in the conductivity and reflectance of the conductive reflective film, or the particle size distribution of the metal nanoparticles may broaden considerably, making the density of the conductive reflective film prone to a reduction that causes a deterioration in the conductivity and reflectance of the conductive reflective film. Moreover, another reason for specifying a primary particle size for the metal nanoparticles of 10 to 50 nm is that statistical analyses reveal that metal nanoparticles having a primary particle size within a range from 10 to 50 nm correlate with improved stability over time.

The metal nanoparticles other than the silver nanoparticles are metal nanoparticles formed from one metal, or a mixed composition or alloy composition containing two or more metals, selected from the group consisting of gold, platinum, palladium, ruthenium, nickel, copper, tin, indium, zinc, iron, chromium and manganese, and the amount of these metal nanoparticles other than the silver nanoparticles, relative to 100% by mass of all the metal nanoparticles, is at least 0.02% by mass but less than 25% by mass, and preferably within a range from 0.03 to 20% by mass. The reason for restricting the amount of the metal nanoparticles other than silver nanoparticles to at least 0.02% by mass but less than 25% by mass relative to 100% by mass of all the metal nanoparticles is because if the amount is less than 0.02% by mass, then although no particular problems arise, amounts within the range from 0.02 to 25% by mass still produce results for the conductivity and reflectance of the conductive reflective film following a weather resistance test (a test that involves standing for 1,000 hours in a constant temperature and humidity chamber at a temperature of 100° C. and a humidity of 50%) that display no deterioration from the results prior to the weather resistance test, whereas on the other hand, if the amount is 25% by mass or greater, then the conductivity and reflectance of the conductive reflective film immediately following baking tend to decrease, and the conductivity and reflectance of the conductive reflective film following a weather resistance test tend to be inferior to the conductivity and reflectance of the conductive reflective film prior to the weather resistance test.

The conductive reflective film composition used in forming the conductive reflective film of the third embodiment of the present invention includes one or more additives selected from the group consisting of organic polymers, metal oxides, metal hydroxides, organometallic compounds and silicone oils. A metal oxide, metal hydroxide, organometallic compound or silicone oil incorporated within the composition as an additive improves the adhesion to the second transparent conductive film with no loss of conductivity, either due to chemical bonding or an anchoring effect relative to the second transparent conductive film, or due to an improvement in the wettability between the metal nanoparticles and the second transparent conductive film during the baking step.

If the conductive reflective film is formed using a composition that contains none of the above metal oxides and the like, then the surface roughness of the formed conductive reflective film increases, but in order to optimize the photovoltaic conversion efficiency, specific conditions must be satisfied for the uneven shape of the surface of the conductive reflective film, and simply increasing the surface roughness does not necessarily enable the formation of a conductive reflective film surface having superior photovoltaic conversion efficiency. By appropriate adjustment of the variety and concentration and the like of the metal oxide, as described for the third embodiment of the present invention, a surface having a surface roughness that optimizes the photovoltaic conversion efficiency can be formed.

The amount of the additives is typically within a range from 0.1 to 20%, and preferably from 0.2 to 10%, of the mass of the silver nanoparticles within the metal nanoparticles. If the amount of these additives is less than 0.1%, then there is a possibility that holes having a large average diameter may be generated, and the density of the holes may increase. An amount of the additives exceeding 20% tends to exert an adverse effect on the conductivity of the formed conductive reflective film, and may result in a volume resistivity exceeding $2 \times 10^{-5}$ Ω·cm.

As the organic polymer used as an additive, one or more polymers selected from the group consisting of polyvinylpyrrolidone (hereafter also abbreviated as PVP), PVP copolymers and water-soluble celluloses are used. Specific examples of the PVP copolymers include PVP-methacrylate copolymers, PVP-styrene copolymers and PVP-vinyl acetate copolymers. Further, examples of the water-soluble celluloses include cellulose ethers such as hydroxypropylmethylcellulose, methylcellulose and hydroxyethylmethylcellulose.

Examples of the metal oxide used as an additive include oxides or composite oxides containing at least one metal selected from the group consisting of aluminum, silicon, titanium, chromium, manganese, iron, cobalt, nickel, silver, copper, zinc, molybdenum, tin, indium and antimony. Specific examples of the composite oxides include ITO, ATO and IZO.

Examples of the metal hydroxide used as an additive include hydroxides containing at least one metal selected from the group consisting of aluminum, silicon, titanium, chromium, manganese, iron, cobalt, nickel, silver, copper, zinc, molybdenum, tin, indium and antimony.

Examples of the organometallic compound used as an additive include metal soaps, metal complexes and metal alkoxides of at least one metal selected from the group consisting of silicon, titanium, aluminum, antimony, indium, chromium, manganese, iron, cobalt, nickel, silver, copper, zinc, molybdenum and tin. Examples of the metal soaps include chromium acetate, manganese formate, iron citrate, cobalt formate, nickel acetate, silver citrate, copper acetate, copper citrate, tin acetate, zinc acetate, zinc oxalate and molybdenum acetate. Furthermore, examples of the metal complexes include a zinc acetylacetonate complex, chromium acetylacetonate complex and nickel acetylacetonate complex. Examples of the metal alkoxides include titanium isopropoxide, methyl silicate, isocyanatopropyltrimethoxysilane and aminopropyltrimethoxysilane.

Examples of the silicone oil used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the third embodiment of the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The dispersion medium used in forming the conductive reflective film composition is preferably composed of an alcohol or an alcohol-containing aqueous solution. Examples of alcohols that may be used as the dispersion medium include one or more alcohols selected from the group consisting of methanol, ethanol, propanol, butanol, ethylene glycol, propylene glycol, diethylene glycol, glycerol, isobornylhexanol and erythritol. The alcohol-Containing aqueous solution preferably contains, relative to 100% by mass of the entire dispersion medium, not less than 1% by mass, and preferably 2% by mass or more of water, and not less than 2% by mass, and preferably 3% by mass or more of an alcohol. For example, in those cases where the dispersion medium is composed solely of water and an alcohol, if the medium contains 2% by mass of water, then the alcohol content is 98% by mass, whereas if the medium contains 2% by mass of the alcohol, then the water content is 98% by mass. The reason for specifying a water content of not less than 1% by mass relative to 100% by mass of the entire dispersion medium is because if the water content is less than 1% by mass, then the film obtained by using a wet coating method to apply the conductive reflective film composition tends to be difficult to sinter at low temperatures, and the conductivity and reflectance of the film following baking tend to deteriorate. The reason for specifying an alcohol content of not less than 2% by mass relative to 100% by mass of the entire dispersion medium is because if the alcohol content is less than 2% by mass, then in a similar manner to that described above, the film obtained by using a wet coating method to apply the composition tends to be difficult to sinter at low temperatures, and the conductivity and reflectance of the film following baking tend to deteriorate.

Moreover, the dispersion medium, namely the protective molecules that chemically modify the surface of the metal nanoparticles, preferably contains one or both of a hydroxyl group (—OH) and a carbonyl group (—C=O). If a hydroxyl group (—OH) is incorporated within the protective agent that chemically modifies the metal nanoparticles such as the silver nanoparticles, then the composition exhibits excellent dispersion stability, and even low-temperature sintering of the coating yields an effective action. If a carbonyl group (—C=O) is incorporated within the protective agent that chemically modifies the metal nanoparticles such as the silver nanoparticles, then in a similar manner to that described above, the composition exhibits excellent dispersion stability, and even low-temperature sintering of the coating yields an effective action.

Examples of the method used for producing the conductive reflective film composition of the third embodiment of the present invention include the methods outlined below.

(a) The case where the number of carbon atoms within the carbon skeleton of the organic molecular main chain of the protective agent used for chemically modifying the silver nanoparticles is set to 3

Firstly, silver nitrate is dissolved in water such as deionized water to prepare a metal salt aqueous solution. In a separate preparation, sodium citrate is dissolved in water such as deionized water to prepare an aqueous solution of sodium citrate having a concentration of 10 to 40%, and ferrous sulfate in a particulate or powder form is then added directly to, and dissolved in, the sodium citrate aqueous solution under a stream of an inert gas such as nitrogen gas, thus preparing a reducing agent aqueous solution containing a 3:2 molar ratio of citrate ions and ferrous ions. Subsequently, with the reducing agent aqueous solution undergoing constant stirring under a stream of the above inert gas, the metal salt aqueous solution described above is added dropwise to the reducing agent aqueous solution and mixed thoroughly. During this process, it is preferable that the concentrations of the solutions are altered so that the amount added of the metal salt aqueous solution is not more than 1/10th of the amount of the reducing agent aqueous solution, as this ensures that the reaction temperature can be maintained within a range from 30 to 60° C. even if the added metal salt aqueous solution is at room temperature. Further, the mixing ratio between the two aqueous solutions is preferably adjusted so that the equivalent amount of ferrous ions added as the reducing agent is three times the equivalent amount of the metal ions, in other words, (number of mols of metal ions within the metal salt aqueous solution)×(valency of metal ions)=3×(ferrous ions within the reducing agent aqueous solution). Following completion of the dropwise addition of the metal salt aqueous solution, stirring of the resulting mixed liquid is continued for a further 10 to 300 minutes, thus forming a dispersion composed of a metal colloid. This dispersion is left to stand at room temperature, the precipitated metal nanoparticle aggregates are isolated by decantation and/or centrifugal separation and the like, water such as deionized water is added to the isolated nanoparticle aggregates to form a dispersion, a demineralization treatment is conducted using ultrafiltration, and displacement washing is then performed using an alcohol, so as to achieve a metal (silver) content within a range from 2.5 to 50% by mass. Subsequently, by separating the very coarse particles using a centrifugal separator with appropriate adjustment of the centrifugal power, silver nanoparticles are prepared in which those particles having a primary particle size within a range from 10 to 50 nm represent a number average of not less than 70%. In other words, the silver nanoparticles are prepared such that relative to 100% of all the silver nanoparticles, the proportion of silver nanoparticles having a primary particle size within a range from 10 to 50 nm represents a number average of not less than 70%. By using this method, a dispersion is obtained in which the number of carbon atoms within the carbon skeleton of the organic molecular main chain of the protective agent chemically modifying the silver nanoparticles is 3.

Subsequently, the resulting dispersion is adjusted so that the final metal content (silver content) relative to 100% by mass of the dispersion is within a range from 2.5 to 95% by mass. Further, in those cases where the dispersion medium is an alcohol-containing aqueous solution, the amounts of the water and the alcohol within the medium are preferably adjusted to amounts of not less than 1% and not less than 2% respectively. Furthermore, in those cases where further additives are included within the composition, one or more additives selected from the group consisting of organic polymers, metal oxides, metal hydroxides, organometallic compounds and silicone oils are added in the desired proportions. The amount of these additives is adjusted so as to satisfy a range from 0.1 to 20% by mass relative to 100% by mass of the obtained composition. This enables a composition to be obtained in which silver nanoparticles, which have been chemically modified with a protective agent having an organic molecular main chain in which the number of carbon atoms within the carbon skeleton is 3, are dispersed within the dispersion medium.

(b) The case where the number of carbon atoms within the carbon skeleton of the organic molecular main chain of the protective agent used for chemically modifying the silver nanoparticles is set to 2

With the exception of replacing the sodium citrate used when preparing the reducing agent aqueous solution with sodium malate, a dispersion is prepared in the same manner as (a) above. This enables a dispersion to be obtained in which the number of carbon atoms within the carbon skeleton of the organic molecular main chain that chemically modifies the silver nanoparticles is 2.

(c) The case where the number of carbon atoms within the carbon skeleton of the organic molecular main chain of the protective agent used for chemically modifying the silver nanoparticles is set to 1

With the exception of replacing the sodium citrate used when preparing the reducing agent aqueous solution with sodium glycolate, a dispersion is prepared in the same manner as (a) above. This enables a dispersion to be obtained in which the number of carbon atoms within the carbon skeleton of the organic molecular main chain that chemically modifies the silver nanoparticles is 1.

(d) The case where the number of carbon atoms within the carbon skeleton of the organic molecular main chain of the protective agent used for chemically modifying metal nanoparticles other than silver nanoparticles is set to 3

Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used when preparing the metal salt aqueous solution with chlorauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate, a dispersion is prepared in the same manner as (a) above. This enables a dispersion to be obtained in which the number of carbon atoms within the carbon skeleton of the organic molecular main chain of the protective agent that chemically modifies the metal nanoparticles other than silver nanoparticles is 3.

In those cases where the number of carbon atoms within the carbon skeleton of the organic molecular main chain of the protective agent used for chemically modifying metal nanoparticles other than silver nanoparticles is set to either 1 or 2, a dispersion is prepared in the same manner as either (b) or (c) above, with the exception of replacing the silver nitrate used when preparing the metal salt aqueous solution with one of the other metal salts listed above. This enables a dispersion to be obtained in which the number of carbon atoms within the carbon skeleton of the organic molecular main chain of the protective agent that chemically modifies the metal nanoparticles other than silver nanoparticles is either 1 or 2.

In those cases where silver nanoparticles and metal nanoparticles other than silver nanoparticles are combined as the metal nanoparticles, then for example, if the dispersion containing silver nanoparticles produced using the above method (a) is deemed the first dispersion, and the dispersion containing metal nanoparticles other than silver nanoparticles produced using the above method (d) is deemed the second dispersion, a dispersion may be prepared by mixing at least 75% by mass of the first dispersion and less than 25% by mass of the second dispersion so that the combination of the first and second dispersions totals 100% by mass. The first dispersion is not restricted to a dispersion containing silver nanoparticles produced using the above method (a), and a dispersion containing silver nanoparticles produced using the above method (b) or a dispersion containing silver nanoparticles produced using the above method (c) may also be used.

Next is a description of a method for producing a composite film according to the third embodiment of the present invention.

In the method for producing a composite film according to the third embodiment of the present invention, first, a wet coating method is used to apply the above conductive reflective film composition to a substrate. This application is conducted so that the thickness following baking is within a range from 0.05 to 2.0 μm, and preferably from 0.1 to 1.5 μm. Subsequently, the applied coating is dried at a temperature of 20 to 120° C., and preferably 25 to 60° C., for a period of 1 to 30 minutes, and preferably 2 to 10 minutes. This completes the formation of a conductive reflective coating. Next, the substrate having the conductive reflective coating formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes, thereby forming a conductive reflective film. Subsequently, a wet coating method is used to apply a transparent conductive film composition to the top of the conductive reflective film. This application is conducted so that the thickness following baking is within a range from 0.03 to 0.5 μm, and preferably from 0.05 to 0.1 μm. Subsequently, the applied coating is dried at a temperature of 20 to 120° C., and preferably 25 to 60° C., for a period of 1 to 30 minutes, and preferably 2 to 10 minutes. This completes the formation of a transparent conductive coating. Next, the substrate having the transparent conductive coating formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes, thereby forming a transparent conductive film.

As the above substrate, either a substrate composed of a glass, a ceramic, a metal or a polymer material, or a transparent laminate composed of two or more types of material selected from the group consisting of glass, ceramics, polymer materials, metals and silicon can be used. Examples of polymer material substrates include substrates formed from an organic polymer such as a polyimide or PET (polyethylene terephthalate).

Further, the wet coating method mentioned above is preferably one of a spray coating method, dispenser coating method, spin coating method, knife coating method, slit coating method, inkjet coating method, screen printing method, offset printing method or die coating method, although this list is not exhaustive, and any appropriate method may be used.

Spray coating is a method in which either the dispersion is converted to a fine mist using compressed air and then applied to the substrate, or the dispersion itself is pressurized and converted to a fine mist that is then applied to the substrate. Dispenser coating is a method in which, for example, the dispersion is placed inside an injector, and the dispersion is then discharged from a fine nozzle at the tip of the injector and applied to the substrate by depressing the injector piston. Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife while the substrate is moved horizontally in the downstream direction. Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing. Screen printing is a method in which a gauze is used as a patterning material, and the dispersion is transferred to the substrate through a print image formed on the gauze. Offset printing is a printing method that utilizes the water repellency of ink, wherein the dispersion applied to a plate is not adhered directly to the substrate, but is rather first transferred from the plate to a rubber sheet, before being subsequently transferred from the rubber sheet to the substrate. Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

The reason for conducting the application of the conductive reflective film composition so that the thickness of the conductive reflective film following baking is within a range from 0.05 to 2.0 µm is because if the thickness is less than 0.05 µm, then the surface resistance value becomes overly high, making it difficult to obtain the level of conductivity required of a solar cell electrode, whereas if the thickness exceeds 2.0 µm, then although there are no concerns in terms of the resulting properties, the amount of material used is more than is necessary, resulting in unnecessary material waste. Furthermore, the reason for conducting the application of the transparent conductive film composition so that the thickness of the second transparent conductive film following baking is within a range from 0.03 to 0.5 µm is because if the thickness following baking is less than 0.03 µm or greater than 0.5 µm, then a satisfactory improvement in the reflection cannot be obtained.

The reason for specifying a baking temperature within a range from 130 to 400° C. is because at temperatures lower than 130° C., a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. In contrast, if the temperature exceeds 400° C., then any merit associated with conducting the production using a low-temperature process is lost. In other words, the production costs increase, and the productivity tends to decrease. Furthermore, amorphous silicon solar cells, microcrystalline silicon solar cells, and hybrid silicon solar cells that use both these forms of silicon are particularly susceptible to heat, and a high temperature during the baking step causes a deterioration in the conversion efficiency.

The reason for specifying a baking time within a range from 5 to 60 minutes for the substrate having the coatings formed thereon is because if the baking time is less than the lower limit of this range, then a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. Although lengthening the baking time beyond the upper limit of the above range has no adverse effects on the composite film properties, it results in an unnecessary increase in production costs and decrease in productivity. Moreover, the conversion efficiency of the solar cell also tends to deteriorate.

The composite film of the third embodiment of the present invention can be formed in the manner described above. In this manner, by using a wet coating method, the production process according to the third embodiment of the present invention is able to eliminate vacuum processes such as vacuum deposition and sputtering as far as possible, meaning the composite film can be produced comparatively cheaply.

Fourth Embodiment

A substrate thin-film solar cell typically has a structure in which a composite film 414 is provided on top of a substrate 411, and a photovoltaic layer 415 and a first transparent conductive film (the light incident side transparent conductive film) 416 are laminated sequentially on top of the composite film 414. The composite film 414 includes a conductive reflective film 412 formed on the substrate 411 and a second transparent conductive film 413 formed on the conductive reflective film 412.

The fourth embodiment of the present invention relates to a composite film for a substrate solar cell that is composed of the conductive reflective film formed on the substrate of the substrate solar cell and the second transparent conductive film formed on top of this conductive reflective film.

Figure 5:
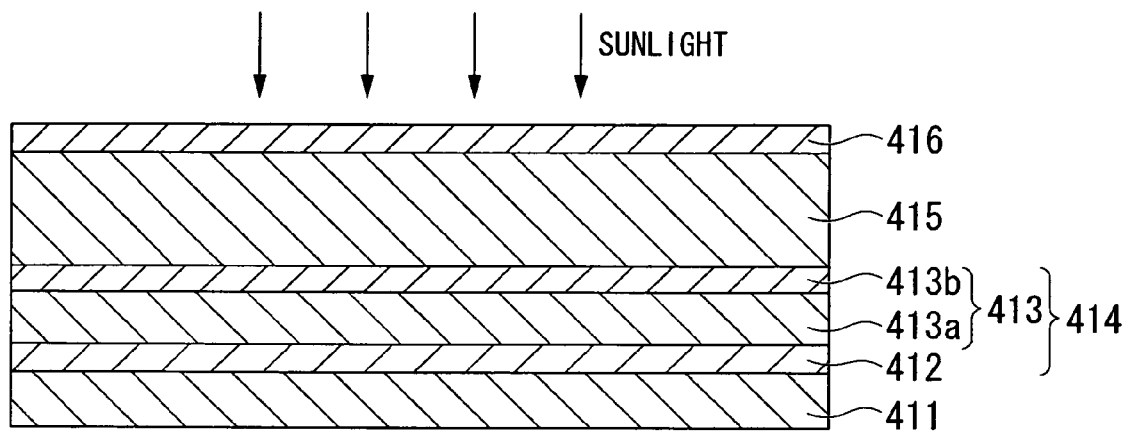
FIG. 5 is a diagram that schematically illustrates a cross-section of a composite film for a substrate solar cell according to a fourth embodiment of the present invention.

FIG. 5 is a diagram that schematically illustrates a cross-section of a composite according to the fourth embodiment of the present invention. As illustrated in FIG. 5, the special features of the structure of the composite film of the fourth embodiment of the present invention are (1) that the conductive reflective film 412 is formed by forming a conductive reflective coating by using a wet coating method to apply a conductive reflective film composition containing metal nanoparticles to the substrate 411, and then baking the conductive reflective coating, (2) that the conductive reflective film 412 has a thickness of 0.05 to 2.0 µm, (3) that the second transparent conductive film 413 is formed by forming a coating of conductive oxide microparticles by using a wet coating method to apply a dispersion of the conductive oxide microparticles to the conductive reflective coating, impregnating the coating of the conductive oxide microparticles with a binder dispersion using a wet coating method, and subsequently performing baking, and (4) that the second transparent conductive film 413 has a thickness of 0.01 to 0.5 µm in a state where the entire surface of a conductive oxide microparticles layer 413a is covered with a binder layer 413b.

In the composite film 414 of the fourth embodiment of the present invention, the conductive reflective film 412 is formed by using a wet coating method to apply a conductive reflective film composition containing metal nanoparticles to the substrate 411. Accordingly, the formed conductive reflective film 412 exhibits favorable film formability and has a high diffuse reflectance.

Furthermore, in the composite film 414 of the fourth embodiment of the present invention, the second transparent conductive film 413 is formed using a wet coating method. If the second transparent conductive film is formed using a vacuum deposition method such as a sputtering method, then the refractive index of the second transparent conductive film is determined by the material used as the target material, and consequently achieving the desired refractive index is problematic for a second transparent conductive film formed using a vacuum deposition method such as sputtering. In contrast, in the case of a second transparent conductive film formed using a wet coating method, because the film is generally formed by applying a composition that is a mixture of conductive oxide microparticles and one or more other components, a film formed using such a wet coating method is capable of realizing the desired low refractive index by appropriate adjustment of the components within the composition. The refractive index of this second transparent conductive film is typically within a range from 1.5 to 2. A second transparent conductive film having a low refractive index imparts an increased reflection effect to the adjoining conductive reflective film in terms of optical design, and therefore a conductive reflective film adjoining a second transparent conductive film formed using a wet coating method exhibits a higher reflectance than that obtainable for a conductive reflective film adjoining a second transparent conductive film having a high refractive index formed using a conventional vacuum deposition method such as sputtering.

One example of a second transparent conductive film formed using a wet coating method is a simple second transparent conductive film formed by applying a composition prepared by combining conductive oxide microparticles and a binder component, and subsequently baking the applied coating. On the other hand, the second transparent conductive film in the composite film according to the fourth embodiment of the present invention is formed by first forming a coating of conductive oxide microparticles containing no binder component on the conductive reflective coating, subsequently applying a binder dispersion containing no conductive oxide microparticles to the layer of the conductive oxide microparticles, and then performing baking at a predetermined temperature. In other words, as illustrated in FIG. 5, the second transparent conductive film of the composite film according to the fourth embodiment of the present invention has the binder layer 413b that contains no conductive oxide microparticles as the upper layer. Further, the lower layer near the interface with the conductive reflective film 412 is composed of the conductive oxide microparticles layer 413a, which is totally covered with the binder layer 413b, and contains a portion of the binder dispersion that impregnates the conductive oxide microparticles layer when the binder dispersion is applied. Upon baking, a portion of the particles within this conductive oxide microparticles layer 413a undergo sintering, thereby ensuring a high degree of conductivity.

In the composite film of the fourth embodiment of the present invention, by forming the second transparent conductive film with the structure described above, the level of adhesion with the underlying conductive reflective film can be improved compared with a composite film having a simple second transparent conductive film formed using a composition containing both the conductive oxide microparticles and a binder component. Furthermore, because the composite film is formed with the entire surface of the conductive oxide microparticles layer covered with the binder layer, change in the film over time is minimal.

In this manner, the composite film according to the fourth embodiment of the present invention yields a very high reflectance, due to an improved reflection effect, in terms of optical design, imparted by the second transparent conductive film of low refractive index formed using a wet coating method, as well as favorable film formability and high diffuse reflectance provided by the conductive reflective film.

Furthermore, the average diameter of holes occurring at the contact surface of the conductive reflective film 412 on the side of the second transparent conductive film 413 is not more than 100 nm, the average depth at which the holes are positioned is not more than 100 nm, and the number density of the holes is not more than 30 holes/$\mu m^2$. When a transparent substrate having a transmittance of at least 98% is used, a conductive reflective film is obtained for which a high diffuse reflectance equivalent to not less than 80% of the theoretical reflectance can be achieved within a wavelength range from 500 to 1,200 nm. This wavelength range from 500 to 1,200 nm encompasses substantially all convertible wavelengths in those cases where a polycrystalline silicon is used for the photovoltaic layer. The reason for specifying an average diameter for the holes of not more than 100 nm is that, generally, a reflectance spectrum exhibits high reflectance at the long wavelength side of the spectrum and lower reflectance at the short wavelength side, and if the average diameter of the holes exceeds 100 nm, then the inflexion point at which the reflectance starts to decrease tends to shift to a longer wavelength, meaning a favorable reflectance may become unobtainable. Furthermore, the reason for specifying an average depth for the holes of not more than 100 nm is that if the average depth of the holes exceeds 100 nm, then the gradient (slope) of the reflectance spectrum tends to increase, meaning a favorable reflectance may be unobtainable. The reason for specifying a number density for the holes of not more than 30 holes/$\mu m^2$ is that if the number density of the holes exceeds 30 holes/$\mu m^2$, then the reflectance at the long wavelength side of the spectrum tends to decrease, meaning a favorable reflectance may be unobtainable.

The average diameter of the holes is preferably within a range from 5 to 100 nm, the average depth at which the holes are positioned is preferably within a range from 5 to 100 nm, and the number density of the holes is preferably within a range from 2 to 30 holes/$\mu m^2$. If the values for the average diameter of the holes, the average depth at which the holes are positioned, and the number density of the holes are less than the lower limits of the above ranges, then during sintering, the elimination of gas generated by decomposition of the organic molecules of the protective agent used to chemically modify the silver nanoparticles may be inadequate, and as a result, there is a possibility that the remaining organic molecule residues may cause reductions in the conductivity and the reflectance of the conductive reflective film.

Furthermore, the conductive reflective film that constitutes part of the composite film contains one or more materials selected from the group consisting of polyvinylpyrrolidones, polyvinylpyrrolidone copolymers and water-soluble celluloses, and this facilitates the setting of the average diameter of holes occurring at the contact surface of the conductive reflective film on the side of the second transparent conductive film to not more than 100 nm, the average depth to not more than 100 nm, and the number density to not more than 30 holes/$\mu m^2$. Furthermore, in the conductive reflective film that constitutes part of the composite film, because the proportion of silver among the metal elements contained within the film is 75% by mass or more, a high reflectance can be achieved. If this proportion is less than 75%, then the reflectance of the conductive reflective film formed using the composition tends to decrease. Furthermore, because the thickness of the conductive reflective film that constitutes part of the composite film is within a range from 0.05 to 2.0 $\mu m$, an electrode surface resistance value of the level required of a solar cell can be obtained. Moreover, of the metal nanoparticles incorporated within the conductive reflective film that constitutes part of the composite film, because particles having a particle size within a range from 10 to 50 nm represent a number average of not less than 70%, favorable conductivity and a high reflectance are obtained.

During the formation of the conductive oxide microparticles layer that constitutes part of the second transparent conductive film, conductive oxide microparticles such as tin oxide powders of ITO (Indium Tin Oxide) and ATO (Antimony Tin Oxide: antimony-doped tin oxide), and zinc oxide powders containing one or more elements selected from the group consisting of Al, Co, Fe, In, Sn and Ti can be used favorably, and of these, ITO, ATO, AZO (Aluminum Zinc Oxide: aluminum-doped zinc oxide), IZO (Indium Zinc Oxide: indium-doped zinc oxide) and TZO (Tin Zinc Oxide: tin-doped zinc oxide) are particularly desirable. In terms of ensuring satisfactory conductivity and favorable film formability, the average particle size of the conductive oxide microparticles is preferably within a range from 2 to 100 nm, and more preferably from 5 to 50 nm.

The conductive oxide microparticles layer is formed by preparing a dispersion containing the conductive oxide microparticles dispersed within a dispersion medium, and then using a wet coating method to apply this dispersion. Examples of the dispersion medium include not only water, but also alcohols such as methanol, ethanol, isopropyl alcohol and butanol, ketones such as acetone, methyl ethyl ketone, cyclohexanone and isophorone, hydrocarbons such as toluene, xylene, hexane and cyclohexane, amides such as N,N-dimethylformamide and N,N-dimethylacetamide, sulfoxides such as dimethylsulfoxide, glycols such as ethylene glycol, and glycol ethers such as ethyl cellosolve. In order to obtain favorable film formability, the proportion of the dispersion medium within the dispersion is preferably within a range from 50 to 99.99% by mass. The proportion of the conductive oxide microparticles within the dispersion is preferably within a range from 0.01 to 50% by mass. The reason for specifying a proportion of conductive oxide microparticles that satisfies the above range is because at proportions less than the lower limit of the above range, forming a uniform film becomes difficult, whereas if the proportion exceeds the above upper limit, forming a conductive reflective film having a thickness of not more than 100 nm becomes problematic.

A coupling agent is preferably added to the dispersion of the conductive oxide microparticles depending on the other components used. This coupling agent has the functions of improving the bonding between the conductive microparticles and the binder, and improving the adhesion between the second transparent conductive film and the conductive reflective film or the photovoltaic layer. Examples of the coupling agent include silane coupling agents, aluminum coupling agents and titanium coupling agents.

Examples of the silane coupling agents include vinyltriethoxysilane, γ-glycidoxypropyltrimethoxysilane, and γ-methacryloxypropyltrimethoxysilane. Examples of the aluminum coupling agents include the aluminum coupling agent containing acetoalkoxy groups illustrated below in formula (16). Furthermore, examples of the titanium coupling agents include the titanium coupling agents having dialkyl pyrophosphite groups illustrated below in formulas (17) to (19), and the titanium coupling agent having a dialkyl phosphite group illustrated below in formula (20).

[Chemical Formula 16]

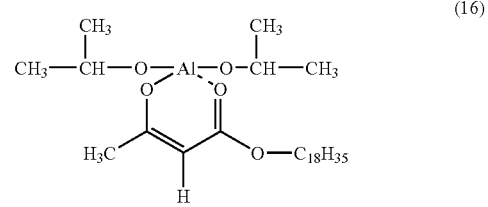

(16)

[Chemical Formula 17]

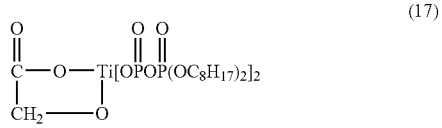

(17)

[Chemical Formula 18]

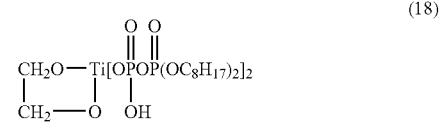

(18)

[Chemical Formula 19]

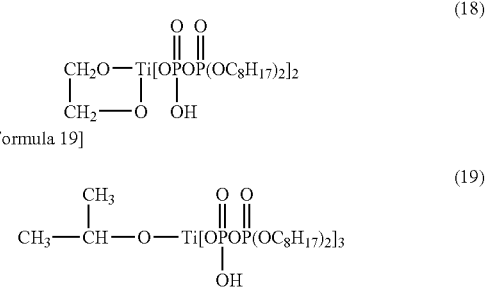

(19)

[Chemical Formula 20]

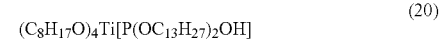

(20)

The binder dispersion includes, as a binder component, either one or both of a polymeric binder and a non-polymeric binder that cure upon heating. Examples of the polymeric binder include acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers. Furthermore, the polymeric binder preferably includes one or more metal soaps, metal complexes or metal alkoxide hydrolysates of aluminum, silicon, titanium, chromium, manganese, iron, cobalt, nickel, silver, copper, zinc, molybdenum or tin. Examples of the non-polymeric binder include metal soaps, metal complexes, metal alkoxides, halosilanes, 2-alkoxyethanols, β-diketones and alkyl acetates. Further, the metal contained within the metal soap, metal complex or metal alkoxide is typically aluminum, silicon, titanium, chromium, manganese, iron, cobalt, nickel, silver, copper, zinc, molybdenum, tin, indium or antimony. These polymeric binders and non-polymeric binders cure upon heating, making it possible to form a second transparent conductive film having a low haze and low volume resistivity at low temperature. The amount of these binders within the binder dispersion is preferably within a range from 0.01 to 50% by mass, and is more preferably within a range from 0.5 to 20% by mass.

During preparation of the binder dispersion, it is preferable to use the same dispersion medium as that used in preparing the dispersion used for forming the conductive oxide microparticles layer. In order to ensure formation of a uniform film, the amount of the dispersion medium is preferably within a range from 50 to 99.99% by mass.

Furthermore, depending on the components used, the addition of a resistance reducer or a water-soluble cellulose derivative or the like may also be preferable. The resistance reducer is preferably one or more materials selected from the group consisting of mineral acid salts and organic acid salts of cobalt, iron, indium, nickel, lead, tin, titanium and zinc. Specific examples include a mixture of nickel acetate and ferric chloride, a mixture of zinc naphthenate, tin octylate and antimony chloride, a mixture of indium nitrate and lead acetate, and a mixture of titanium acetylacetate and cobalt octylate. The amount of these resistance reducers is preferably 0.1 to 10% by mass. Addition of a water-soluble cellulose derivative improves the transparency of the formed second transparent conductive film. Specific examples of the water-soluble cellulose derivative include hydroxypropylcellulose and hydroxypropylmethylcellulose. The amount added of the water-soluble cellulose derivative is preferably within a range from 0.1 to 10% by mass.

The conductive reflective film composition used in forming the conductive reflective film of the fourth embodiment of the present invention is a composition composed of metal nanoparticles dispersed within a dispersion medium. The metal nanoparticles typically include at least 75% by mass, and preferably 80% by mass or more of silver nanoparticles. The reason for specifying an amount of silver nanoparticles of at least 75% by mass relative to 100% by mass of all the metal nanoparticles is because at an amount less than 75% by mass, the reflectance of the conductive reflective film formed using this composition tends to decrease. Furthermore, the silver nanoparticles are chemically modified with a protective agent having an organic molecular main chain with a carbon skeleton containing 1 to 3 carbon atoms.

The reason for restricting the number of carbon atoms within the carbon skeleton of the organic molecular main chain of the protective agent used for chemically modifying the metal nanoparticles to a number within a range from 1 to 3 is because if the number of carbon atoms is 4 or greater, then the protective agent becomes difficult to eliminate or decompose (detach and combust) under the heat used during the baking process, meaning a large amount of organic residue tends to remain within the film, which subsequently degenerates or degrades, causing reductions in the conductivity and reflectance of the conductive reflective film.

The silver nanoparticles include a number average of not less than 70%, and preferably not less than 75%, of silver nanoparticles having a primary particle size within a range from 10 to 50 nm. The reason for ensuring that the amount of metal nanoparticles having a primary particle size within a range from 10 to 50 nm is a number average of not less than 70% relative to 100% of all the metal nanoparticles is because if this number average is less than 70%, then the specific surface area of the metal nanoparticles increases and the proportion of the particles composed of organic matter increases, meaning that even if the organic molecules are readily eliminated or decomposed (detached and combusted) under the heat used during baking, because the amount of organic molecules is large, a large amount of organic residue tends to remain within the film, and this residue may subsequently degenerate or degrade, causing reductions in the conductivity and reflectance of the conductive reflective film, or the particle size distribution of the metal nanoparticles may broaden considerably, making the density of the conductive reflective film prone to a reduction that causes a deterioration in the conductivity and reflectance of the conductive reflective film. Moreover, another reason for specifying a primary particle size for the metal nanoparticles of 10 to 50 nm is that statistical analyses reveal that metal nanoparticles having a primary particle size within a range from 10 to 50 nm correlate with improved stability over time.

The metal nanoparticles other than the silver nanoparticles are metal nanoparticles formed from one metal, or a mixed composition or alloy composition containing two or more metals, selected from the group consisting of gold, platinum, palladium, ruthenium, nickel, copper, tin, indium, zinc, iron, chromium and manganese, and the amount of these metal nanoparticles other than the silver nanoparticles, relative to 100% by mass of all the metal nanoparticles, is at least 0.02% by mass but less than 25% by mass, and preferably within a range from 0.03 to 20% by mass. The reason for restricting the amount of the metal nanoparticles other than silver nanoparticles to at least 0.02% by mass but less than 25% by mass relative to 100% by mass of all the metal nanoparticles is because if the amount is less than 0.02% by mass, then although no particular problems arise, amounts within the range from 0.02 to 25% by mass still produce results for the conductivity and reflectance of the conductive reflective film following a weather resistance test (a test that involves standing for 1,000 hours in a constant temperature and humidity chamber at a temperature of 100° C. and a humidity of 50%) that display no deterioration from the results prior to the weather resistance test, whereas on the other hand, if the amount is 25% by mass or greater, then the conductivity and reflectance of the conductive reflective film immediately following baking tend to decrease, and the conductivity and reflectance of the conductive reflective film following a weather resistance test tend to be inferior to the conductivity and reflectance of the conductive reflective film prior to the weather resistance test.

Furthermore, the conductive reflective film composition includes one or more additives selected from the group consisting of organic polymers, metal oxides, metal hydroxides, organometallic compounds and silicone oils. A metal oxide, metal hydroxide, organometallic compound or silicone oil incorporated within the composition as an additive improves the adhesion to the second transparent conductive film with no loss of conductivity, either due to chemical bonding or an anchoring effect relative to the second transparent conductive film, or due to an improvement in the wettability between the metal nanoparticles and the second transparent conductive film during the baking step.

If the conductive reflective film is formed using a composition that contains none of the above metal oxides and the like, then the surface roughness of the formed conductive reflective film increases, but in order to optimize the photovoltaic conversion efficiency, specific conditions must be satisfied for the uneven shape of the surface of the conductive reflective film, and simply increasing the surface roughness does not necessarily enable the formation of a conductive reflective film surface having superior photovoltaic conversion efficiency. By appropriate adjustment of the variety and concentration and the like of the metal oxide, as described for the fourth embodiment of the present invention, a surface having a surface roughness that optimizes the photovoltaic conversion efficiency can be formed.

The amount of the additives is typically within a range from 0.1 to 20%, and preferably from 0.2 to 10%, of the mass of the silver nanoparticles within the metal nanoparticles. If the amount of these additives is less than 0.1%, then there is a possibility that holes having a large average diameter may be generated, and the density of the holes may increase. An amount of the additives exceeding 20% tends to exert an adverse effect on the conductivity of the formed conductive reflective film, and may result in a volume resistivity exceeding $2 \times 10^{-5}$ Ω·cm.

As the organic polymer used as an additive, one or more polymers selected from the group consisting of polyvinylpyrrolidone (hereafter also abbreviated as PVP), PVP copolymers and water-soluble celluloses are used. Specific examples of the PVP copolymers include PVP-methacrylate copolymers, PVP-styrene copolymers and PVP-vinyl acetate copolymers. Further, examples of the water-soluble celluloses include cellulose ethers such as hydroxypropylmethylcellulose, methylcellulose and hydroxyethylmethylcellulose.

Examples of the metal oxide used as an additive include oxides or composite oxides containing at least one metal selected from the group consisting of aluminum, silicon, titanium, chromium, manganese, iron, cobalt, nickel, silver, copper, zinc, molybdenum, tin, indium and antimony. Specific examples of the composite oxides include ITO, ATO and IZO.

Examples of the metal hydroxide used as an additive include hydroxides containing at least one metal selected from the group consisting of aluminum, silicon, titanium, chromium, manganese, iron, cobalt, nickel, silver, copper, zinc, molybdenum, tin, indium and antimony.

Examples of the organometallic compound used as an additive include metal soaps, metal complexes and metal alkoxides of at least one metal selected from the group consisting of silicon, titanium, aluminum, antimony, indium, chromium, manganese, iron, cobalt, nickel, silver, copper, zinc, molybdenum and tin. Examples of the metal soaps include chromium acetate, manganese formate, iron citrate, cobalt formate, nickel acetate, silver citrate, copper acetate, copper citrate, tin acetate, zinc acetate, zinc oxalate and molybdenum acetate. Furthermore, examples of the metal complexes include a zinc acetylacetonate complex, chromium acetylacetonate complex and nickel acetylacetonate complex. Examples of the metal alkoxides include titanium isopropoxide, methyl silicate, isocyanatopropyltrimethoxysilane and aminopropyltrimethoxysilane.

Examples of the silicone oil used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the fourth embodiment of the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The dispersion medium used in forming the conductive reflective film composition is preferably composed of an alcohol or an alcohol-containing aqueous solution. Examples of alcohols that may be used as the dispersion medium include one or more alcohols selected from the group consisting of methanol, ethanol, propanol, butanol, ethylene glycol, propylene glycol, diethylene glycol, glycerol, isobornylhexanol and erythritol. The alcohol-containing aqueous solution preferably contains, relative to 100% by mass of the entire dispersion medium, not less than 1% by mass, and preferably 2% by mass or more of water, and not less than 2% by mass, and preferably 3% by mass or more of an alcohol. For example, in those cases where the dispersion medium is composed solely of water and an alcohol, if the medium contains 2% by mass of water, then the alcohol content is 98% by mass, whereas if the medium contains 2% by mass of the alcohol, then the water content is 98% by mass. The reason for specifying a water content of not less than 1% by mass relative to 100% by mass of the entire dispersion medium is because if the water content is less than 1% by mass, then the film obtained by using a wet coating method to apply the conductive reflective film composition tends to be difficult to sinter at low temperatures, and the conductivity and reflectance of the film following baking tend to deteriorate. The reason for specifying an alcohol content of not less than 2% by mass relative to 100% by mass of the entire dispersion medium is because if the alcohol content is less than 2% by mass, then in a similar manner to that described above, the film obtained by using a wet coating method to apply the composition tends to be difficult to sinter at low temperatures, and the conductivity and reflectance of the film following baking tend to deteriorate.

Moreover, the dispersion medium, namely the protective molecules that chemically modify the surface of the metal nanoparticles, preferably contains one or both of a hydroxyl group (—OH) and a carbonyl group (—C=O). If a hydroxyl group (—OH) is incorporated within the protective agent that chemically modifies the metal nanoparticles such as the silver nanoparticles, then the composition exhibits excellent dispersion stability, and even low-temperature sintering of the coating yields an effective action. If a carbonyl group (—C=O) is incorporated within the protective agent that chemically modifies the metal nanoparticles such as the silver nanoparticles, then in a similar manner to that described above, the composition exhibits excellent dispersion stability, and even low-temperature sintering of the coating yields an effective action.

Examples of the method used for producing the conductive reflective film composition include the methods outlined below.

(a) The case where the number of carbon atoms within the carbon skeleton of the organic molecular main chain of the protective agent used for chemically modifying the silver nanoparticles is set to 3

Firstly, silver nitrate is dissolved in water such as deionized water to prepare a metal salt aqueous solution. In a separate preparation, sodium citrate is dissolved in water such as deionized water to prepare an aqueous solution of sodium citrate having a concentration of 10 to 40%, and ferrous sulfate in a particulate or powder form is then added directly to, and dissolved in, the sodium citrate aqueous solution under a stream of an inert gas such as nitrogen gas, thus preparing a reducing agent aqueous solution containing a 3:2 molar ratio of citrate ions and ferrous ions. Subsequently, with the reducing agent aqueous solution undergoing constant stirring under a stream of the above inert gas, the metal salt aqueous solution described above is added dropwise to the reducing agent aqueous solution and mixed thoroughly. During this process, it is preferable that the concentrations of the solutions are altered so that the amount added of the metal salt aqueous solution is not more than 1/10th of the amount of the reducing agent aqueous solution, as this ensures that the reaction temperature can be maintained within a range from 30 to 60° C. even if the added metal salt aqueous solution is at room temperature. Further, the mixing ratio between the two aqueous solutions is preferably adjusted so that the equivalent amount of ferrous ions added as the reducing agent is three times the equivalent amount of the metal ions, in other words, (number of mols of metal ions within the metal salt aqueous solution)×(valency of metal ions)=3×(ferrous ions within the reducing agent aqueous solution). Following completion of the dropwise addition of the metal salt aqueous solution, stirring of the resulting mixed liquid is continued for a further 10 to 300 minutes, thus forming a dispersion composed of a metal colloid. This dispersion is left to stand at room temperature, the precipitated metal nanoparticle aggregates are isolated by decantation and/or centrifugal separation and the like, water such as deionized water is added to the isolated nanoparticle aggregates to form a dispersion, a demineralization treatment is conducted using ultrafiltration, and displacement washing is then performed using an alcohol, so as to achieve a metal (silver) content within a range from 2.5 to 50% by mass. Subsequently, by separating the very coarse particles using a centrifugal separator with appropriate adjustment of the centrifugal power, silver nanoparticles are prepared in which those particles having a primary particle size within a range from 10 to 50 nm represent a number average of not less than 70%. In other words, the silver nanoparticles are prepared such that relative to 100% of all the silver nanoparticles, the proportion of silver nanoparticles having a primary particle size within a range from 10 to 50 nm represents a number average of not less than 70%. By using this method, a dispersion is obtained in which the number of carbon atoms within the carbon skeleton of the organic molecular main chain of the protective agent chemically modifying the silver nanoparticles is 3.

Subsequently, the resulting dispersion is adjusted so that the final metal content (silver content) relative to 100% by mass of the dispersion is within a range from 2.5 to 95% by mass. Further, in those cases where the dispersion medium is an alcohol-containing aqueous solution, the amounts of the water and the alcohol within the medium are preferably adjusted to amounts of not less than 1% and not less than 2% respectively. Furthermore, in those cases where further additives are included within the composition, one or more additives selected from the group consisting of organic polymers, metal oxides, metal hydroxides, organometallic compounds and silicone oils are added in the desired proportions. The amount of these additives is adjusted so as to satisfy a range from 0.1 to 20% by mass relative to 100% by mass of the obtained composition. This enables a composition to be obtained in which silver nanoparticles, which have been chemically modified with a protective agent having an organic molecular main chain in which the number of carbon atoms within the carbon skeleton is 3, are dispersed within the dispersion medium.

(b) The case where the number of carbon atoms within the carbon skeleton of the organic molecular main chain of the protective agent used for chemically modifying the silver nanoparticles is set to 2

With the exception of replacing the sodium citrate used when preparing the reducing agent aqueous solution with sodium malate, a dispersion is prepared in the same manner as (a) above. This enables a dispersion to be obtained in which the number of carbon atoms within the carbon skeleton of the organic molecular main chain that chemically modifies the silver nanoparticles is 2.

(c) The case where the number of carbon atoms within the carbon skeleton of the organic molecular main chain of the protective agent used for chemically modifying the silver nanoparticles is set to 1

With the exception of replacing the sodium citrate used when preparing the reducing agent aqueous solution with sodium glycolate, a dispersion is prepared in the same manner as (a) above. This enables a dispersion to be obtained in which the number of carbon atoms within the carbon skeleton of the organic molecular main chain that chemically modifies the silver nanoparticles is 1.

(d) The case where the number of carbon atoms within the carbon skeleton of the organic molecular main chain of the protective agent used for chemically modifying metal nanoparticles other than silver nanoparticles is set to 3

Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used when preparing the metal salt aqueous solution with chlorauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate, a dispersion is prepared in the same manner as (a) above. This enables a dispersion to be obtained in which the number of carbon atoms within the carbon skeleton of the organic molecular main chain of the protective agent that chemically modifies the metal nanoparticles other than silver nanoparticles is 3.

In those cases where the number of carbon atoms within the carbon skeleton of the organic molecular main chain of the protective agent used for chemically modifying metal nanoparticles other than silver nanoparticles is set to either 1 or 2, a dispersion is prepared in the same manner as either (b) or (c) above, with the exception of replacing the silver nitrate used when preparing the metal salt aqueous solution with one of the other metal salts listed above. This enables a dispersion to be obtained in which the number of carbon atoms within the carbon skeleton of the organic molecular main chain of the protective agent that chemically modifies the metal nanoparticles other than silver nanoparticles is either 1 or 2.

In those cases where silver nanoparticles and metal nanoparticles other than silver nanoparticles are combined as the metal nanoparticles, then for example, if the dispersion containing silver nanoparticles produced using the above method (a) is deemed the first dispersion, and the dispersion containing metal nanoparticles other than silver nanoparticles produced using the above method (d) is deemed the second dispersion, a dispersion may be prepared by mixing at least 75% by mass of the first dispersion and less than 25% by mass of the second dispersion so that the combination of the first and second dispersions totals 100% by mass. The first dispersion is not restricted to a dispersion containing silver nanoparticles produced using the above method (a), and a dispersion containing silver nanoparticles produced using the above method (b) or a dispersion containing silver nanoparticles produced using the above method (c) may also be used.

Next is a description of a method for producing a composite film according to the fourth embodiment of the present invention.

In the production process according to the fourth embodiment of the present invention, first, a wet coating method is used to apply the above conductive reflective film composition to the substrate 411. This application is conducted so that the thickness following baking is within a range from 0.05 to 2.0 µm, and preferably from 0.1 to 1.5 µm. The applied coating is then dried at a temperature of 20 to 120° C., and preferably 25 to 60° C., for a period of 1 to 30 minutes, and preferably 2 to 10 minutes. This completes the formation of a conductive reflective coating. Next, the substrate 411 having the conductive reflective coating formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes, thereby forming the conductive reflective film 412.

Figure 6:
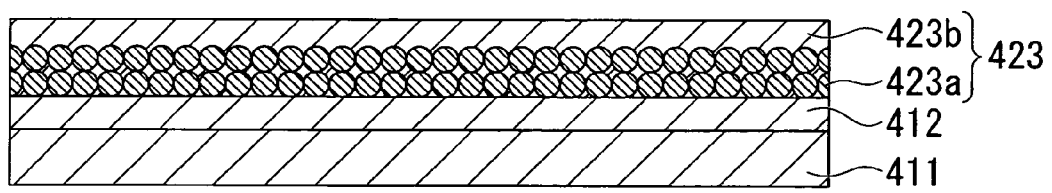
FIG. 6 is a diagram that schematically illustrates a cross-section of a transparent conductive coating formed during production of the composite film for a substrate solar cell according to the fourth embodiment of the present invention.

Subsequently, as illustrated in FIG. 6, a conductive oxide microparticles coating 423a is formed by using a wet coating method to apply the aforementioned dispersion, prepared by dispersing conductive oxide microparticles in a dispersion medium, to the conductive reflective film 412. This coating 423a is then dried at a temperature of 20 to 120° C., and preferably 25 to 60° C., for a period of 1 to 30 minutes, and preferably 2 to 10 minutes. Next, the conductive oxide microparticles coating 423a is impregnated with the aforementioned binder dispersion using a wet coating method, with the application conducted so that the entire surface of the conductive oxide microparticles coating 423a is covered with a binder dispersion coating 423b. Furthermore, the application is preferably conducted so that the mass of the binder component within the applied binder dispersion, relative to the total mass of microparticles contained within the applied conductive oxide microparticles coating, is a mass ratio (mass of binder component within applied binder dispersion/mass of conductive oxide microparticles) within a range from 0.5 to 10. If this mass ratio is less than the lower limit of the above range, then obtaining satisfactory adhesion is difficult, whereas if the mass ratio exceeds the upper limit of the range, then the surface resistance is likely to increase. This mass ratio is most preferably within a range from 0.5 to 3. The coating is dried at a temperature of 20 to 120° C., and preferably 25 to 60° C., for a period of 1 to 30 minutes, and preferably 2 to 10 minutes. Application of the above conductive oxide microparticles dispersion and the binder dispersion is conducted so that the thickness of the formed second transparent conductive film following baking is within a range from 0.01 to 0.5 µm, and preferably from 0.03 to 0.1 µm. In this manner, a transparent conductive coating 423 composed of the conductive oxide microparticles coating 423a and the binder dispersion coating 423b is formed. Subsequently, the substrate 411 having the transparent conductive coating 423 formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes, thereby forming the second conductive reflective film.

The wet coating method is preferably one of a spray coating method, dispenser coating method, spin coating method, knife coating method, slit coating method, inkjet coating method, screen printing method, offset printing method or die coating method, although this list is not exhaustive, and any appropriate method may be used.

Spray coating is a method in which either the dispersion is converted to a fine mist using compressed air and then applied to the substrate, or the dispersion itself is pressurized and converted to a fine mist that is then applied to the substrate. Dispenser coating is a method in which, for example, the dispersion is placed inside an injector, and the dispersion is then discharged from a fine nozzle at the tip of the injector and applied to the substrate by depressing the injector piston. Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife while the substrate is moved horizontally in the downstream direction. Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing. Screen printing is a method in which a gauze is used as a patterning material, and the dispersion is transferred to the substrate through a print image formed on the gauze. Offset printing is a printing method that utilizes the water repellency of ink, wherein the dispersion applied to a plate is not adhered directly to the substrate, but is rather first transferred from the plate to a rubber sheet, before being subsequently transferred from the rubber sheet to the substrate. Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

The reason for conducting the application of the conductive reflective film composition so that the thickness of the conductive reflective film following baking is within a range from 0.05 to 2.0 µm is because if the thickness is less than 0.05 µm, then the surface resistance value becomes overly high, making it difficult to obtain the level of conductivity required of a solar cell electrode, whereas if the thickness exceeds 2.0 µm, then although there are no concerns in terms of the resulting properties, the amount of material used is more than is necessary, resulting in unnecessary material waste. Furthermore, the reason for conducting the application of the dispersion of the conductive oxide microparticles and the binder dispersion so that the thickness of the second transparent conductive film following baking is within a range from 0.01 to 0.5 is because if the thickness following baking is less than 0.01 µm, then formation of a uniform film becomes difficult, whereas if the thickness exceeds 0.5 µm, then the amount of material used is more than is necessary, resulting in unnecessary material waste.

The reason for specifying a baking temperature within a range from 130 to 400° C. is because at temperatures lower than 130° C., a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. In contrast, if the temperature exceeds 400° C., then any merit associated with conducting the production using a low-temperature process is lost. In other words, the production costs increase, and the productivity tends to decrease. Furthermore, amorphous silicon solar cells, microcrystalline silicon solar cells, and hybrid silicon solar cells that use both these forms of silicon are particularly susceptible to heat, and a high temperature during the baking step causes a deterioration in the conversion efficiency.

The reason for specifying a baking time within a range from 5 to 60 minutes for the substrate having the coatings formed thereon is because if the baking time is less than the lower limit of this range, then a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. Although lengthening the baking time beyond the upper limit of the above range has no adverse effects on the composite film properties, it results in an unnecessary increase in production costs and decrease in productivity. Moreover, the conversion efficiency of the solar cell also tends to deteriorate.

The composite film of the fourth embodiment of the present invention can be formed in the manner described above. In this manner, by using a wet coating method, the production process according to the fourth embodiment of the present invention is able to eliminate vacuum processes such as vacuum deposition and sputtering as far as possible, meaning the composite film can be produced comparatively cheaply.

Fifth Embodiment

A superstrate thin-film solar cell typically has a structure in which a first transparent conductive film (the light incident side transparent conductive film) and a photovoltaic layer are laminated sequentially on top of a substrate, a second transparent conductive film is formed on top of the photovoltaic layer, and a conductive reflective film is then formed on top of the second transparent conductive film.

The fifth embodiment of the present invention relates to a composite film for a superstrate solar cell that has a second transparent conductive film formed on a photovoltaic layer of the superstrate solar cell, and a conductive reflective film formed on top of the second transparent conductive film.

Figure 7:
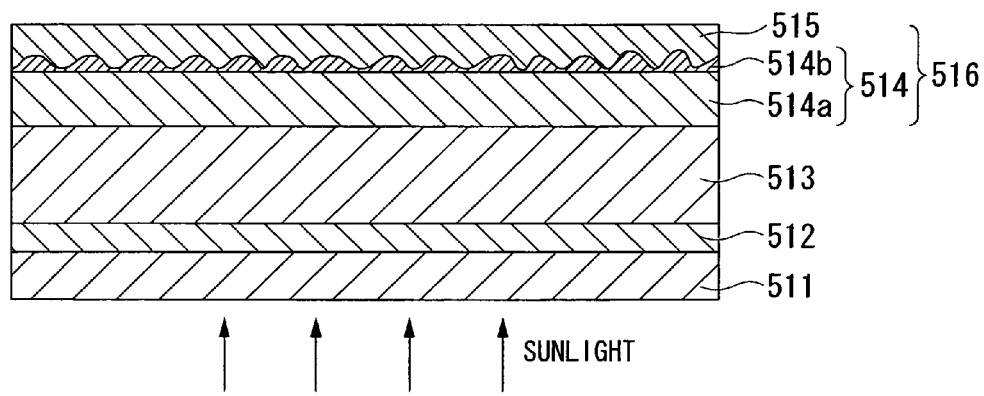
FIG. 7 is a diagram that schematically illustrates a cross-section of a composite film for a superstrate solar cell according to a fifth embodiment of the present invention.

FIG. 7 is a diagram that schematically illustrates a cross-section of a composite film 516 according to a fifth embodiment of the present invention. As illustrated in FIG. 7, the special features of the structure of the composite film of the fifth embodiment of the present invention are (1) that a second transparent conductive film 514 is formed by forming a coating of conductive oxide microparticles by using a wet coating method to apply a dispersion of the conductive oxide microparticles to a photovoltaic layer 513, impregnating the coating of the conductive oxide microparticles with a binder dispersion using a wet coating method, and subsequently performing baking, and (2) that the second transparent conductive film 514 has a first layer 514a containing a binder component on top of the photovoltaic layer 513, and a second layer 514b containing no binder component in which 1 to 30% of the volume of the first layer 514a protrudes from the first layer 514a.

If the second transparent conductive film is formed using a vacuum deposition method such as a sputtering method, then the refractive index of the second transparent conductive film is determined by the material used as the target material, and consequently achieving the desired refractive index is problematic for a second transparent conductive film formed using a vacuum deposition method such as sputtering. In contrast, in the case of a second transparent conductive film formed using a wet coating method, because the film is generally formed by applying a composition that is a mixture of conductive oxide microparticles and one or more other components, a film formed using such a wet coating method is capable of realizing the desired low refractive index by appropriate adjustment of the components within the composition. The refractive index of this second transparent conductive film is typically within a range from 1.5 to 2. A second transparent conductive film having a low refractive index imparts an increased reflection effect to the adjoining conductive reflective film in terms of optical design, and therefore a conductive reflective film adjoining a second transparent conductive film formed using a wet coating method exhibits a higher reflectance than that obtainable for a conductive reflective film adjoining a second transparent conductive film having a high refractive index formed using a conventional vacuum deposition method such as sputtering.

One example of a second transparent conductive film formed using a wet coating method is a simple second transparent conductive film formed by applying a composition prepared by combining conductive oxide microparticles and a binder component, and subsequently baking the applied coating. On the other hand, the second transparent conductive film in the composite film according to the fifth embodiment of the present invention is formed by first forming a coating of conductive oxide microparticles containing no binder component on the photovoltaic layer, and then impregnating this coating of conductive oxide microparticles with a binder dispersion containing no conductive oxide microparticles, so that the subsequent baking is performed with a portion of the coating of the conductive oxide microparticles protruding from the applied binder dispersion. In other words, as illustrated in FIG. 7, in the second transparent conductive film 514 within the composite film according to the fifth embodiment of the present invention, the lower layer is formed from the first layer 514a, which is a conductive oxide microparticles layer containing a binder component, and the upper layer is formed from the second layer 514b, which is a conductive oxide microparticles layer containing no binder component that protrudes from the binder dispersion.

In the composite film according to the fifth embodiment of the present invention, the second transparent conductive film has the structure described above, and therefore compared with a composite film having a simple second transparent conductive film that is formed by applying and then baking a composition containing both conductive oxide microparticles and a binder component, the fill factor, which is one of the factors that determines the conversion efficiency when producing a solar cell, tends to increase. The reason for specifying that the second layer 514b is 1 to 30% of the volume of the first layer 514a is because a value within this range yields favorable adhesion and a high fill factor. If this value is less than the lower limit of the above range, then the fill factor tends to decrease, whereas if the value exceeds the upper limit of the range, then the adhesion tends to deteriorate.

The thickness of the second transparent conductive film 514 is within a range from 0.01 to 0.5 µm, and the thickness of the conductive reflective film 515 is within a range from 0.05 to 2.0 µm. If the thickness of the second transparent conductive film is less than the lower limit of the above range, then the short-circuit current of the solar cell decreases, whereas if the thickness exceeds the upper limit of the above range, then the fill factor deteriorates dramatically. The thickness of the second transparent conductive film is preferably within a range from 0.05 to 0.1 µm. If the thickness of the conductive reflective film is less than the lower limit of the above range, then the short-circuit current of the solar cell decreases, whereas if the thickness exceeds the upper limit of the above range, then the amount of material used is more than is necessary, resulting in unnecessary material waste.

Furthermore, the conductive reflective film 515 is formed by using a wet coating method to apply a conductive reflective film composition containing metal nanoparticles to the second transparent conductive film 514. Accordingly, the formed conductive reflective film exhibits favorable film formability and has a high diffuse reflectance. When a film is formed on a substrate of glass or the like, favorable film formability and a high diffuse reflectance can be achieved even when film formation is conducted using a vacuum deposition method such as a sputtering method, but if a vacuum deposition method such as sputtering is used to form a film on top of a second transparent conductive film that has been formed using a wet coating method, then the residual solvent within the second transparent conductive film tends to exert adverse effects on the formed conductive reflective film, meaning forming a conductive reflective film with a high reflectance is difficult.

In this manner, the composite film according to the fifth embodiment of the present invention yields a very high reflectance, due to an improved reflection effect, in terms of optical design, imparted by the second transparent conductive film of low refractive index formed using a wet coating method, as well as favorable film formability and high diffuse reflectance provided by the conductive reflective film.

Moreover, the average diameter of holes occurring at the contact surface of the conductive reflective film 515 on the side of the photovoltaic layer 513 is not more than 100 nm, the average depth at which the holes are positioned is not more than 100 nm, and the number density of the holes is not more than 30 holes/µm². When a transparent substrate having a transmittance of at least 98% is used, a conductive reflective film is obtained for which a high diffuse reflectance equivalent to not less than 80% of the theoretical reflectance can be achieved within a wavelength range from 500 to 1,200 nm. This wavelength range from 500 to 1,200 nm encompasses substantially all convertible wavelengths in those cases where a polycrystalline silicon is used for the photovoltaic layer. The reason for specifying an average diameter for the holes of not more than 100 nm is that, generally, a reflectance spectrum exhibits high reflectance at the long wavelength side of the spectrum and lower reflectance at the short wavelength side, and if the average diameter of the holes exceeds 100 nm, then the inflexion point at which the reflectance starts to decrease tends to shift to a longer wavelength, meaning a favorable reflectance may become unobtainable. Furthermore, the reason for specifying an average depth for the holes of not more than 100 nm is that if the average depth of the holes exceeds 100 nm, then the gradient (slope) of the reflectance spectrum tends to increase, meaning a favorable reflectance may be unobtainable. The reason for specifying a number density for the holes of not more than 30 holes/µm² is that if the number density of the holes exceeds 30 holes/µm², then the reflectance at the long wavelength side of the spectrum tends to decrease, meaning a favorable reflectance may be unobtainable.

The average diameter of the holes is preferably within a range from 5 to 100 nm, the average depth at which the holes are positioned is preferably within a range from 5 to 100 nm, and the number density of the holes is preferably within a range from 2 to 30 holes/µm². If the values for the average diameter of the holes, the average depth at which the holes are positioned, and the number density of the holes are less than the lower limits of the above ranges, then during sintering, the elimination of gas generated by decomposition of the organic molecules of the protective agent used to chemically modify the silver nanoparticles may be inadequate, and as a result, there is a possibility that the remaining organic molecule residues may cause reductions in the conductivity and the reflectance of the conductive reflective film.

Furthermore, the conductive reflective film that constitutes part of the composite film contains one or more materials selected from the group consisting of polyvinylpyrrolidones, polyvinylpyrrolidone copolymers and water-soluble celluloses, and this facilitates the setting of the average diameter of holes occurring at the contact surface of the conductive reflective film on the side of the second transparent conductive film to not more than 100 nm, the average depth to not more than 100 nm, and the number density to not more than 30 holes/µm². Furthermore, in the conductive reflective film that constitutes part of the composite film, because the proportion of silver among the metal elements contained within the film is 75% by mass or more, a high reflectance can be achieved. If this proportion is less than 75%, then the reflectance of the conductive reflective film formed using the composition tends to decrease. Furthermore, because the thickness of the conductive reflective film that constitutes part of the composite film is within a range from 0.05 to 2.0 µm, an electrode surface resistance value of the level required of a solar cell can be obtained. Moreover, of the metal nanoparticles incorporated within the conductive reflective film that constitutes part of the composite film, because particles having a particle size within a range from 10 to 50 nm represent a number average of not less than 70%, favorable conductivity and a high reflectance are obtained.

During the formation of the second transparent conductive film, conductive oxide microparticles such as tin oxide powders of ITO (Indium Tin Oxide) and ATO (Antimony Tin Oxide: antimony-doped tin oxide), and zinc oxide powders containing one or more elements selected from the group consisting of Al, Co, Fe, In, Sn and Ti can be used favorably, and of these, ITO, ATO, AZO (Aluminum Zinc Oxide: aluminum-doped zinc oxide), IZO (Indium Zinc Oxide: indium-doped zinc oxide) and TZO (Tin Zinc Oxide: tin-doped zinc oxide) are particularly desirable. In terms of ensuring satisfactory conductivity and favorable film formability, the average particle size of the conductive oxide microparticles is preferably within a range from 2 to 100 nm, and more preferably from 5 to 50 nm.

The coating of the conductive oxide microparticles is formed by preparing a dispersion containing the conductive oxide microparticles dispersed within a dispersion medium, and then using a wet coating method to apply this dispersion. Examples of the dispersion medium include not only water, but also alcohols such as methanol, ethanol, isopropyl alcohol and butanol, ketones such as acetone, methyl ethyl ketone, cyclohexanone and isophorone, hydrocarbons such as toluene, xylene, hexane and cyclohexane, amides such as N,N-dimethylformamide and N,N-dimethylacetamide, sulfoxides such as dimethylsulfoxide, glycols such as ethylene glycol, and glycol ethers such as ethyl cellosolve. In order to obtain favorable film formability, the proportion of the dispersion medium within the dispersion is preferably within a range from 50 to 99.99% by mass. The proportion of the conductive oxide microparticles within the dispersion is preferably within a range from 0.01 to 50% by mass. The reason for specifying a proportion of conductive oxide microparticles that satisfies the above range is because at proportions less than the lower limit of the above range, forming a uniform film becomes difficult, whereas if the proportion exceeds the above upper limit, forming a second transparent conductive film having a thickness of not more than 500 nm becomes problematic.

A coupling agent is preferably added to the dispersion of the conductive oxide microparticles depending on the other components used. This coupling agent has the functions of improving the bonding between the conductive microparticles and the binder, and improving the adhesion between the second transparent conductive film and the photovoltaic layer or the conductive reflective film. Examples of the coupling agent include silane coupling agents, aluminum coupling agents and titanium coupling agents.

Examples of the silane coupling agents include vinyltriethoxysilane, γ-glycidoxypropyltrimethoxysilane, and γ-methacryloxypropyltrimethoxysilane. Examples of the aluminum coupling agents include the aluminum coupling agent containing acetoalkoxy groups illustrated below in formula (21). Furthermore, examples of the titanium coupling agents include the titanium coupling agents having dialkyl pyrophosphite groups illustrated below in formulas (22) to (24), and the titanium coupling agent having a dialkyl phosphite group illustrated below in formula (25).

[Chemical Formula 21]

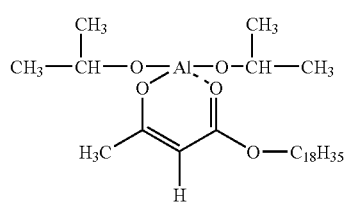

(21)

[Chemical Formula 22]

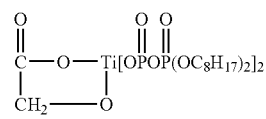

(22)

[Chemical Formula 23]

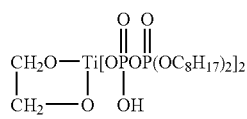

(23)

[Chemical Formula 24]

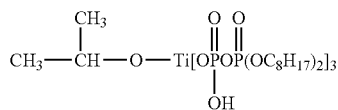

(24)

[Chemical Formula 25]

(25)

The binder dispersion includes, as a binder component, either one or both of a polymeric binder and a non-polymeric binder that cure upon heating. Examples of the polymeric binder include acrylic resins, polycarbonates, polyesters, alkyd resins, polyurethanes, acrylic urethanes, polystyrenes, polyacetals, polyamides, polyvinyl alcohols, polyvinyl acetates, celluloses and siloxane polymers. Furthermore, the polymeric binder preferably includes one or more metal soaps, metal complexes or metal alkoxide hydrolysates of aluminum, silicon, titanium, chromium, manganese, iron, cobalt, nickel, silver, copper, zinc, molybdenum or tin. Examples of the non-polymeric binder include metal soaps, metal complexes, metal alkoxides, halosilanes, 2-alkoxyethanols, β-diketones and alkyl acetates. Further, the metal contained within the metal soap, metal complex or metal alkoxide is typically aluminum, silicon, titanium, chromium, manganese, iron, cobalt, nickel, silver, copper, zinc, molybdenum, tin, indium or antimony. These polymeric binders and non-polymeric binders cure upon heating, making it possible to form a second transparent conductive film having a low haze and low volume resistivity at low temperature. The amount of these binders within the binder dispersion is preferably within a range from 0.01 to 50% by mass, and is more preferably within a range from 0.5 to 20% by mass.

During preparation of the binder dispersion, it is preferable to use the same dispersion medium as that used in preparing the dispersion used for forming the conductive oxide microparticles layer. In order to ensure formation of a uniform film, the amount of the dispersion medium is preferably within a range from 50 to 99.99% by mass.

Furthermore, depending on the components used, the addition of a resistance reducer or a water-soluble cellulose derivative or the like may also be preferable. The resistance reducer is preferably one or more materials selected from the group consisting of mineral acid salts and organic acid salts of cobalt, iron, indium, nickel, lead, tin, titanium and zinc. Specific examples include a mixture of nickel acetate and ferric chloride, a mixture of zinc naphthenate, tin octylate and antimony chloride, a mixture of indium nitrate and lead acetate, and a mixture of titanium acetylacetate and cobalt octylate. The amount of these resistance reducers is preferably 0.1 to 10% by mass. Addition of a water-soluble cellulose derivative improves the transparency of the formed second transparent conductive film. Specific examples of the water-soluble cellulose derivative include hydroxypropylcellulose and hydroxypropylmethylcellulose. The amount added of the water-soluble cellulose derivative is preferably within a range from 0.1 to 10% by mass.

The conductive reflective film composition used in forming the conductive reflective film of the fifth embodiment of the present invention is a composition composed of metal nanoparticles dispersed within a dispersion medium. The metal nanoparticles typically include at least 75% by mass, and preferably 80% by mass or more of silver nanoparticles. The reason for specifying an amount of silver nanoparticles of at least 75% by mass relative to 100% by mass of all the metal nanoparticles is because at an amount less than 75% by mass, the reflectance of the conductive reflective film formed using this composition tends to decrease. Furthermore, the silver nanoparticles are chemically modified with a protective agent having an organic molecular main chain with a carbon skeleton containing 1 to 3 carbon atoms.

The reason for restricting the number of carbon atoms within the carbon skeleton of the organic molecular main chain of the protective agent used for chemically modifying the metal nanoparticles to a number within a range from 1 to 3 is because if the number of carbon atoms is 4 or greater, then the protective agent becomes difficult to eliminate or decompose (detach and combust) under the heat used during the baking process, meaning a large amount of organic residue tends to remain within the film, which subsequently degenerates or degrades, causing reductions in the conductivity and reflectance of the conductive reflective film.

The silver nanoparticles include a number average of not less than 70%, and preferably not less than 75%, of silver nanoparticles having a primary particle size within a range from 10 to 50 nm. The reason for ensuring that the amount of metal nanoparticles having a primary particle size within a range from 10 to 50 nm is a number average of not less than 70% relative to 100% of all the metal nanoparticles is because if this number average is less than 70%, then the specific surface area of the metal nanoparticles increases and the proportion of the particles composed of organic matter increases, meaning that even if the organic molecules are readily eliminated or decomposed (detached and combusted) under the heat used during baking, because the amount of organic molecules is large, a large amount of organic residue tends to remain within the film, and this residue may subsequently degenerate or degrade, causing reductions in the conductivity and reflectance of the conductive reflective film, or the particle size distribution of the metal nanoparticles may broaden considerably, making the density of the conductive reflective film prone to a reduction that causes a deterioration in the conductivity and reflectance of the conductive reflective film. Moreover, another reason for specifying a primary particle size for the metal nanoparticles of 10 to 50 nm is that statistical analyses reveal that metal nanoparticles having a primary particle size within a range from 10 to 50 nm correlate with improved stability over time.

The metal nanoparticles other than the silver nanoparticles are metal nanoparticles formed from one metal, or a mixed composition or alloy composition containing two or more metals, selected from the group consisting of gold, platinum, palladium, ruthenium, nickel, copper, tin, indium, zinc, iron, chromium and manganese, and the amount of these metal nanoparticles other than the silver nanoparticles, relative to 100% by mass of all the metal nanoparticles, is at least 0.02% by mass but less than 25% by mass, and preferably within a range from 0.03 to 20% by mass. The reason for restricting the amount of the metal nanoparticles other than silver nanoparticles to at least 0.02% by mass but less than 25% by mass relative to 100% by mass of all the metal nanoparticles is because if the amount is less than 0.02% by mass, then although no particular problems arise, amounts within the range from 0.02 to 25% by mass still produce results for the conductivity and reflectance of the conductive reflective film following a weather resistance test (a test that involves standing for 1,000 hours in a constant temperature and humidity chamber at a temperature of 100° C. and a humidity of 50%) that display no deterioration from the results prior to the weather resistance test, whereas on the other hand, if the amount is 25% by mass or greater, then the conductivity and reflectance of the conductive reflective film immediately following baking tend to decrease, and the conductivity and reflectance of the conductive reflective film following a weather resistance test tend to be inferior to the conductivity and reflectance of the conductive reflective film prior to the weather resistance test.

Furthermore, the conductive reflective film composition includes one or more additives selected from the group consisting of organic polymers, metal oxides, metal hydroxides, organometallic compounds and silicone oils. A metal oxide, metal hydroxide, organometallic compound or silicone oil incorporated within the composition as an additive improves the adhesion to the second transparent conductive film with no loss of conductivity, either due to chemical bonding or an anchoring effect relative to the second transparent conductive film, or due to an improvement in the wettability between the metal nanoparticles and the second transparent conductive film during the baking step.

If the conductive reflective film is formed using a composition that contains none of the above metal oxides and the like, then the surface roughness of the formed conductive reflective film increases, but in order to optimize the photovoltaic conversion efficiency, specific conditions must be satisfied for the uneven shape of the surface of the conductive reflective film, and simply increasing the surface roughness does not necessarily enable the formation of a conductive reflective film surface having superior photovoltaic conversion efficiency. By appropriate adjustment of the variety and concentration and the like of the metal oxide, as described for the fifth embodiment of the present invention, a surface having a surface roughness that optimizes the photovoltaic conversion efficiency can be formed.

The amount of the additives is typically within a range from 0.1 to 20%, and preferably from 0.2 to 10%, of the mass of the silver nanoparticles within the metal nanoparticles. If the amount of these additives is less than 0.1%, then there is a possibility that holes having a large average diameter may be generated, and the density of the holes may increase. An amount of the additives exceeding 20% tends to exert an adverse effect on the conductivity of the formed conductive reflective film, and may result in a volume resistivity exceeding $2 \times 10^{-5}$ $\Omega \cdot cm$.

As the organic polymer used as an additive, one or more polymers selected from the group consisting of polyvinylpyrrolidone (hereafter also abbreviated as PVP), PVP copolymers and water-soluble celluloses are used. Specific examples of the PVP copolymers include PVP-methacrylate copolymers, PVP-styrene copolymers and PVP-vinyl acetate copolymers. Further, examples of the water-soluble celluloses include cellulose ethers such as hydroxypropylmethylcellulose, methylcellulose and hydroxyethylmethylcellulose.

Examples of the metal oxide used as an additive include oxides or composite oxides containing at least one metal selected from the group consisting of aluminum, silicon, titanium, chromium, manganese, iron, cobalt, nickel, silver, copper, zinc, molybdenum, tin, indium and antimony. Specific examples of the composite oxides include ITO, ATO and IZO.

Examples of the metal hydroxide used as an additive include hydroxides containing at least one metal selected from the group consisting of aluminum, silicon, titanium, chromium, manganese, iron, cobalt, nickel, silver, copper, zinc, molybdenum, tin, indium and antimony.

Examples of the organometallic compound used as an additive include metal soaps, metal complexes and metal alkoxides of at least one metal selected from the group consisting of silicon, titanium, aluminum, antimony, indium, chromium, manganese, iron, cobalt, nickel, silver, copper, zinc, molybdenum and tin. Examples of the metal soaps include chromium acetate, manganese formate, iron citrate, cobalt formate, nickel acetate, silver citrate, copper acetate, copper citrate, tin acetate, zinc acetate, zinc oxalate and molybdenum acetate. Furthermore, examples of the metal complexes include a zinc acetylacetonate complex, chromium acetylacetonate complex and nickel acetylacetonate complex. Examples of the metal alkoxides include titanium isopropoxide, methyl silicate, isocyanatopropyltrimethoxysilane and aminopropyltrimethoxysilane.

Examples of the silicone oil used as an additive include both straight silicone oils and modified silicone oils. As the modified silicone oils, oils that include organic groups introduced at a portion of the side chains of a polysiloxane (side-chain type oils), oils that include organic groups introduced at both terminals of a polysiloxane (both terminal-type oils), oils that include an organic group introduced at one of the two terminals of a polysiloxane (single terminal-type oils), and oils that include organic groups introduced at a portion of the side chains and at both terminals of a polysiloxane (side-chain, both terminal-type oils) can be used. Modified silicone oils include both reactive silicone oils and unreactive silicone oils, and a combination of both types may also be used as an additive in the fifth embodiment of the present invention. Reactive silicone oils include amino-modified, epoxy-modified, carboxy-modified, carbinol-modified and mercapto-modified silicone oils, as well as silicone oils modified with a number of different functional groups (such as epoxy groups, amino groups and polyether groups). Unreactive silicone oils include polyether-modified, methylstyryl-modified, alkyl-modified, higher fatty acid ester-modified, fluorine-modified, and specific hydrophilic-modified silicone oils.

The dispersion medium used in forming the conductive reflective film composition is preferably composed of an alcohol or an alcohol-containing aqueous solution. Examples of alcohols that may be used as the dispersion medium include one or more alcohols selected from the group consisting of methanol, ethanol, propanol, butanol, ethylene glycol, propylene glycol, diethylene glycol, glycerol, isobornylhexanol and erythritol. The alcohol-containing aqueous solution preferably contains, relative to 100% by mass of the entire dispersion medium, not less than 1% by mass, and preferably 2% by mass or more of water, and not less than 2% by mass, and preferably 3% by mass or more of an alcohol. For example, in those cases where the dispersion medium is composed solely of water and an alcohol, if the medium contains 2% by mass of water, then the alcohol content is 98% by mass, whereas if the medium contains 2% by mass of the alcohol, then the water content is 98% by mass. The reason for specifying a water content of not less than 1% by mass relative to 100% by mass of the entire dispersion medium is because if the water content is less than 1% by mass, then the film obtained by using a wet coating method to apply the conductive reflective film composition tends to be difficult to sinter at low temperatures, and the conductivity and reflectance of the film following baking tend to deteriorate. The reason for specifying an alcohol content of not less than 2% by mass relative to 100% by mass of the entire dispersion medium is because if the alcohol content is less than 2% by mass, then in a similar manner to that described above, the film obtained by using a wet coating method to apply the composition tends to be difficult to sinter at low temperatures, and the conductivity and reflectance of the film following baking tend to deteriorate.

Moreover, the dispersion medium, namely the protective molecules that chemically modify the surface of the metal nanoparticles, preferably contains one or both of a hydroxyl group (—OH) and a carbonyl group (—C=O). If a hydroxyl group (—OH) is incorporated within the protective agent that chemically modifies the metal nanoparticles such as the silver nanoparticles, then the composition exhibits excellent dispersion stability, and even low-temperature sintering of the coating yields an effective action. If a carbonyl group (—C=O) is incorporated within the protective agent that chemically modifies the metal nanoparticles such as the silver nanoparticles, then in a similar manner to that described above, the composition exhibits excellent dispersion stability, and even low-temperature sintering of the coating yields an effective action.

Examples of the method used for producing the conductive reflective film composition include the methods outlined below.

(a) The case where the number of carbon atoms within the carbon skeleton of the organic molecular main chain of the protective agent used for chemically modifying the silver nanoparticles is set to 3

Firstly, silver nitrate is dissolved in water such as deionized water to prepare a metal salt aqueous solution. In a separate preparation, sodium citrate is dissolved in water such as deionized water to prepare an aqueous solution of sodium citrate having a concentration of 10 to 40%, and ferrous sulfate in a particulate or powder form is then added directly to, and dissolved in, the sodium citrate aqueous solution under a stream of an inert gas such as nitrogen gas, thus preparing a reducing agent aqueous solution containing a 3:2 molar ratio of citrate ions and ferrous ions. Subsequently, with the reducing agent aqueous solution undergoing constant stirring under a stream of the above inert gas, the metal salt aqueous solution described above is added dropwise to the reducing agent aqueous solution and mixed thoroughly. During this process, it is preferable that the concentrations of the solutions are altered so that the amount added of the metal salt aqueous solution is not more than $\frac{1}{10}$th of the amount of the reducing agent aqueous solution, as this ensures that the reaction temperature can be maintained within a range from 30 to 60° C. even if the added metal salt aqueous solution is at room temperature. Further, the mixing ratio between the two aqueous solutions is preferably adjusted so that the equivalent amount of ferrous ions added as the reducing agent is three times the equivalent amount of the metal ions, in other words, (number of mols of metal ions within the metal salt aqueous solution)×(valency of metal ions)=3×(ferrous ions within the reducing agent aqueous solution). Following completion of the dropwise addition of the metal salt aqueous solution, stirring of the resulting mixed liquid is continued for a further 10 to 300 minutes, thus forming a dispersion composed of a metal colloid. This dispersion is left to stand at room temperature, the precipitated metal nanoparticle aggregates are isolated by decantation and/or centrifugal separation and the like, water such as deionized water is added to the isolated nanoparticle aggregates to form a dispersion, a demineralization treatment is conducted using ultrafiltration, and displacement washing is then performed using an alcohol, so as to achieve a metal (silver) content within a range from 2.5 to 50% by mass. Subsequently, by separating the very coarse particles using a centrifugal separator with appropriate adjustment of the centrifugal power, silver nanoparticles are prepared in which those particles having a primary particle size within a range from 10 to 50 nm represent a number average of not less than 70%. In other words, the silver nanoparticles are prepared such that relative to 100% of all the silver nanoparticles, the proportion of silver nanoparticles having a primary particle size within a range from 10 to 50 nm represents a number average of not less than 70%. By using this method, a dispersion is obtained in which the number of carbon atoms within the carbon skeleton of the organic molecular main chain of the protective agent chemically modifying the silver nanoparticles is 3.

Subsequently, the resulting dispersion is adjusted so that the final metal content (silver content) relative to 100% by mass of the dispersion is within a range from 2.5 to 95% by mass. Further, in those cases where the dispersion medium is an alcohol-containing aqueous solution, the amounts of the water and the alcohol within the medium are preferably adjusted to amounts of not less than 1% and not less than 2% respectively. Furthermore, in those cases where further additives are included within the composition, one or more additives selected from the group consisting of organic polymers, metal oxides, metal hydroxides, organometallic compounds and silicone oils are added in the desired proportions. The amount of these additives is adjusted so as to satisfy a range from 0.1 to 20% by mass relative to 100% by mass of the obtained composition. This enables a composition to be obtained in which silver nanoparticles, which have been chemically modified with a protective agent having an organic molecular main chain in which the number of carbon atoms within the carbon skeleton is 3, are dispersed within the dispersion medium.

(b) The case where the number of carbon atoms within the carbon skeleton of the organic molecular main chain of the protective agent used for chemically modifying the silver nanoparticles is set to 2

With the exception of replacing the sodium citrate used when preparing the reducing agent aqueous solution with sodium malate, a dispersion is prepared in the same manner as (a) above. This enables a dispersion to be obtained in which the number of carbon atoms within the carbon skeleton of the organic molecular main chain that chemically modifies the silver nanoparticles is 2.

(c) The case where the number of carbon atoms within the carbon skeleton of the organic molecular main chain of the protective agent used for chemically modifying the silver nanoparticles is set to 1

With the exception of replacing the sodium citrate used when preparing the reducing agent aqueous solution with sodium glycolate, a dispersion is prepared in the same manner as (a) above. This enables a dispersion to be obtained in which the number of carbon atoms within the carbon skeleton of the organic molecular main chain that chemically modifies the silver nanoparticles is 1.

(d) The case where the number of carbon atoms within the carbon skeleton of the organic molecular main chain of the protective agent used for chemically modifying metal nanoparticles other than silver nanoparticles is set to 3

Examples of the metal that constitutes the metal nanoparticles other than silver nanoparticles include gold, platinum, palladium, ruthenium, nickel, copper, tin, indium, zinc, iron, chromium and manganese. With the exception of replacing the silver nitrate used when preparing the metal salt aqueous solution with chlorauric acid, chloroplatinic acid, palladium nitrate, ruthenium trichloride, nickel chloride, cuprous nitrate, tin dichloride, indium nitrate, zinc chloride, iron sulfate, chromium sulfate or manganese sulfate, a dispersion is prepared in the same manner as (a) above. This enables a dispersion to be obtained in which the number of carbon atoms within the carbon skeleton of the organic molecular main chain of the protective agent that chemically modifies the metal nanoparticles other than silver nanoparticles is 3.

In those cases where the number of carbon atoms within the carbon skeleton of the organic molecular main chain of the protective agent used for chemically modifying metal nanoparticles other than silver nanoparticles is set to either 1 or 2, a dispersion is prepared in the same manner as either (b) or (c) above, with the exception of replacing the silver nitrate used when preparing the metal salt aqueous solution with one of the other metal salts listed above. This enables a dispersion to be obtained in which the number of carbon atoms within the carbon skeleton of the organic molecular main chain of the protective agent that chemically modifies the metal nanoparticles other than silver nanoparticles is either 1 or 2.

In those cases where silver nanoparticles and metal nanoparticles other than silver nanoparticles are combined as the metal nanoparticles, then for example, if the dispersion containing silver nanoparticles produced using the above method (a) is deemed the first dispersion, and the dispersion containing metal nanoparticles other than silver nanoparticles produced using the above method (d) is deemed the second dispersion, a dispersion may be prepared by mixing at least 75% by mass of the first dispersion and less than 25% by mass of the second dispersion so that the combination of the first and second dispersions totals 100% by mass. The first dispersion is not restricted to a dispersion containing silver nanoparticles produced using the above method (a), and a dispersion containing silver nanoparticles produced using the above method (b) or a dispersion containing silver nanoparticles produced using the above method (c) may also be used.

Next is a description of a method for producing a composite film according to the fifth embodiment of the present invention.

Figure 8:
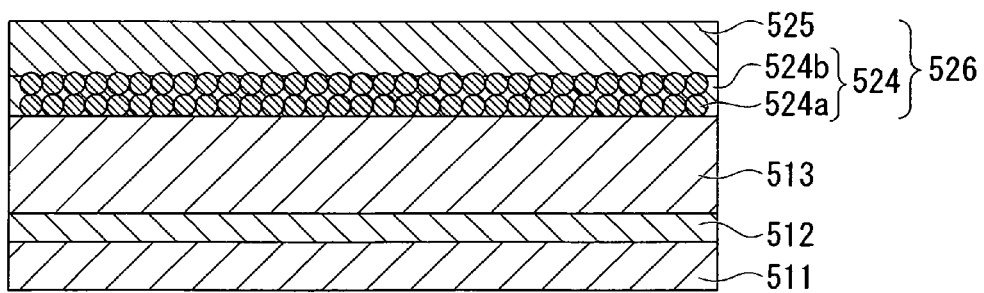
FIG. 8 is a diagram that schematically illustrates a cross-section of the composite film for a superstrate solar cell of the fifth embodiment of the present invention prior to baking.

In the production process according to the fifth embodiment of the present invention, as illustrated in FIG. 8, a conductive oxide microparticles coating 524a is first formed by using a wet coating method to apply the aforementioned dispersion, prepared by dispersing conductive oxide microparticles in a dispersion medium, to a photovoltaic layer 513 of a superstrate solar cell that has been laminated on a substrate 511 with a first transparent conductive film 512 disposed therebetween. This application is conducted so that the thickness following baking is within a range from 0.01 to 0.5 µm, and preferably from 0.05 to 0.1 µm. This coating 524a is then dried at a temperature of 20 to 120° C., and preferably 25 to 60° C., for a period of 1 to 30 minutes, and preferably 2 to 10 minutes.

Subsequently, the conductive oxide microparticles coating 524a is impregnated with the aforementioned binder dispersion 524b using a wet coating method. The binder dispersion 524b is caused to penetrate completely into the conductive oxide microparticles coating 524a to a predetermined depth, so that of the second transparent conductive film formed following baking, the second layer containing no binder component protrudes from the first layer in an amount equivalent to 1 to 30% of the volume of the first layer. The application is preferably conducted so that the mass of the binder component within the applied binder dispersion, relative to the total mass of microparticles contained within the applied conductive oxide microparticles coating, is a mass ratio (mass of binder component within applied binder dispersion/mass of conductive oxide microparticles) within a range from 0.05 to 0.5. If the mass ratio is less than the lower limit of the above range, then obtaining satisfactory adhesion is difficult, whereas if the mass ratio exceeds the upper limit of the range, then the surface resistance is likely to increase. The transparent conductive coating 524 formed from the conductive oxide microparticles coating 524a impregnated with the binder dispersion 524b is dried at a temperature of 20 to 120° C., and preferably 25 to 60° C., for a period of 1 to 30 minutes, and preferably 2 to 10 minutes.

Next, a wet coating method is used to apply the above conductive reflective film composition to the transparent conductive coating 524. This application is conducted so that the thickness following baking is within a range from 0.05 to 2.0 µm, and preferably from 0.1 to 1.5 µm. The applied coating is then dried at a temperature of 20 to 120° C., and preferably 25 to 60° C., for a period of 1 to 30 minutes, and preferably 2 to 10 minutes. This completes the formation of the conductive reflective coating 525.

Moreover, the wet coating method mentioned above is preferably one of a spray coating method, dispenser coating method, spin coating method, knife coating method, slit coating method, inkjet coating method, screen printing method, offset printing method or die coating method, although this list is not exhaustive, and any appropriate method may be used.

Spray coating is a method in which either the dispersion is converted to a fine mist using compressed air and then applied to the substrate, or the dispersion itself is pressurized and converted to a fine mist that is then applied to the substrate. Dispenser coating is a method in which, for example, the dispersion is placed inside an injector, and the dispersion is then discharged from a fine nozzle at the tip of the injector and applied to the substrate by depressing the injector piston. Spin coating is a method in which the dispersion is dripped onto a spinning substrate, and the dripped dispersion spreads out to the peripheral edges of the substrate under centrifugal force. Knife coating is a method in which a substrate that is separated from the tip of a knife by a predetermined gap is provided in a manner that enables the substrate to be moved horizontally, and the dispersion is supplied onto the substrate at a point upstream from the knife while the substrate is moved horizontally in the downstream direction. Slit coating is a method in which the dispersion is exuded from a narrow slit and coated onto the substrate. Inkjet coating is a method in which the dispersion is used to fill the ink cartridge of a commercially available inkjet printer, and the dispersion is then applied to the substrate by inkjet printing. Screen printing is a method in which a gauze is used as a patterning material, and the dispersion is transferred to the substrate through a print image formed on the gauze. Offset printing is a printing method that utilizes the water repellency of ink, wherein the dispersion applied to a plate is not adhered directly to the substrate, but is rather first transferred from the plate to a rubber sheet, before being subsequently transferred from the rubber sheet to the substrate. Die coating is a method in which a dispersion that has been supplied to a die is distributed using a manifold, and is then extruded in a thin film from a slit, and applied to the surface of a moving substrate. Die coating methods include slot coating, slide coating and curtain coating methods.

Finally, the substrate 511 having the coating 526 formed thereon is subjected to baking, either under normal atmospheric conditions or in an inert gas atmosphere of nitrogen or argon or the like, by holding the substrate at a temperature of 130 to 400° C., and preferably 150 to 350° C., for a period of 5 to 60 minutes, and preferably 15 to 40 minutes. The reason for conducting the application of the conductive oxide microparticles dispersion so that the thickness of the second transparent conductive film following baking is within a range from 0.01 to 0.5 µm is because if the thickness following baking is less than 0.01 µm, then the short-circuit current of the solar cell decreases, whereas if the thickness exceeds 0.5 µm, then the fill factor deteriorates dramatically. Furthermore, the reason for conducting the application of the conductive reflective film composition so that the thickness of the conductive reflective film following baking is within a range from 0.05 to 2.0 µm is because if the thickness is less than 0.05 µm, then the surface resistance value becomes overly high, making it difficult to obtain the level of conductivity required of a solar cell electrode, whereas if the thickness exceeds 2.0 µm, then although there are no concerns in terms of the resulting properties, the amount of material used is more than is necessary, resulting in unnecessary material waste.

The reason for specifying a baking temperature within a range from 130 to 400° C. is because at temperatures lower than 130° C., a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. In contrast, if the temperature exceeds 400° C., then any merit associated with conducting the production using a low-temperature process is lost. In other words, the production costs increase, and the productivity tends to decrease. Furthermore, amorphous silicon solar cells, microcrystalline silicon solar cells, and hybrid silicon solar cells that use both these forms of silicon are particularly susceptible to heat, and a high temperature during the baking step causes a deterioration in the conversion efficiency.

The reason for specifying a baking time within a range from 5 to 60 minutes for the substrate having the coating formed thereon is because if the baking time is less than the lower limit of this range, then a problem arises in that the surface resistance value of the second transparent conductive film in the composite film tends to become overly high. Further, sintering of the metal nanoparticles within the conductive reflective film tends to be inadequate, and elimination or decomposition (detachment and combustion) of the protective agent under the heat used during baking becomes difficult, meaning a large amount of organic residue tends to be retained within the conductive reflective film following baking. This residue tends to degenerate or degrade, causing reductions in the conductivity and reflectance of the conductive reflective film. Although lengthening the baking time beyond the upper limit of the above range has no adverse effects on the composite film properties, it results in an unnecessary increase in production costs and decrease in productivity. Moreover, the conversion efficiency of the solar cell also tends to deteriorate.

The composite film of the fifth embodiment of the present invention can be formed in the manner described above. In this manner, by using a wet coating method, the production process according to the fifth embodiment of the present invention is able to eliminate vacuum processes such as vacuum deposition and sputtering as far as possible, meaning the composite film can be produced comparatively cheaply.

In the first through fifth embodiments, there are no particular restrictions on the first transparent conductive film, and examples of films that may be used include films formed using the same formation method as that employed for the second transparent conductive film, and films formed using a vacuum deposition method such as sputtering.

EXAMPLES

A detailed description of examples and comparative examples is presented below.

Examples A1 to A32

Transparent conductive film compositions for composite films according to the first embodiment of the present invention were prepared using the components and amounts listed for the classifications A1 to A8 detailed below in Table 1. The classification numbers from Table 1 for the transparent conductive film compositions used within the various examples are listed in Table 2 and Table 3.

In classification A1, as detailed below in Table 1, a total of 60 g of a mixture composed of 15% by mass of an IZO powder having an average particle size of 0.025 μm as a conductive oxide powder, 72.77% by mass of isopropanol as a dispersion medium, 10% by mass of a mixed liquid of the non-polymeric binders 2-n-butoxyethanol and 3-isopropyl-2,4-pentanedione as a binder, and 2.23% by mass of a mixture of indium nitrate and lead acetate (mass ratio 1:1) as a resistance reducer was placed in a 100 cc glass bottle, and using 100 g of zirconia beads with a diameter of 0.3 mm (MICRO HICA, manufactured by Showa Shell Sekiyu K.K.), the mixture was dispersed for 6 hours using a paint shaker, thus yielding a transparent conductive film composition.

In classification A2, as detailed below in Table 1, a transparent conductive film composition was prepared in the same manner as the classification A1, using a mixture composed of 7.5% by mass of an ITO powder having an average particle size of 0.025 μm as a conductive oxide powder, 92.3% by mass of a first mixed liquid composed of isopropanol, ethanol and N,N-dimethylformamide (mass ratio 4:2:1) as a dispersion medium, 0.038% by mass of the non-polymeric binder 2,4-pentanedione as a binder, and 0.162% by mass of a titanium coupling agent represented by the above formula (4) as a coupling agent.

In classification A3, as detailed below in Table 1, a transparent conductive film composition was prepared in the same manner as the classification A1, using a mixture composed of 5% by mass of an ATO powder having an average particle size of 0.025 μm as a conductive oxide powder, 50.99% by mass of the above first mixed liquid as a dispersion medium, 44% by mass of the non-polymeric binder 2-n-propoxyethanol as a binder, and 0.01% by mass of a titanium coupling agent represented by the above formula (4) as a coupling agent.

In classification A4, as detailed below in Table 1, a transparent conductive film composition was prepared in the same manner as the classification A1, using a mixture composed of 5% by mass of an AZO powder having an average particle size of 0.025 μm as a conductive oxide powder, 74.64% by mass of the above first mixed liquid as a dispersion medium, 20% by mass of a mixed liquid of 2,2-dimethyl-3,5-hexanedione and isopropyl acetate (mass ratio 1:1) as a binder, and 0.36% by mass of a titanium coupling agent represented by the above formula (3) as a coupling agent.

In classification A5, as detailed below in Table 1, a transparent conductive film composition was prepared in the same manner as the classification A1, using a mixture composed of 5% by mass of a TZO powder having an average particle size of 0.025 μm as a conductive oxide powder, 93.95% by mass of the above first mixed liquid as a dispersion medium, 0.8% by mass of a mixed liquid of 2-isobutoxyethanol, 2-hexyloxyethanol and n-propyl acetate (mass ratio 4:1:1) as a binder, and 0.25% by mass of a titanium coupling agent represented by the above formula (5) as a coupling agent.

In classification A6, first, an ATO powder having an average particle size of 0.010 μm was suspended in water, the pH of the suspension was adjusted to a value of 7, and the suspension was treated for 30 minutes using a beads mill. Subsequently, hydroxypropylcellulose was added to the suspension as a water-soluble cellulose derivative in a mass ratio of 0.01% relative to the mass of the ATO powder, thus forming a conductive water dispersion. The conductive water dispersion prepared in this manner was adjusted to a solid fraction concentration of 18.5%, and 100 g of this dispersion and 100 g of a 13.2% by mass aqueous solution of gelatin were mixed at 40° C., thus forming a water-based transparent conductive film composition.

In classification A7, as detailed below in Table 1, a transparent conductive film composition was prepared by mixing 5.3% by mass of an ATO powder having an average particle size of 0.025 μm as a conductive oxide powder, 85% by mass of a second mixed liquid composed of ethanol and butanol (mass ratio 98:2) as a dispersion medium, 1.7% by mass of a $SiO_2$ binding agent as a binder, and 8.0% by mass of a titanium coupling agent represented by the above formula (3) as a coupling agent. The $SiO_2$ binding agent used as a binder was prepared using a 500 ml four-neck glass flask, by charging the flask with 140 g of tetraethoxysilane and 240 g of ethyl alcohol, adding 1.0 g of 12N-HCl dissolved in 25 g of pure water in a single batch with constant stirring, and then reacting the resulting mixture for 6 hours at 80° C.

In classification A8, as detailed below in Table 1, a transparent conductive film composition was prepared by mixing 8.0% by mass of an ITO powder having an average particle size of 0.025 μm as a conductive oxide powder, 88% by mass of the above second mixed liquid as a dispersion medium, 2.0% by mass of a $SiO_2$ binding agent as a binder, and 2.0% by mass of a titanium coupling agent represented by the above formula (2) as a coupling agent. The $SiO_2$ binding agent used as a binder was prepared in the same manner as that described for classification A7.

Next, using the procedure described below, conductive reflective film compositions for composite films according to the first embodiment of the present invention were prepared.

First, silver nitrate was dissolved in deionized water to prepare a metal salt aqueous solution. Further, in a separate preparation, sodium citrate was dissolved in deionized water to prepare an aqueous solution of sodium citrate having a concentration of 26% by mass. A particulate ferrous sulfate was then added directly to, and dissolved in, the sodium citrate aqueous solution under a stream of nitrogen gas held at a temperature of 35° C., thus preparing a reducing agent aqueous solution containing a 3:2 molar ratio of citrate ions and ferrous ions.

Subsequently, with the stream of nitrogen gas held at 35° C., a magnetic stirrer bar was placed in the reducing agent aqueous solution, and with the reducing agent aqueous solution undergoing constant stirring by rotating the stirrer bar at a rate of 100 rpm, the metal salt aqueous solution was added dropwise to the reducing agent aqueous solution and mixed thoroughly. For this addition, the concentration of each of the solutions was altered so that the amount of the metal salt aqueous solution added to the reducing agent aqueous solution was not more than 1/10th of the amount of the reducing agent aqueous solution, thereby ensuring that the reaction temperature was maintained at 40° C. even though the added metal salt aqueous solution was at room temperature. Furthermore, the mixing ratio between the reducing agent aqueous solution and the metal salt aqueous solution was adjusted so that the molar ratios of both the citrate ions and the ferrous ions within the reducing agent aqueous solution, relative to the total atomic valence number of metal ions within the metal salt aqueous solution, was a 3-fold molar excess. Following completion of the dropwise addition of the metal salt aqueous solution to the reducing agent aqueous solution, stirring of the resulting mixed liquid was continued for a further 15 minutes, thereby generating metal particles within the mixed liquid and forming a metal particles dispersion containing dispersed metal particles. The pH of the metal particles dispersion was 5.5, and the stoichiometric amount of generated metal particles within the dispersion was 5 Oita.

The thus obtained dispersion was left to stand at room temperature to allow the metal particles within the dispersion to settle out, and the settled metal particle aggregates were isolated by decantation. Deionized water was added to the isolated metal aggregates to form a dispersion, a demineralization treatment was conducted using ultrafiltration, and displacement washing was then performed using methanol, so as to achieve a metal (silver) content of 50% by mass. Subsequently, by using a centrifugal separator with appropriate adjustment of the centrifugal power to separate the comparatively large silver particles having a particle size exceeding 100 nm, a sample was prepared in which silver particles having a primary particle size within a range from 10 to 50 nm represented a number average of 71%. In other words, the silver nanoparticles were prepared such that relative to 100% of all the silver nanoparticles, the proportion of silver nanoparticles having a primary particle size within a range from 10 to 50 nm was a number average of 71%. The thus obtained silver nanoparticles were chemically modified with a protective agent having an organic molecular main chain with a carbon skeleton containing 3 carbon atoms.

Next, 10 parts by mass of the obtained metal nanoparticles were added to and dispersed within 90 parts by mass of a mixed solution of ethanol and methanol, and by subsequently adding the additives listed below in Table 2 to Table 4 in the proportions shown in Table 2 to Table 4, a series of conductive reflective film compositions was obtained. The metal nanoparticles used in forming these conductive reflective film compositions contained at least 75% of silver nanoparticles.

In those cases where silver nanoparticles and metal nanoparticles other than silver nanoparticles were combined as the metal nanoparticles, then the dispersion containing silver nanoparticles produced using the above method was deemed the first dispersion, a dispersion containing metal nanoparticles other than silver nanoparticles was prepared using the same method as the above method used for producing the silver nanoparticles, but with the exception of replacing the silver nitrate with a metal salt listed in Table 2 to Table 4 that is capable of forming metal nanoparticles other than silver nanoparticles, and this dispersion of metal nanoparticles was deemed the second dispersion, and the first dispersion and second dispersion were then mixed together, prior to the addition of additives, in the proportions listed in Table 2 to Table 4, thus forming a conductive reflective film composition.

Each of the prepared transparent conductive film compositions was applied to the substrate listed in Table 2 to Table 4 using one of a variety of different coating methods in an amount sufficient to generate a film thickness following baking of 0.7 to $1.3 \times 10^2$ nm, and was then dried at a temperature of 25° C. for 5 minutes to form a transparent conductive coating. Subsequently, one of the prepared conductive reflective film compositions was applied to the formed transparent conductive coating using one of a variety of different coating methods in an amount sufficient to generate a film thickness following baking of $10^2$ to $2 \times 10^3$ nm, and was then dried at a temperature of 25° C. for 5 minutes to form a conductive reflective coating. By subsequently performing baking under the conditions detailed in Table 2 to Table 4, a composite film was formed on the substrate.

In Table 2 to Table 4, PVP represents a polyvinylpyrrolidone having a Mw of 360,000, and PET represents a polyethylene terephthalate.

Comparative Example A1

A second transparent conductive film was formed with a thickness of $0.7 \times 10^2$ nm using a sputtering method that represents an example of a vacuum deposition method, and a conductive reflective film was then formed on top of this second transparent conductive film, using the same conductive reflective film composition as that used in example A1 and the same method as that used in example A1, thus forming a composite film.

Comparative Example A2

A second transparent conductive film was formed with a thickness of $2.0 \times 10^2$ nm using a sputtering method that represents an example of a vacuum deposition method, and a conductive reflective film was then formed on top of this second transparent conductive film, using the same conductive reflective film composition as that used in example A1 and the same method as that used in example A1, thus forming a composite film.

TABLE 1

| | | Transparent conductive film composition | | | |
|---|---|---|---|---|---|
| Classification | Conductive oxide microparticles | Dispersion medium | Binder | Coupling agent | Other |
| A1 | IZO 15% by mass | Isopropanol 72.77% by mass | Non-polymeric binder 10% by mass | None | Resistance reducer 2.23% by mass |
| A2 | ITO 7.5% by mass | First mixed liquid 92.3% by mass | Non-polymeric binder 0.038% by mass | Titanium coupling agent 0.162% by mass | None |
| A3 | ATO 5% by mass | First mixed liquid 50.99% by mass | Non-polymeric binder 44% by mass | Titanium coupling agent 0.01% by mass | None |
| A4 | AZO 5% by mass | First mixed liquid 74.64% by mass | Non-polymeric binder 20% by mass | Titanium coupling agent 0.36% by mass | None |
| A5 | TZO 5% by mass | First mixed liquid 93.95% by mass | Non-polymeric binder 0.8% by mass | Titanium coupling agent 0.25% by mass | None |
| A6 | ATO 9.249% by mass | Water 84.150% by mass | Gelatin 6.600% by mass | None | Water-soluble cellulose derivative 0.001% by mass |

TABLE 1-continued

| Classification | Transparent conductive film composition | | | | |
|---|---|---|---|---|---|
| | Conductive oxide microparticles | Dispersion medium | Binder | Coupling agent | Other |
| A7 | ATO 5.3% by mass | Second mixed liquid 85% by mass | $SiO_2$ binding agent 1.7% by mass | Titanium coupling agent 8.0% by mass | None |
| A8 | ITO 8.0% by mass | Second mixed liquid 88% by mass | $SiO_2$ binding agent 2.0% by mass | Titanium coupling agent 2.0% by mass | None |

TABLE 2

| | Transparent conductive film composition Classification | Conductive reflective film composition | | Coating method | | Substrate | Baking treatment | | |
|---|---|---|---|---|---|---|---|---|---|
| | | Metal nanoparticles | Additives | Transparent conductive film | Conductive reflective film | | Temperature [°C.] | Time [min.] | Atmosphere |
| Example A1 | A1 | Ag 94% by mass | PVP 5% by mass Ni acetate 1% by mass | Spin coating | | Glass | 200 | 20 | air |
| Example A2 | A2 | Ag 96% by mass | PVP 3% by mass Cu acetate 1% by mass | Spin coating | | Glass | 200 | 20 | air |
| Example A3 | A3 | Ag 89% by mass Au 5% by mass | PVP-dimethylaminoethyl methacrylate 5% by mass Zn acetate 1% by mass | Spin coating | | Glass | 200 | 20 | air |
| Example A4 | A6 | Ag 72% by mass Pd 24% by mass | Methylcellulose 3% by mass Mo acetate 1% by mass | Spin coating | | Glass | 200 | 20 | air |
| Example A5 | A6 | Ag 94% by mass Ru 2% by mass | Hydroxypropylmethylcellulose 3% by mass Sn acetate 1% by mass | Spin coating | | Glass | 200 | 20 | air |
| Example A6 | A4 | Ag 92% by mass Cu 4% by mass | PVP 3% by mass Sn acetate 1% by mass | Dispenser coating | | Glass | 130 | 20 | $N_2$ |
| Example A7 | A5 | Ag 95.8% by mass Sn 0.2% by mass | PVP 3% by mass Sn acetate 1% by mass | Dispenser coating | | Glass | 200 | 20 | air |
| Example A8 | A1 | Ag 96.8% by mass In 0.2% by mass | PVP 2% by mass Sn acetate 1% by mass | Dispenser coating | | Glass | 130 | 20 | air |
| Example A9 | A1 | Ag 95.8% by mass Zn 0.2% by mass | PVP 3% by mass Sn acetate 1% by mass | Offset printing | | Glass | 320 | 20 | air |
| Example A10 | A1 | Ag 95.8% by mass Fe 0.2% by mass | PVP 3% by mass Zn acetate 1% by mass | Offset printing | | Glass | 320 | 20 | air |
| Example A11 | A1 | Ag 95.8% by mass Fe 0.2% by mass | PVP 3% by mass Ni acetate 1% by mass | Screen printing | | Glass | 150 | 20 | air |
| Example A12 | A1 | Ag 96.8% by mass Mn 0.2% by mass | PVP 3% by mass | Screen printing | | Glass | 150 | 20 | air |
| Example A13 | A2 | Ag 90% by mass | PVP 9% by mass $Al_2O_3$ 1% by mass | Knife coating | | Glass | 150 | 60 | air |
| Example A14 | A2 | Ag 99% by mass | PVP 0.9% by mass $SiO_2$ 0.1% by mass | Slit coating | | Glass | 400 | 60 | air |
| Example A15 | A2 | Ag 95% by mass | PVP 4% by mass $TiO_2$ 1% by mass | Spin coating | | Glass | 150 | 20 | air |

TABLE 3

| | Transparent conductive film composition Classification | Conductive reflective film composition | | Coating method | | Substrate | Baking treatment | | |
|---|---|---|---|---|---|---|---|---|---|
| | | Metal nanoparticles | Additives | Transparent conductive film | Conductive reflective film | | Temperature [°C.] | Time [min.] | Atmosphere |
| Example A16 | A2 | Ag 95% by mass | PVP 4% by mass $Cr_2O_3$ 1% by mass | Spin coating | | Glass | 150 | 20 | air |
| Example A17 | A2 | Ag 95% by mass | PVP 4% by mass $MnO_2$ 1% by mass | Spin coating | | Glass | 150 | 20 | air |
| Example A18 | A2 | Ag 95% by mass | PVP 4% by mass $Fe_2O_3$ 0.5% by mass $Cr_3O_4$ 0.5% by mass | Spin coating | | Glass | 150 | 20 | air |
| Example A19 | A2 | Ag 95% by mass | PVP 4% by mass $Ag_2O$ 1% by mass | Spin coating | | Glass | 150 | 20 | air |
| Example A20 | A3 | Ag 95% by mass | PVP 4% by mass $Cu(OH)_2$ 1% by mass | Spin coating | | Glass | 150 | 20 | Ar |
| Example A21 | A3 | Ag 95% by mass | PVP 4% by mass ZnO 1% by mass | Spin coating | | PET | 150 | 20 | air |

TABLE 3-continued

| | Transparent conductive film composition Classification | Conductive reflective film composition | | Coating method | | | Baking treatment | | |
|---|---|---|---|---|---|---|---|---|---|
| | | Metal nanoparticles | Additives | Transparent conductive film | Conductive reflective film | Substrate | Temperature [° C.] | Time [min.] | Atmosphere |
| Example A22 | A3 | Ag 95% by mass | PVP 4% by mass MoO₂ 1% by mass | Spin coating | | PET | 150 | 20 | air |
| Example A23 | A3 | Ag 95% by mass | PVP 4% by mass SnO₂ 1% by mass | Spin coating | | PET | 150 | 20 | air |
| Example A24 | A3 | Ag 95% by mass | PVP 4% by mass ITO 1% by mass | Spin coating | | PET | 150 | 20 | air |
| Example A25 | A3 | Ag 95% by mass | PVP 4% by mass ATO 1% by mass | Spin coating | | PET | 150 | 20 | air |
| Example A26 | A3 | Ag 95% by mass | PVP 4% by mass Methyl silicate 1% by mass | Spin coating | | PET | 150 | 20 | air |
| Example A27 | A7 | Ag 95% by mass | PVP 4% by mass Titanium isopropoxide 1% by mass | Spin coating | | PET | 150 | 20 | air |
| Example A28 | A7 | Ag 95% by mass | PVP 4% by mass Ammonium chromate 1% by mass | Spin coating | | PET | 150 | 20 | air |
| Example A29 | A7 | Ag 95.9% by mass | PVP 4% by mass Mn formate 0.1% by mass | Spin coating | | PET | 150 | 20 | air |
| Example A30 | A7 | Ag 95-9% by mass | PVP 4% by mass Fe citrate 0.1% by mass | Spin coating | | PET | 150 | 20 | air |

TABLE 4

| | Transparent conductive film composition Classification | Conductive reflective film composition | | Coating method | | | Baking treatment | | |
|---|---|---|---|---|---|---|---|---|---|
| | | Metal nanoparticles | Additives | Transparent conductive film | Conductive reflective film | Substrate | Temperature [° C.] | Time [min.] | Atmosphere |
| Example A31 | A7 | Ag 95.9% by mass | PVP 4% by mass Co formate 0.01% by mass | Spin coating | | PET | 200 | 20 | air |
| Example A32 | A8 | Ag 95% by mass | Ni acetate 5% by mass | Spin coating | | PET | 150 | 20 | air |
| Example A33 | A8 | Ag 95% by mass | PVP 4% by mass Ag citrate 1% by mass | Spin coating | | PET | 150 | 20 | air |
| Example A34 | A8 | Ag 95% by mass | Cu acetate 5% by mass | Spin coating | | PET | 150 | 20 | $N_2$ |
| Example A35 | A8 | Ag 95% by mass | Zn acetate 5% by mass | Spin coating | | PET | 150 | 20 | air |
| Example A36 | A8 | Ag 95% by mass | Mn acetate 5% by mass | Spin coating | | PET | 150 | 20 | air |
| Example A37 | A8 | Ag 95% by mass | Sn acetate 5% by mass | Die coating | | PET | 150 | 20 | air |
| Comparative example A1 | ITO sputter film | Ag 94% by mass | PVP 5% by mass Ni acetate 1% by mass | Sputter | Spin coating | Glass | 200 | 20 | air |
| Comparative example A2 | ITO sputter film | Ag 94% by mass | PVP 5% by mass Ni acetate 1% by mass | Sputter | Spin coating | Glass | 200 | 20 | air |

<Comparative Test A1>

The reflectance and film thickness of the second transparent conductive film within each of the composite films obtained in examples A1 to A37 and comparative examples A1 and A2 were evaluated. The results of the evaluations are listed below in Table 5 and Table 6. First, the thicknesses of the second transparent conductive film and the conductive reflective film following baking were measured directly from a film cross-section obtained using a SEM (scanning electron microscope S800, manufactured by Hitachi, Ltd.).

<Comparative Test A2>

Each of the substrates having a conductive reflective film formed thereon obtained in examples A1 to A37 and comparative examples A1 and A2 was evaluated for the distribution of holes at the substrate-side contact surface of the conductive reflective film, the back side reflectance and the thickness of the conductive reflective film. The results of these evaluations are listed below in Table 5 and Table 6.

Measurement of the holes was conducted using different methods, depending on whether or not the conductive reflective film was able to be pulled away from the second transparent conductive film.

In those examples where the conductive reflective film was able to be pulled away from the substrate, first, an adhesive was applied to a jig having a flat surface, and the jig was pressed against the conductive reflective film bonded to the second transparent conductive film. Following a holding period to allow the adhesive to dry and generate a powerful adhesion, the jig was pulled perpendicularly away from the substrate using a pull tester (EZ-TEST, manufactured by Shimadzu Corporation), thereby pulling the conductive reflective film away from the second transparent conductive film.

Subsequently, the uneven surface of the conductive reflective film exposed on the jig that had been peeled away from the second transparent conductive film, which prior to peeling was the substrate-side contact surface of the conductive reflective film, was inspected using an atomic force microscope (AFM). The uneven surface was analyzed, and the average diameter, average depth and number density of the holes that appeared at the film surface were evaluated. The average diameter was determined by measuring the maximum length and minimum length across each opening, and calculating the average value.

Further, another method of pulling the conductive reflective film away from the second transparent conductive film, in which a double-sided tape was bonded to the conductive reflective film, and one end of this tape was then pulled up, thereby peeling the conductive reflective film away from the second conductive reflective film, was also used.

In those examples where the conductive reflective film was not able to be pulled away from the second transparent conductive film, first the conductive reflective film bonded to the second transparent conductive film was processed using a focused ion beam (FIB) to expose a cross-section of the sample. This sample cross-section was inspected using a scanning electron microscope (SEM), and the shape of the metal film/substrate interface was observed. The diameter, average depth and number density of openings within this interface image were evaluated. For each of the evaluated openings, the diameter was taken as being the maximum length across the opening within the cross-sectional image.

Evaluation of the back side reflectance of the conductive reflective film was performed using a combination of an ultraviolet-visible spectrophotometer and an integrating sphere, by measuring the diffuse reflectance of the conductive reflective film at wavelengths of 500 nm and 1,100 nm.

The film thickness of the conductive reflective film was measured from a cross-sectional image obtained using a scanning electron microscope (SEM).

<Comparative Test A3>

The adhesion to the substrate of each of the composite films obtained in examples A1 to A37 and comparative examples A1 and A2 was evaluated. The results of the evaluations are listed in Table 5 and Table 6. The adhesion was evaluated qualitatively on the basis of a peel test in which an adhesive tape was bonded to, and then peeled from, the composite film formed on the substrate. A result of "good" was recorded in those cases where only the adhesive tape peeled from the substrate, a result of "fair" was recorded in those cases where a mixed state was obtained in which only the adhesive tape peeled in some portions and the substrate surface was exposed in other portions, and a result of "poor" was recorded in those cases where peeling of the adhesive tape exposed the entire substrate surface.

TABLE 5

| | Composite film | | | | | | | |
| --- | --- | --- | --- | --- | --- | --- | --- | --- |
| | | Conductive reflective film | | | | | | |
| | Transparent | Hole distribution at substrate-side contact surface | | | Back side reflectance [%] | | | |
| | conductive film Thickness [nm] | Average diameter [nm] | Average depth [nm] | Number density [holes/µm$^2$] | 500 nm | 1100 nm | Thickness [nm] | Adhesion |
| Example A1 | $1.0 \times 10^2$ | 70 | 70 | 20 | 85 | 94 | $1.0 \times 10^2$ | Good |
| Example A2 | $1.0 \times 10^2$ | 80 | 50 | 10 | 84 | 94 | $5.0 \times 10^2$ | Good |
| Example A3 | $1.0 \times 10^2$ | 89 | 50 | 10 | 80 | 91 | $1.0 \times 10^3$ | Good |
| Example A4 | $1.3 \times 10^2$ | 70 | 90 | 5 | 82 | 93 | $1.1 \times 10^3$ | Good |
| Example A5 | $1.3 \times 10^2$ | 90 | 50 | 10 | 82 | 92 | $1.0 \times 10^3$ | Good |
| Example A6 | $1.0 \times 10^2$ | 90 | 70 | 20 | 83 | 94 | $1.2 \times 10^3$ | Good |
| Example A7 | $1.0 \times 10^2$ | 80 | 60 | 15 | 84 | 94 | $1.0 \times 10^3$ | Good |
| Example A8 | $1.0 \times 10^2$ | 70 | 45 | 22 | 91 | 95 | $1.0 \times 10^3$ | Good |
| Example A9 | $1.0 \times 10^2$ | 90 | 70 | 16 | 85 | 94 | $1.9 \times 10^3$ | Good |
| Example A10 | $1.0 \times 10^2$ | 80 | 60 | 20 | 84 | 95 | $1.8 \times 10^3$ | Good |
| Example A11 | $1.0 \times 10^2$ | 70 | 50 | 20 | 84 | 94 | $2.0 \times 10^3$ | Good |
| Example A12 | $1.0 \times 10^2$ | 60 | 90 | 10 | 82 | 93 | $2.0 \times 10^3$ | Good |
| Example A13 | $1.0 \times 10^2$ | 50 | 95 | 5 | 87 | 95 | $2.0 \times 10^3$ | Good |
| Example A14 | $1.0 \times 10^2$ | 90 | 80 | 20 | 85 | 82 | $1.9 \times 10^3$ | Good |
| Example A15 | $1.0 \times 10^2$ | 70 | 60 | 25 | 84 | 94 | $1.0 \times 10^3$ | Good |
| Example A16 | $1.0 \times 10^2$ | 80 | 65 | 15 | 80 | 95 | $1.1 \times 10^3$ | Good |
| Example A17 | $1.0 \times 10^2$ | 90 | 60 | 20 | 91 | 91 | $1.0 \times 10^3$ | Good |
| Example A18 | $1.0 \times 10^2$ | 40 | 50 | 10 | 92 | 92 | $1.2 \times 10^3$ | Good |
| Example A19 | $1.0 \times 10^2$ | 30 | 30 | 10 | 94 | 94 | $1.2 \times 10^3$ | Good |
| Example A20 | $1.0 \times 10^2$ | 50 | 50 | 10 | 91 | 92 | $1.0 \times 10^3$ | Good |

TABLE 6

| | Composite film | | | | | | | |
|---|---|---|---|---|---|---|---|---|
| | Conductive reflective film | | | | | | | |
| | Transparent conductive film Thickness | Hole distribution at substrate-side contact surface | | | Back side reflectance [%] | | Thickness | Adhesion |
| | | Average diameter | Average depth | Number density | | | | |
| | [nm] | [nm] | [nm] | [holes/μm²] | 500 nm | 1100 nm | [nm] | |
| Example A21 | $1.0 \times 10^2$ | 80 | 80 | 20 | 82 | 88 | $1.0 \times 10^3$ | Good |
| Example A22 | $1.0 \times 10^2$ | 90 | 90 | 28 | 81 | 82 | $1.0 \times 10^3$ | Good |
| Example A23 | $1.0 \times 10^2$ | 80 | 75 | 25 | 82 | 82 | $1.0 \times 10^3$ | Good |
| Example A24 | $1.0 \times 10^2$ | 50 | 90 | 20 | 82 | 85 | $1.1 \times 10^3$ | Good |
| Example A25 | $1.0 \times 10^2$ | 70 | 80 | 15 | 83 | 85 | $1.0 \times 10^3$ | Good |
| Example A26 | $1.0 \times 10^2$ | 60 | 90 | 20 | 83 | 85 | $1.1 \times 10^3$ | Good |
| Example A27 | $1.0 \times 10^2$ | 40 | 50 | 15 | 82 | 84 | $1.0 \times 10^3$ | Good |
| Example A28 | $0.7 \times 10^2$ | 95 | 95 | 12 | 80 | 89 | $1.1 \times 10^3$ | Good |
| Example A29 | $0.7 \times 10^2$ | 80 | 85 | 5 | 85 | 88 | $1.0 \times 10^3$ | Good |
| Example A30 | $0.7 \times 10^2$ | 55 | 80 | 10 | 89 | 90 | $1.0 \times 10^3$ | Good |
| Example A31 | $0.7 \times 10^2$ | 50 | 90 | 5 | 88 | 91 | $1.2 \times 10^3$ | Good |
| Example A32 | $0.7 \times 10^2$ | 80 | 80 | 10 | 86 | 87 | $1.1 \times 10^3$ | Good |
| Example A33 | $0.7 \times 10^2$ | 70 | 60 | 15 | 88 | 88 | $1.0 \times 10^3$ | Good |
| Example A34 | $0.7 \times 10^2$ | 90 | 60 | 20 | 85 | 86 | $1.0 \times 10^3$ | Good |
| Example A35 | $0.7 \times 10^2$ | 80 | 90 | 10 | 82 | 85 | $1.0 \times 10^3$ | Good |
| Example A36 | $0.7 \times 10^2$ | 80 | 70 | 20 | 82 | 89 | $1.1 \times 10^3$ | Good |
| Example A37 | $0.7 \times 10^2$ | 90 | 50 | 10 | 84 | 88 | $1.0 \times 10^3$ | Good |
| Comparative example A1 | $0.7 \times 10^2$ | 70 | 70 | 20 | 70 | 80 | $1.0 \times 10^2$ | Good |
| Comparative example A2 | $2.0 \times 10^2$ | 70 | 70 | 20 | 75 | 90 | $1.0 \times 10^3$ | Fair |

As is evident from Table 5 and Table 6, of the comparative examples A1 and A2 in which the second transparent conductive film was formed by a sputtering method that represents a vacuum deposition method, comparative example A2 exhibited inferior adhesion to examples A1 to A37. In comparative example A1, the reflectance at 500 nm was a low value of only 70%, and even at 1,100 nm, the reflectance tended to be low. Furthermore, although the reflectance at 1,100 nm in comparative example A2 was a high value of 90%, the reflectance at 500 nm was a comparatively low value of only 75%, confirming that the reflectance varied considerably depending on the wavelength. In contrast, in examples A1 to A37, high reflectance values of not less than 80% were achieved at both the 500 nm wavelength and the 1,100 nm wavelength.

Examples B1 to B32

Conductive oxide microparticles dispersions and binder dispersions were prepared using the components and amounts listed for the classifications B1 to B8 detailed below in Table 7. The classification numbers from Table 7 for the dispersions used within the various examples are listed in Table 8 and Table 9.

In classification B1, as detailed below in Table 7, a total of 60 g of a mixture composed of 20% by mass of an IZO powder having an average particle size of 0.025 μm as conductive oxide microparticles and 80% by mass of isopropanol as a dispersion medium was placed in a 100 cc glass bottle, and using 100 g of zirconia beads with a diameter of 0.3 mm (MICRO HICA, manufactured by Showa Shell Sekiyu K.K.), the mixture was dispersed for 6 hours using a paint shaker, thus yielding a dispersion of conductive oxide microparticles. Further, in a separate preparation, 10% by mass of a mixed liquid of the non-polymeric binders 2-n-butoxyethanol and 3-isopropyl-2,4-pentanedione as the binder, 88.2% by mass of isopropanol as a dispersion medium, and 1.8% by mass of a mixture of indium nitrate and lead acetate (mass ratio 1:1) as a resistance reducer were combined and stirred for one hour at room temperature at a rotational rate of 200 rpm, thus forming a binder dispersion.

In classification B2, as detailed below in Table 7, a dispersion of conductive oxide microparticles was prepared in the same manner as the classification B1, using a mixture composed of 7.5% by mass of an ITO powder having an average particle size of 0.025 μm as the conductive oxide microparticles, 0.2% by mass of a titanium coupling agent represented by the above formula (9) as a coupling agent, and 92.3% by mass of a first mixed liquid composed of isopropanol, ethanol and N,N-dimethylformamide (mass ratio 4:2:1) as a dispersion medium. Further, a binder dispersion was prepared in the same manner as the classification B1, using 10% by mass of the non-polymeric binder 2,4-pentanedione as the binder and 90% by mass of the above first mixed liquid as a dispersion medium.

In classification B3, as detailed below in Table 7, a dispersion of conductive oxide microparticles was prepared in the same manner as the classification B1, using a mixture composed of 10% by mass of an ATO powder having an average particle size of 0.025 μm as the conductive oxide microparticles, 0.02% by mass of a titanium coupling agent represented by the above formula (9) as a coupling agent, and 89.98% by mass of the above first mixed liquid as a dispersion medium. Further, a binder dispersion was prepared in the same manner as the classification B1, using 10% by mass of the non-polymeric binder 2-n-propoxyethanol as the binder and 90% by mass of the above first mixed liquid as a dispersion medium.

In classification B4, as detailed below in Table 7, a dispersion of conductive oxide microparticles was prepared in the same manner as the classification B1, using a mixture composed of 10% by mass of an AZO powder having an average particle size of 0.025 μm as the conductive oxide microparticles, 1% by mass of a titanium coupling agent represented by the above formula (8) as a coupling agent, and 89% by mass of the above first mixed liquid as a dispersion medium. Further, a binder dispersion was prepared in the same manner as the classification B1, using 10% by mass of a mixed liquid of 2,2-dimethyl-3,5-hexanedione and isopropyl acetate (mass ratio 1:1) as the binder, and 90% by mass of the above first mixed liquid as a dispersion medium.

In classification B5, as detailed below in Table 7, a dispersion of conductive oxide microparticles was prepared in the same manner as the classification B1, using a mixture composed of 5% by mass of a TZO powder having an average particle size of 0.025 μm as the conductive oxide microparticles, 0.5% by mass of a titanium coupling agent represented by the above formula (10) as a coupling agent, and 94.5% by mass of the above first mixed liquid as a dispersion medium. Further, a binder dispersion was prepared in the same manner as the classification B1, using 10% by mass of a mixed liquid of 2-isobutoxyethanol, 2-hexyloxyethanol and n-propyl acetate (mass ratio 4:1:1) as the binder, and 90% by mass of the above first mixed liquid as a dispersion medium.

In classification B6, first, an ATO powder having an average particle size of 0.010 μm was suspended in water, the pH of the suspension was adjusted to a value of 7, and the suspension was treated for 30 minutes using a beads mill. The above first mixed liquid was added to the treated suspension as a dispersion medium, and the solid fraction concentration was adjusted to 18.5%, thus yielding a dispersion of conductive oxide microparticles. Further, a mixture containing 5% of gelatin as a binder, 1% by mass of hydroxypropylcellulose as a water-soluble cellulose derivative, and 94% by mass of water as the dispersion medium was stirred for one hour at a temperature of 30° C. at a rotational rate of 200 rpm, thus forming a binder dispersion.

In classification B7, as detailed below in Table 7, a dispersion of conductive oxide microparticles was prepared in the same manner as the classification B1, using a mixture composed of 6% by mass of an ATO powder having an average particle size of 0.025 μm as the conductive oxide microparticles, 85% by mass of a second mixed liquid composed of ethanol and butanol (mass ratio 98:2) as a dispersion medium, and 9.0% by mass of a titanium coupling agent represented by the above formula (8) as a coupling agent. Further, in a separate preparation, a binder dispersion was prepared by mixing 10% by mass of a $SiO_2$ binding agent as a binder and 90% by mass of the above second mixed liquid as a dispersion medium. The $SiO_2$ binding agent used as a binder was prepared using a 500 ml four-neck glass flask, by charging the flask with 140 g of tetraethoxysilane and 240 g of ethyl alcohol, adding 1.0 g of 12N-HCl dissolved in 25 g of pure water in a single batch with constant stirring, and then reacting the resulting mixture for 6 hours at 80° C.

In classification B8, as detailed below in Table 7, a dispersion of conductive oxide microparticles was prepared in the same manner as the classification B1, using 8% by mass of an ITO powder having an average particle size of 0.025 μm as the conductive oxide microparticles, 2.0% by mass of a titanium coupling agent represented by the above formula (7) as a coupling agent, and 90% by mass of the above second mixed liquid as a dispersion medium. Further, in a separate preparation, a binder dispersion was prepared by mixing 10% by mass of a $SiO_2$ binding agent as a binder and 90% by mass of the above second mixed liquid as a dispersion medium.

Next, using the procedure described below, conductive reflective film compositions were prepared.

First, silver nitrate was dissolved in deionized water to prepare a metal salt aqueous solution. Further, in a separate preparation, sodium citrate was dissolved in deionized water to prepare an aqueous solution of sodium citrate having a concentration of 26% by mass. A particulate ferrous sulfate was then added directly to, and dissolved in, the sodium citrate aqueous solution under a stream of nitrogen gas held at a temperature of 35° C., thus preparing a reducing agent aqueous solution containing a 3:2 molar ratio of citrate ions and ferrous ions.

Subsequently, with the stream of nitrogen gas held at 35° C., a magnetic stirrer bar was placed in the reducing agent aqueous solution, and with the reducing agent aqueous solution undergoing constant stirring by rotating the stirrer bar at a rate of 100 rpm, the metal salt aqueous solution was added dropwise to the reducing agent aqueous solution and mixed thoroughly. For this addition, the concentration of each of the solutions was altered so that the amount of the metal salt aqueous solution added to the reducing agent aqueous solution was not more than $\frac{1}{10}$th of the amount of the reducing agent aqueous solution, thereby ensuring that the reaction temperature was maintained at 40° C. even though the added metal salt aqueous solution was at room temperature. Furthermore, the mixing ratio between the reducing agent aqueous solution and the metal salt aqueous solution was adjusted so that the molar ratios of both the citrate ions and the ferrous ions within the reducing agent aqueous solution, relative to the total atomic valence number of metal ions within the metal salt aqueous solution, was a 3-fold molar excess. Following completion of the dropwise addition of the metal salt aqueous solution to the reducing agent aqueous solution, stirring of the resulting mixed liquid was continued for a further 15 minutes, thereby generating metal particles within the mixed liquid and forming a metal particles dispersion containing dispersed metal particles. The pH of the metal particles dispersion was 5.5, and the stoichiometric amount of generated metal particles within the dispersion was 5 g/liter.

The thus obtained dispersion was left to stand at room temperature to allow the metal particles within the dispersion to settle out, and the settled metal particle aggregates were isolated by decantation. Deionized water was added to the isolated metal aggregates to form a dispersion, a demineralization treatment was conducted using ultrafiltration, and displacement washing was then performed using methanol, so as to achieve a metal (silver) content of 50% by mass. Subsequently, by using a centrifugal separator with appropriate adjustment of the centrifugal power to separate the comparatively large silver particles having a particle size exceeding 100 nm, a sample was prepared in which silver particles having a primary particle size within a range from 10 to 50 nm represented a number average of 71%. In other words, the silver nanoparticles were prepared such that relative to 100% of all the silver nanoparticles, the proportion of silver nanoparticles having a primary particle size within a range from 10 to 50 nm was a number average of 71%. The thus obtained silver nanoparticles were chemically modified with a protective agent having an organic molecular main chain with a carbon skeleton containing 3 carbon atoms.

Next, 10 parts by mass of the obtained metal nanoparticles were added to and dispersed within 90 parts by mass of a mixed solution of ethanol and methanol, and by subsequently adding the additives listed below in Table 8 to Table 10 in the proportions shown in Table 8 to Table 10, a series of conductive reflective film compositions was obtained. The metal nanoparticles used in forming these conductive reflective film compositions contained at least 75% of silver nanoparticles.

In those cases where silver nanoparticles and metal nanoparticles other than silver nanoparticles were combined as the metal nanoparticles, then the dispersion containing silver nanoparticles produced using the above method was deemed the first dispersion, a dispersion containing metal nanoparticles other than silver nanoparticles was prepared using the same method as the above method used for producing the silver nanoparticles, but with the exception of replacing the silver nitrate with a metal salt listed in Table 8 to Table 10 that is capable of forming metal nanoparticles other than silver nanoparticles, and this dispersion of metal nanoparticles was deemed the second dispersion, and the first dispersion and second dispersion were then mixed together, prior to the addition of additives, in the proportions listed in Table 8 to Table 10, thus forming a conductive reflective film composition.

Finally, composite films were formed using the conductive oxide microparticles dispersions, binder dispersions and conductive reflective film compositions prepared above. Specifically, one of the prepared dispersions of conductive oxide microparticles was applied to the substrate listed in Table 8 to Table 10 using one of a variety of different coating methods in an amount sufficient to generate a film thickness following baking of 0.01 to 0.5 μm, and was then dried at a temperature of 25° C. for 5 minutes to form a coating of the conductive oxide microparticles. Next, this coating of conductive oxide microparticles was impregnated with one of the prepared binder dispersions using one of a variety of different coating methods so that, following baking, the entire surface of the conductive oxide microparticles layer was covered with the binder layer, and the binder dispersion was then dried at a temperature of 25° C. for 5 minutes to form a transparent conductive coating. The binder dispersion was applied in such a manner that the mass of the binder component within the binder dispersion, relative to the total mass of microparticles contained within the applied coating of the conductive oxide microparticles was a mass ratio (mass of binder component within applied binder dispersion/mass of conductive oxide microparticles) listed in Table 8 to Table 10. Subsequently, one of the prepared conductive reflective film compositions was applied to the transparent conductive coating using one of a variety of different coating methods in an amount sufficient to generate a film thickness following baking of 0.05 to 2.0 μm, and was then dried at a temperature of 25° C. for 5 minutes to form a conductive reflective coating. By subsequently performing baking under the conditions detailed in Table 8 to Table 10, a composite film was formed on the substrate.

In Table 8 to Table 10, PVP represents a polyvinylpyrrolidone having a Mw of 360,000, and PET represents a polyethylene terephthalate.

Comparative Example B1

A second transparent conductive film was formed with a thickness of $0.7 \times 10^2$ nm using a sputtering method that represents an example of a vacuum deposition method, and a conductive reflective film was then formed on top of this second transparent conductive film, using the same conductive reflective film composition as that used in example B1 and the same method as that used in example B1, thus forming a composite film.

Comparative Example B2

A second transparent conductive film was formed with a thickness of $2.0 \times 10^2$ nm using a sputtering method that represents an example of a vacuum deposition method, and a conductive reflective film was then formed on top of this second transparent conductive film, using the same conductive reflective film composition as that used in example B1 and the same method as that used in example B1, thus forming a composite film.

TABLE 7

| | Conductive oxide microparticles dispersion | | | Binder dispersion | | |
|---|---|---|---|---|---|---|
| Classification | Conductive oxide microparticles | Dispersion medium | Coupling agent | Binder | Dispersion medium | Other |
| B1 | IZO 20% by mass | Isopropanol 80% by mass | None | Non-polymeric binder 10% by mass | Isopropanol 88.2% by mass | Resistance reducer 1.8% by mass |
| B2 | ITO 7.5% by mass | First mixed liquid 92.3% by mass | Titanium coupling agent 0.2% by mass | Non-polymeric binder 10% by mass | First mixed liquid 90% by mass | None |
| B3 | ATO 10% by mass | First mixed liquid 89.98% by mass | Titanium coupling agent 0.02% by mass | Non-polymeric binder 10% by mass | First mixed liquid 90% by mass | None |
| B4 | AZO 10% by mass | First mixed liquid 89% by mass | Titanium coupling agent 1% by mass | Non-polymeric binder 10% by mass | First mixed liquid 90% by mass | None |
| B5 | TZO 5% by mass | First mixed liquid 94.5% by mass | Titanium coupling agent 0.5% by mass | Non-polymeric binder 10% by mass | First mixed liquid 90% by mass | None |
| B6 | ATO 18.5% by mass | First mixed liquid 81.5% by mass | None | Gelatin 5% by mass | Water 94% by mass | Water-soluble cellulose derivative 1% by mass |
| B7 | ATO 6% by mass | Second mixed liquid 85% by mass | Titanium coupling agent 9.0% by mass | SiO$_2$ binding agent 10% by mass | Second mixed liquid 90% by mass | None |
| B8 | ITO 8% by mass | Second mixed liquid 90% by mass | Titanium coupling agent 2.0% by mass | SiO$_2$ binding agent 10% by mass | Second mixed liquid 90% by mass | None |

TABLE 8

| | Dispersion | | Conductive reflective film composition | | Coating method | | Substrate | Baking treatment | | |
|---|---|---|---|---|---|---|---|---|---|---|
| | Classification | Mass ratio [%] | Metal nanoparticles | Additives | Transparent conductive film | Conductive reflective film | | Temperature [° C.] | Time [min.] | Atmosphere |
| Example B1 | B1 | 55 | Ag 94% by mass | PVP 5% by mass<br>Ni acetate 1% by mass | | Spin coating | Glass | 200 | 20 | air |
| Example B2 | B2 | 60 | Ag 96% by mass | PVP 3% by mass<br>Cu acetate 1% by mass | | Spin coating | Glass | 200 | 20 | air |
| Example B3 | B3 | 70 | Ag 89% by mass<br>Au 5% by mass | PVP-dimethylaminoethyl methacrylate 5% by mass<br>Zn acetate 1% by mass | | Spin coating | Glass | 200 | 20 | air |
| Example B4 | B6 | 80 | Ag 72% by mass<br>Pd 24% by mass | Methylcellulose 3% by mass<br>Mo acetate 1% by mass | | Spin coating | Glass | 200 | 20 | air |
| Example B5 | B6 | 100 | Ag 94% by mass<br>Ru 2% by mass | Hydroxypropylmethyl-cellulose 3% by mass<br>Sn acetate 1% by mass | | Spin coating | Glass | 200 | 20 | air |
| Example B6 | B4 | 120 | Ag 92% by mass<br>Cu 4% by mass | PVP 3% by mass<br>Sn acetate 1% by mass | | Dispenser coating | Glass | 130 | 20 | $N_2$ |
| Example B7 | B5 | 75 | Ag 95.8% by mass<br>Sn 0.2% by mass | PVP 3% by mass<br>Sn acetate 1% by mass | | Dispenser coating | Glass | 200 | 20 | air |
| Example B8 | B1 | 95 | Ag 96.8% by mass<br>In 0.2% by mass | PVP 2% by mass<br>Sn acetate 1% by mass | | Dispenser coating | Glass | 130 | 20 | air |
| Example B9 | B1 | 110 | Ag 95.8% by mass<br>Zn 0.2% by mass | PVP 3% by mass<br>Sn acetate 1% by mass | | Offset printing | Glass | 320 | 20 | air |
| Example B10 | B1 | 60 | Ag 95.8% by mass<br>Fe 0.2% by mass | PVP 3% by mass<br>Zn acetate 1% by mass | | Offset printing | Glass | 320 | 20 | air |
| Example B11 | B1 | 70 | Ag 95.8% by mass<br>Fe 0.2% by mass | PVP 3% by mass<br>Ni acetate 1% by mass | | Screen printing | Glass | 150 | 20 | air |
| Example B12 | B1 | 90 | Ag 96.8% by mass<br>Mn 0.2% by mass | PVP 3% by mass | | Screen printing | Glass | 150 | 20 | air |
| Example B13 | B2 | 120 | Ag 90% by mass | PVP 9% by mass<br>$Al_2O_3$ 1% by mass | | Knife coating | Glass | 150 | 60 | air |
| Example B14 | B2 | 80 | Ag 99% by mass | PVP 0.9% by mass<br>$SiO_2$ 0.1% by mass | | Slit coating | Glass | 400 | 60 | air |
| Example B15 | B2 | 70 | Ag 95% by mass | PVP 4% by mass<br>$TiO_2$ 1% by mass | | Spin coating | Glass | 150 | 20 | air |

TABLE 9

| | Dispersion | | Conductive reflective film composition | | Coating method | | Substrate | Baking treatment | | |
|---|---|---|---|---|---|---|---|---|---|---|
| | Classification | Mass ratio [%] | Metal nanoparticles | Additives | Transparent conductive film | Conductive reflective film | | Temperature [° C.] | Time [min.] | Atmosphere |
| Example B16 | B2 | 95 | Ag 95% by mass | PVP 4% by mass<br>$Cr_2O_3$ 1% by mass | | Spin coating | Glass | 150 | 20 | air |
| Example B17 | B2 | 75 | Ag 95% by mass | PVP 4% by mass<br>$MnO_2$ 1% by mass | | Spin coating | Glass | 150 | 20 | air |
| Example B18 | B2 | 65 | Ag 95% by mass | PVP 4% by mass<br>$Fe_2O_3$ 0.5% by mass<br>$Cr_3O_4$ 0.5% by mass | | Spin coating | Glass | 150 | 20 | air |
| Example B19 | B2 | 85 | Ag 95% by mass | PVP 4% by mass<br>$Ag_2O$ 1% by mass | | Spin coating | Glass | 150 | 20 | air |
| Example B20 | B3 | 105 | Ag 95% by mass | PVP 4% by mass<br>$Cu(OH)_2$ 1% by mass | | Spin coating | Glass | 150 | 20 | Ar |
| Example B21 | B3 | 75 | Ag 95% by mass | PVP 4% by mass<br>ZnO 1% by mass | | Spin coating | PET | 150 | 20 | air |
| Example B22 | B3 | 80 | Ag 95% by mass | PVP 4% by mass<br>$MoO_2$ 1% by mass | | Spin coating | PET | 150 | 20 | air |
| Example B23 | B3 | 75 | Ag 95% by mass | PVP 4% by mass<br>$SnO_2$ 1% by mass | | Spin coating | PET | 150 | 20 | air |
| Example B24 | B3 | 65 | Ag 95% by mass | PVP 4% by mass<br>ITO 1% by mass | | Spin coating | PET | 150 | 20 | air |
| Example B25 | B3 | 55 | Ag 95% by mass | PVP 4% by mass<br>ATO 1% by mass | | Spin coating | PET | 150 | 20 | air |
| Example B26 | B3 | 65 | Ag 95% by mass | PVP 4% by mass<br>Methyl silicate 1% by mass | | Spin coating | PET | 150 | 20 | air |
| Example B27 | B7 | 55 | Ag 95% by mass | PVP 4% by mass<br>Titanium isopropoxide 1% by mass | | Spin coating | PET | 150 | 20 | air |

TABLE 9-continued

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example B28 | B7 | 70 | Ag 95% by mass | PVP 4% by mass Ammonium chromate 1% by mass | Spin coating | | PET | 150 | 20 | air |
| Example B29 | B7 | 85 | Ag 95.9% by mass | PVP 4% by mass Mn formate 0.1% by mass | Spin coating | | PET | 150 | 20 | air |
| Example B30 | B7 | 90 | Ag 95.9% by mass | PVP 4% by mass Fe citrate 0.1% by mass | Spin coating | | PET | 150 | 20 | air |

TABLE 10

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example B31 | B7 | 85 | Ag 95.9% by mass | PVP 4% by mass Co formate 0.1% by mass | Spin coating | | PET | 200 | 20 | air |
| Example B32 | B8 | 75 | Ag 95% by mass | Ni acetate 5% by mass | Spin coating | | PET | 150 | 20 | air |
| Example B33 | B8 | 65 | Ag 95% by mass | PVP 4% by mass Ag citrate 1% by mass | Spin coating | | PET | 150 | 20 | air |
| Example B34 | B8 | 60 | Ag 95% by mass | Cu acetate 5% by mass | Spin coating | | PET | 150 | 20 | $N_2$ |
| Example B35 | B8 | 70 | Ag 95% by mass | Zn acetate 5% by mass | Spin coating | | PET | 150 | 20 | air |
| Example B36 | B8 | 80 | Ag 95% by mass | Mn acetate 5% by mass | Spin coating | | PET | 150 | 20 | air |
| Example B37 | B8 | 90 | Ag 95% by mass | Sn acetate 5% by mass | Die coating | | PET | 150 | 20 | air |
| Comparative example B1 | ITO sputter film | | Ag 94% by mass | PVP 5% by mass Ni acetate 1% by mass | Sputter | Spin coating | Glass | 200 | 20 | air |
| Comparative example B2 | ITO sputter film | | Ag 94% by mass | PVP 5% by mass Ni acetate 1% by mass | Sputter | Spin coating | Glass | 200 | 20 | air |

<Comparative Test B1>

The film thickness of the second transparent conductive film within each of the composite films obtained in examples B1 to B37 and comparative examples B1 and B2 was evaluated. The results of the evaluations are listed below in Table 11 and Table 12. Specifically, the thickness of the second transparent conductive film following baking was measured directly from a film cross-section obtained using a SEM (scanning electron microscope S800, manufactured by Hitachi, Ltd.).

<Comparative Test B2>

Each of the substrates having a conductive reflective film formed thereon obtained in examples B1 to B37 and comparative examples B1 and B2 was evaluated for the distribution of holes at the substrate-side contact surface of the conductive reflective film, the back side reflectance and the thickness of the conductive reflective film. The results of these evaluations are listed below in Table 11 and Table 12.

Measurement of the holes was conducted using different methods, depending on whether or not the conductive reflective film was able to be pulled away from the second transparent conductive film.

In those examples where the conductive reflective film was able to be pulled away from the second transparent conductive film, first, an adhesive was applied to a jig having a flat surface, and the jig was pressed against the conductive reflective film bonded to the second transparent conductive film. Following a holding period to allow the adhesive to dry and generate a powerful adhesion, the jig was pulled perpendicularly away from the second transparent conductive film using a pull tester (EZ-TEST, manufactured by Shimadzu Corporation), thereby pulling the conductive reflective film away from the second transparent conductive film.

Subsequently, the uneven surface of the conductive reflective film exposed on the jig that had been peeled away from the second transparent conductive film, which prior to peeling was the substrate-side contact surface of the conductive reflective film, was inspected using an atomic force microscope (AFM). The uneven surface was analyzed, and the average diameter, average depth and number density of the holes that appeared at the film surface were evaluated. The average diameter was determined by measuring the maximum length and minimum length across each opening, and calculating the average value.

Further, another method of pulling the conductive reflective film away from the second transparent conductive film, in which a double-sided tape was bonded to the conductive reflective film, and one end of this tape was then pulled up, thereby peeling the conductive reflective film away from the second conductive reflective film, was also used.

In those examples where the conductive reflective film was not able to be pulled away from the second transparent conductive film, first the conductive reflective film bonded to the second transparent conductive film was processed using a focused ion beam (FIB) to expose a cross-section of the sample. This sample cross-section was inspected using a scanning electron microscope (SEM), and the shape of the interface between the conductive reflective film and the second transparent conductive film was observed. The diameter, average depth and number density of openings within this interface image were evaluated. For each of the evaluated openings, the diameter was taken as being the maximum length across the opening within the cross-sectional image.

Evaluation of the back side reflectance of the conductive reflective film was performed using a combination of an ultraviolet-visible spectrophotometer and an integrating sphere, by measuring the diffuse reflectance of the conductive reflective film at wavelengths of 500 nm and 1,100 nm.

The film thickness of the conductive reflective film was measured from a cross-sectional image obtained using a scanning electron microscope (SEM).

<Comparative Test B3>

The adhesion to the substrate of each of the composite films obtained in examples B1 to B37 and comparative examples B1 and B2 was evaluated. The results of the evaluations are listed in Table 11 and Table 12. The adhesion was evaluated qualitatively on the basis of a peel test in which an adhesive tape was bonded to, and then peeled from, the composite film formed on the substrate. A result of "good" was recorded in those cases where only the adhesive tape peeled from the substrate, a result of "fair" was recorded in those cases where a mixed state was obtained in which only the adhesive tape peeled in some portions and the substrate surface was exposed in other portions, and a result of "poor" was recorded in those cases where peeling of the adhesive tape exposed the entire substrate surface.

TABLE 11

| | | Composite film | | | | | | |
|---|---|---|---|---|---|---|---|---|
| | | Conductive reflective film | | | | | | |
| | Transparent conductive film Thickness [nm] | Hole distribution at substrate-side contact surface | | | Back side reflectance [%] | | Thickness [nm] | Adhesion |
| | | Average diameter [nm] | Average depth [nm] | Number density [holes/μm²] | 500 nm | 1100 nm | | |
| Example B1 | $1.0 \times 10^2$ | 70 | 70 | 20 | 80 | 95 | $1.0 \times 10^2$ | Good |
| Example B2 | $1.0 \times 10^2$ | 80 | 50 | 10 | 85 | 92 | $5.0 \times 10^2$ | Good |
| Example B3 | $1.0 \times 10^2$ | 89 | 50 | 10 | 81 | 89 | $1.0 \times 10^3$ | Good |
| Example B4 | $1.3 \times 10^2$ | 70 | 90 | 5 | 83 | 89 | $1.1 \times 10^3$ | Good |
| Example B5 | $1.3 \times 10^2$ | 90 | 50 | 10 | 90 | 97 | $1.0 \times 10^3$ | Good |
| Example B6 | $1.0 \times 10^2$ | 90 | 70 | 20 | 85 | 93 | $1.2 \times 10^3$ | Good |
| Example B7 | $1.0 \times 10^2$ | 80 | 60 | 15 | 80 | 89 | $1.0 \times 10^3$ | Good |
| Example B8 | $1.0 \times 10^2$ | 70 | 45 | 22 | 83 | 90 | $1.0 \times 10^3$ | Good |
| Example B9 | $1.0 \times 10^2$ | 90 | 70 | 16 | 82 | 92 | $1.9 \times 10^3$ | Good |
| Example B10 | $1.0 \times 10^2$ | 80 | 60 | 20 | 84 | 96 | $1.8 \times 10^3$ | Good |
| Example B11 | $1.0 \times 10^2$ | 70 | 50 | 20 | 81 | 93 | $2.0 \times 10^3$ | Good |
| Example B12 | $1.0 \times 10^2$ | 60 | 90 | 10 | 83 | 92 | $2.0 \times 10^3$ | Good |
| Example B13 | $1.0 \times 10^2$ | 50 | 95 | 5 | 80 | 90 | $2.0 \times 10^3$ | Good |
| Example B14 | $1.0 \times 10^2$ | 90 | 80 | 20 | 82 | 91 | $1.9 \times 10^3$ | Good |
| Example B15 | $1.0 \times 10^2$ | 70 | 60 | 25 | 85 | 94 | $1.0 \times 10^3$ | Good |
| Example B16 | $1.0 \times 10^2$ | 80 | 65 | 15 | 86 | 93 | $1.1 \times 10^3$ | Good |
| Example B17 | $1.0 \times 10^2$ | 90 | 60 | 20 | 88 | 92 | $1.0 \times 10^3$ | Good |
| Example B18 | $1.0 \times 10^2$ | 40 | 50 | 10 | 83 | 91 | $1.2 \times 10^3$ | Good |
| Example B19 | $1.0 \times 10^2$ | 30 | 30 | 10 | 88 | 95 | $1.2 \times 10^3$ | Good |
| Example B20 | $1.0 \times 10^2$ | 50 | 50 | 10 | 80 | 96 | $1.0 \times 10^3$ | Good |

TABLE 12

| | | Composite film | | | | | | |
|---|---|---|---|---|---|---|---|---|
| | | Conductive reflective film | | | | | | |
| | Transparent conductive film Thickness [nm] | Hole distribution at substrate-side contact surface | | | Back side reflectance [%] | | Thickness [nm] | Adhesion |
| | | Average diameter [nm] | Average depth [nm] | Number density [holes/μm²] | 500 nm | 1100 nm | | |
| Example B21 | $1.0 \times 10^2$ | 80 | 80 | 20 | 82 | 92 | $1.0 \times 10^3$ | Good |
| Example B22 | $1.0 \times 10^2$ | 90 | 90 | 28 | 85 | 94 | $1.0 \times 10^3$ | Good |
| Example B23 | $1.0 \times 10^2$ | 80 | 75 | 25 | 88 | 96 | $1.0 \times 10^3$ | Good |
| Example B24 | $1.0 \times 10^2$ | 50 | 90 | 20 | 87 | 95 | $1.1 \times 10^3$ | Good |

TABLE 12-continued

| | Composite film | | | | | | | |
|---|---|---|---|---|---|---|---|---|
| | | Conductive reflective film | | | | | | |
| | Transparent | Hole distribution at substrate-side contact surface | | | Back side reflectance [%] | | | |
| | conductive film Thickness | Average diameter | Average depth | Number density | | | Thickness | |
| | [nm] | [nm] | [nm] | [holes/μm²] | 500 nm | 1100 nm | [nm] | Adhesion |
| Example B25 | $1.0 \times 10^2$ | 70 | 80 | 15 | 84 | 93 | $1.0 \times 10^3$ | Good |
| Example B26 | $1.0 \times 10^2$ | 60 | 90 | 20 | 89 | 95 | $1.1 \times 10^3$ | Good |
| Example B27 | $1.0 \times 10^2$ | 40 | 50 | 15 | 86 | 96 | $1.0 \times 10^3$ | Good |
| Example B28 | $0.7 \times 10^2$ | 95 | 95 | 12 | 83 | 92 | $1.1 \times 10^3$ | Good |
| Example B29 | $0.7 \times 10^2$ | 80 | 85 | 5 | 81 | 90 | $1.0 \times 10^3$ | Good |
| Example B30 | $0.7 \times 10^2$ | 55 | 80 | 10 | 86 | 95 | $1.0 \times 10^3$ | Good |
| Example B31 | $0.7 \times 10^2$ | 50 | 90 | 5 | 88 | 94 | $1.2 \times 10^3$ | Good |
| Example B32 | $0.7 \times 10^2$ | 80 | 80 | 10 | 82 | 92 | $1.1 \times 10^3$ | Good |
| Example B33 | $0.7 \times 10^2$ | 70 | 60 | 15 | 84 | 95 | $1.0 \times 10^3$ | Good |
| Example B34 | $0.7 \times 10^2$ | 90 | 60 | 20 | 87 | 96 | $1.0 \times 10^3$ | Good |
| Example B35 | $0.7 \times 10^2$ | 80 | 90 | 10 | 85 | 95 | $1.0 \times 10^3$ | Good |
| Example B36 | $0.5 \times 10^2$ | 80 | 70 | 20 | 83 | 94 | $1.1 \times 10^3$ | Good |
| Example B37 | $0.2 \times 10^2$ | 90 | 50 | 10 | 92 | 97 | $1.0 \times 10^3$ | Good |
| Comparative example B1 | $0.7 \times 10^2$ | 70 | 70 | 20 | 70 | 80 | $1.0 \times 10^2$ | Good |
| Comparative example B2 | $2.0 \times 10^2$ | 70 | 70 | 20 | 75 | 90 | $1.0 \times 10^3$ | Fair |

As is evident from Table 11 and Table 12, of the comparative examples B1 and B2 in which the second transparent conductive film was formed by a sputtering method that represents a vacuum deposition method, comparative example B2 exhibited inferior adhesion to examples B1 to B37. In comparative example B1, the reflectance at 500 nm was a low value of only 70%, and even at 1,100 nm, the reflectance tended to be low. Furthermore, although the reflectance at 1,100 nm in comparative example B2 was a high value of 90%, the reflectance at 500 nm was a comparatively low value of only 75%, confirming that the reflectance varied considerably depending on the wavelength. In contrast, in examples B1 to B37, high reflectance values of not less than 80% were achieved at both the 500 nm wavelength and the 1,100 nm wavelength.

Examples C1 to C32

Transparent conductive film compositions were prepared using the components and amounts listed for the classifications C1 to C8 detailed below in Table 13. The classification numbers from Table 13 for the transparent conductive film compositions used within the various examples are listed in Table 14 and Table 15.

In classification C1, as detailed below in Table 13, a total of 60 g of a mixture composed of 15% by mass of an IZO powder having an average particle size of 0.025 μm as a conductive oxide powder, 72.77% by mass of isopropanol as a dispersion medium, 10% by mass of a mixed liquid of the non-polymeric binders 2-n-butoxyethanol and 3-isopropyl-2,4-pentanedione as a binder, and 2.23% by mass of a mixture of indium nitrate and lead acetate (mass ratio 1:1) as a resistance reducer was placed in a 100 cc glass bottle, and using 100 g of zirconia beads with a diameter of 0.3 mm (MICRO HICA, manufactured by Showa Shell Sekiyu K.K.), the mixture was dispersed for 6 hours using a paint shaker, thus yielding a transparent conductive film composition.

In classification C2, as detailed below in Table 13, a transparent conductive film composition was prepared in the same manner as the classification C1, using a mixture composed of 7.5% by mass of an ITO powder having an average particle size of 0.025 μm as a conductive oxide powder, 92.3% by mass of a first mixed liquid composed of isopropanol, ethanol and N,N-dimethylformamide (mass ratio 4:2:1) as a dispersion medium, 0.038% by mass of the non-polymeric binder 2,4-pentanedione as a binder, and 0.162% by mass of a titanium coupling agent represented by the above formula (14) as a coupling agent.

In classification C3, as detailed below in Table 13, a transparent conductive film composition was prepared in the same manner as the classification C1, using a mixture composed of 5% by mass of an ATO powder having an average particle size of 0.025 μm as a conductive oxide powder, 50.99% by mass of the above first mixed liquid as a dispersion medium, 44% by mass of the non-polymeric binder 2-n-propoxyethanol as a binder, and 0.01% by mass of a titanium coupling agent represented by the above formula (14) as a coupling agent.

In classification C4, as detailed below in Table 13, a transparent conductive film composition was prepared in the same manner as the classification C1, using a mixture composed of 5% by mass of an AZO powder having an average particle size of 0.025 μm as a conductive oxide powder, 74.64% by mass of the above first mixed liquid as a dispersion medium, 20% by mass of a mixed liquid of 2,2-dimethyl-3,5-hexanedione and isopropyl acetate (mass ratio 1:1) as a binder, and 0.36% by mass of a titanium coupling agent represented by the above formula (13) as a coupling agent.

In classification C5, as detailed below in Table 13, a transparent conductive film composition was prepared in the same manner as the classification C1, using a mixture composed of 5% by mass of a TZO powder having an average particle size of 0.025 μm as a conductive oxide powder, 93.95% by mass of the above first mixed liquid as a dispersion medium, 0.8% by mass of a mixed liquid of 2-isobutoxyethanol, 2-hexyloxyethanol and n-propyl acetate (mass ratio 4:1:1) as a binder, and 0.25% by mass of a titanium coupling agent represented by the above formula (15) as a coupling agent.

In classification C6, first, an ATO powder having an average particle size of 0.010 μm was suspended in water, the pH of the suspension was adjusted to a value of 7, and the suspension was treated for 30 minutes using a beads mill. Subsequently, hydroxypropylcellulose was added to the suspension as a water-soluble cellulose derivative in a mass ratio of 0.01% relative to the mass of the ATO powder, thus forming a conductive water dispersion. The conductive water dispersion prepared in this manner was adjusted to a solid fraction concentration of 18.5%, and 100 g of this dispersion and 100 g of a 13.2% by mass aqueous solution of gelatin were mixed at 40° C., thus forming a water-based transparent conductive film composition.

In classification C7, as detailed below in Table 13, a transparent conductive film composition was prepared by mixing 5.3% by mass of an ATO powder having an average particle size of 0.025 μm as a conductive oxide powder, 85% by mass of a second mixed liquid composed of ethanol and butanol (mass ratio 98:2) as a dispersion medium, 1.7% by mass of a $SiO_2$ binding agent as a binder, and 8.0% by mass of a titanium coupling agent represented by the above formula (13) as a coupling agent. The $SiO_2$ binding agent used as a binder was prepared using a 500 ml four-neck glass flask, by charging the flask with 140 g of tetraethoxysilane and 240 g of ethyl alcohol, adding 1.0 g of 12N-HCl dissolved in 25 g of pure water in a single batch with constant stirring, and then reacting the resulting mixture for 6 hours at 80° C.

In classification C8, as detailed below in Table 13, a transparent conductive film composition was prepared by mixing 8.0% by mass of an ITO powder having an average particle size of 0.025 μm as a conductive oxide powder, 88% by mass of the above second mixed liquid as a dispersion medium, 2.0% by mass of a $SiO_2$ binding agent as a binder, and 2.0% by mass of a titanium coupling agent represented by the above formula (12) as a coupling agent. The $SiO_2$ binding agent used as a binder was prepared in the same manner as that described for classification C7.

Next, using the procedure described below, conductive reflective film compositions were prepared.

First, silver nitrate was dissolved in deionized water to prepare a metal salt aqueous solution. Further, in a separate preparation, sodium citrate was dissolved in deionized water to prepare an aqueous solution of sodium citrate having a concentration of 26% by mass. A particulate ferrous sulfate was then added directly to, and dissolved in, the sodium citrate aqueous solution under a stream of nitrogen gas held at a temperature of 35° C., thus preparing a reducing agent aqueous solution containing a 3:2 molar ratio of citrate ions and ferrous ions.

Subsequently, with the stream of nitrogen gas held at 35° C., a magnetic stirrer bar was placed in the reducing agent aqueous solution, and with the reducing agent aqueous solution undergoing constant stirring by rotating the stirrer bar at a rate of 100 rpm, the metal salt aqueous solution was added dropwise to the reducing agent aqueous solution and mixed thoroughly. For this addition, the concentration of each of the solutions was altered so that the amount of the metal salt aqueous solution added to the reducing agent aqueous solution was not more than 1/10th of the amount of the reducing agent aqueous solution, thereby ensuring that the reaction temperature was maintained at 40° C. even though the added metal salt aqueous solution was at room temperature. Furthermore, the mixing ratio between the reducing agent aqueous solution and the metal salt aqueous solution was adjusted so that the molar ratios of both the citrate ions and the ferrous ions within the reducing agent aqueous solution, relative to the total atomic valence number of metal ions within the metal salt aqueous solution, was a 3-fold molar excess. Following completion of the dropwise addition of the metal salt aqueous solution to the reducing agent aqueous solution, stirring of the resulting mixed liquid was continued for a further 15 minutes, thereby generating metal particles within the mixed liquid and forming a metal particles dispersion containing dispersed metal particles. The pH of the metal particles dispersion was 5.5, and the stoichiometric amount of generated metal particles within the dispersion was 5 g/liter.

The thus obtained dispersion was left to stand at room temperature to allow the metal particles within the dispersion to settle out, and the settled metal particle aggregates were isolated by decantation. Deionized water was added to the isolated metal aggregates to form a dispersion, a demineralization treatment was conducted using ultrafiltration, and displacement washing was then performed using methanol, so as to achieve a metal (silver) content of 50% by mass. Subsequently, by using a centrifugal separator with appropriate adjustment of the centrifugal power to separate the comparatively large silver particles having a particle size exceeding 100 nm, a sample was prepared in which silver particles having a primary particle size within a range from 10 to 50 nm represented a number average of 71%. In other words, the silver nanoparticles were prepared such that relative to 100% of all the silver nanoparticles, the proportion of silver nanoparticles having a primary particle size within a range from 10 to 50 nm was a number average of 71%. The thus obtained silver nanoparticles were chemically modified with a protective agent having an organic molecular main chain with a carbon skeleton containing 3 carbon atoms.

Next, 10 parts by mass of the obtained metal nanoparticles were added to and dispersed within 90 parts by mass of a mixed solution of ethanol and methanol, and by subsequently adding the additives listed below in Table 14 to Table 16 in the proportions shown in Table 14 to Table 16, a series of conductive reflective film compositions was obtained. The metal nanoparticles used in forming these conductive reflective film compositions contained at least 75% of silver nanoparticles.

In those cases where silver nanoparticles and metal nanoparticles other than silver nanoparticles were combined as the metal nanoparticles, then the dispersion containing silver nanoparticles produced using the above method was deemed the first dispersion, a dispersion containing metal nanoparticles other than silver nanoparticles was prepared using the same method as the above method used for producing the silver nanoparticles, but with the exception of replacing the silver nitrate with a metal salt listed in Table 14 to Table 16 that is capable of forming metal nanoparticles other than silver nanoparticles, and this dispersion of metal nanoparticles was deemed the second dispersion, and the first dispersion and second dispersion were then mixed together, prior to the addition of additives, in the proportions listed in Table 14 to Table 16, thus forming a conductive reflective film composition.

Finally, composite films were formed using the transparent conductive film compositions and conductive reflective film compositions prepared above. Specifically, first, one of the prepared conductive reflective film compositions was applied to the substrate listed in Table 14 to Table 16 using one of a variety of different coating methods in an amount sufficient to generate a thickness following baking of $10^2$ to $2 \times 10^3$ nm, and was then dried at a temperature of 25° C. for 5 minutes to form a conductive reflective coating. Subsequently, by baking the substrate having this coating formed thereon under the conditions detailed in Table 14 to Table 16, a conductive reflective film was formed. Next, one of the prepared transparent conductive film compositions was applied to the conductive reflective film using one of a variety of different coating methods in an amount sufficient to generate a thickness following baking of 0.7 to $1.3 \times 10^2$ nm, and was then dried at a temperature of 25° C. for 5 minutes to form a transparent conductive coating. Subsequently, by baking the substrate having this coating formed thereon under the conditions detailed in Table 14 to Table 16, a second transparent conductive film was formed. The above process completes the formation of a composite film on the substrate.

In Table 14 to Table 16, PVP represents a polyvinylpyrrolidone having a Mw of 360,000, and PET represents a polyethylene terephthalate.

Comparative Example C1

With the exception of forming the second transparent conductive film with a thickness of $0.7 \times 10^2$ nm using a sputtering method that represents one example of a vacuum deposition method, a composite film was formed in the same manner as example C1.

Comparative Example C2

With the exception of forming the second transparent conductive film with a thickness of $2.0 \times 10^2$ nm using a sputtering method that represents one example of a vacuum deposition method, a composite film was formed in the same manner as example C1.

TABLE 13

| | | Transparent conductive film composition | | | |
|---|---|---|---|---|---|
| Classification | Conductive oxide microparticles | Dispersion medium | Binder | Coupling agent | Other |
| C1 | IZO 15% by mass | Isopropanol 72.77% by mass | Non-polymeric binder 10% by mass | None | Resistance reducer 2.23% by mass |
| C2 | ITO 7.5% by mass | First mixed liquid 92.3% by mass | Non-polymeric binder 0.038% by mass | Titanium coupling agent 0.162% by mass | None |
| C3 | ATO 5% by mass | First mixed liquid 50.99% by mass | Non-polymeric binder 44% by mass | Titanium coupling agent 0.01% by mass | None |
| C4 | AZO 5% by mass | First mixed liquid 74.64% by mass | Non-polymeric binder 20% by mass | Titanium coupling agent 0.36% by mass | None |
| C5 | TZO 5% by mass | First mixed liquid 93.95% by mass | Non-polymeric binder 0.8% by mass | Titanium coupling agent 0.25% by mass | None |
| C6 | ATO 9.249% by mass | Water 84.150% by mass | Gelatin 6.600% by mass | None | Water-soluble cellulose derivative 0.001% by mass |
| C7 | ATO 5.3% by mass | Second mixed liquid 85% by mass | $SiO_2$ binding agent 1.7% by mass | Titanium coupling agent 8.0% by mass | None |
| C8 | ITO 8.0% by mass | Second mixed liquid 88% by mass | $SiO_2$ binding agent 2.0% by mass | Titanium coupling agent 2.0% by mass | None |

TABLE 14

| | Transparent conductive film composition Classification | Conductive reflective film composition | | Coating method | | | Baking treatment | | |
|---|---|---|---|---|---|---|---|---|---|
| | | Metal nanoparticles | Additives | Transparent conductive film | Conductive reflective film | Substrate | Temperature [° C.] | Time [min.] | Atmosphere |
| Example C1 | C1 | Ag 94% by mass | PVP 5% by mass Ni acetate 1% by mass | Spin coating | | Glass | 200 | 20 | air |
| Example C2 | C2 | Ag 96% by mass | PVP 3% by mass Cu acetate 1% by mass | Spin coating | | Glass | 200 | 20 | air |
| Example C3 | C3 | Ag 89% by mass Au 5% by mass | PVP-dimethylaminoethyl methacrylate 5% by mass Zn acetate 1% by mass | Spin coating | | Glass | 200 | 20 | air |
| Example C4 | C6 | Ag 72% by mass Pd 24% by mass | Methylcellulose 3% by mass Mo acetate 1% by mass | Spin coating | | Glass | 200 | 20 | air |
| Example C5 | C6 | Ag 94% by mass Ru 2% by mass | Hydroxypropylmethyl-cellulose 3% by mass Sn acetate 1% by mass | Spin coating | | Glass | 200 | 20 | air |
| Example C6 | C4 | Ag 92% by mass Cu 4% by mass | PVP 3% by mass Sn acetate 1% by mass | Dispenser coating | | Glass | 130 | 20 | $N_2$ |
| Example C7 | C5 | Ag 95.8% by mass Sn 0.2% by mass | PVP 3% by mass Sn acetate 1% by mass | Dispenser coating | | Glass | 200 | 20 | air |
| Example C8 | C1 | Ag 96.8% by mass In 0.2% by mass | PVP 2% by mass Sn acetate 1% by mass | Dispenser coating | | Glass | 130 | 20 | air |
| Example C9 | C1 | Ag 95.8% by mass Zn 0.2% by mass | PVP 3% by mass Sn acetate 1% by mass | Offset printing | | Glass | 320 | 20 | air |
| Example C10 | C1 | Ag 95.8% by mass Fe 0.2% by mass | PVP 3% by mass Zn acetate 1% by mass | Offset printing | | Glass | 320 | 20 | air |

TABLE 14-continued

| | Transparent conductive film composition Classification | Conductive reflective film composition | | Coating method | | | Baking treatment | | |
|---|---|---|---|---|---|---|---|---|---|
| | | Metal nanoparticles | Additives | Transparent conductive film | Conductive reflective film | Substrate | Temperature [°C.] | Time [min.] | Atmosphere |
| Example C11 | C1 | Ag 95.8% by mass Fe 0.2% by mass | PVP 3% by mass Ni acetate 1% by mass | Screen printing | | Glass | 150 | 20 | air |
| Example C12 | C1 | Ag 96.8% by mass Mn 0.2% by mass | PVP 3% by mass | Screen printing | | Glass | 150 | 20 | air |
| Example C13 | C2 | Ag 90% by mass | PVP 9% by mass $Al_2O_3$ 1% by mass | Knife coating | | Glass | 150 | 60 | air |
| Example C14 | C2 | Ag 99% by mass | PVP 0.9% by mass $SiO_2$ 0.1% by mass | Slit coating | | Glass | 400 | 60 | air |
| Example C15 | C2 | Ag 95% by mass | PVP 4% by mass $TiO_2$ 1% by mass | Spin coating | | Glass | 150 | 20 | air |

TABLE 15

| | Transparent conductive film composition Classification | Conductive reflective film composition | | Coating method | | | Baking treatment | | |
|---|---|---|---|---|---|---|---|---|---|
| | | Metal nanoparticles | Additives | Transparent conductive film | Conductive reflective film | Substrate | Temperature [°C.] | Time [min.] | Atmosphere |
| Example C16 | C2 | Ag 95% by mass | PVP 4% by mass $Cr_2O_3$ 1% by mass | Spin coating | | Glass | 150 | 20 | air |
| Example C17 | C2 | Ag 95% by mass | PVP 4% by mass $MnO_2$ 1% by mass | Spin coating | | Glass | 150 | 20 | air |
| Example C18 | C2 | Ag 95% by mass | PVP 4% by mass $Fe_2O_3$ 0.5% by mass $Cr_3O_4$ 0.5% by mass | Spin coating | | Glass | 150 | 20 | air |
| Example C19 | C2 | Ag 95% by mass | PVP 4% by mass $Ag_2O$ 1% by mass | Spin coating | | Glass | 150 | 20 | air |
| Example C20 | C3 | Ag 95% by mass | PVP 4% by mass $Cu(OH)_2$ 1% by mass | Spin coating | | Glass | 150 | 20 | Ar |
| Example C21 | C3 | Ag 95% by mass | PVP 4% by mass ZnO 1% by mass | Spin coating | | PET | 150 | 20 | air |
| Example C22 | C3 | Ag 95% by mass | PVP 4% by mass $MoO_2$ 1% by mass | Spin coating | | PET | 150 | 20 | air |
| Example C23 | C3 | Ag 95% by mass | PVP 4% by mass $SnO_2$ 1% by mass | Spin coating | | PET | 150 | 20 | air |
| Example C24 | C3 | Ag 95% by mass | PVP 4% by mass ITO 1% by mass | Spin coating | | PET | 150 | 20 | air |
| Example C25 | C3 | Ag 95% by mass | PVP 4% by mass ATO 1% by mass | Spin coating | | PET | 150 | 20 | air |
| Example C26 | C3 | Ag 95% by mass | PVP 4% by mass Methyl silicate 1% by mass | Spin coating | | PET | 150 | 20 | air |
| Example C27 | C7 | Ag 95% by mass | PVP 4% by mass Titanium isopropoxide 1% by mass | Spin coating | | PET | 150 | 20 | air |
| Example C28 | C7 | Ag 95% by mass | PVP 4% by mass Ammonium chromate 1% by mass | Spin coating | | PET | 150 | 20 | air |
| Example C29 | C7 | Ag 95.9% by mass | PVP 4% by mass Mn formate 0.1% by mass | Spin coating | | PET | 150 | 20 | air |
| Example C30 | C7 | Ag 95.9% by mass | PVP 4% by mass Fe citrate 0.1% by mass | Spin coating | | PET | 150 | 20 | air |

TABLE 16

| | Transparent conductive film composition Classification | Conductive reflective film composition | | Coating method | | Substrate | Baking treatment | | |
|---|---|---|---|---|---|---|---|---|---|
| | | Metal nanoparticles | Additives | Transparent conductive film | Conductive reflective film | | Temperature [°C.] | Time [min.] | Atmosphere |
| Example C31 | C7 | Ag 95.9% by mass | PVP 4% by mass Co formate 0.1% by mass | Spin coating | | PET | 200 | 20 | air |
| Example C32 | C8 | Ag 95% by mass | Ni acetate 5% by mass | Spin coating | | PET | 150 | 20 | air |
| Example C33 | C8 | Ag 95% by mass | PVP 4% by mass Ag citrate 1% by mass | Spin coating | | PET | 150 | 20 | air |
| Example C34 | C8 | Ag 95% by mass | Cu acetate 5% by mass | Spin coating | | PET | 150 | 20 | $N_2$ |
| Example C35 | C8 | Ag 95% by mass | Zn acetate 5% by mass | Spin coating | | PET | 150 | 20 | air |
| Example C36 | C8 | Ag 95% by mass | Mn acetate 5% by mass | Spin coating | | PET | 150 | 20 | air |
| Example C37 | C8 | Ag 95% by mass | Sn acetate 5% by mass | Die coating | | PET | 150 | 20 | air |
| Comparative example C1 | ITO sputter film | Ag 94% by mass | PVP 5% by mass Ni acetate 1% by mass | Sputter | Spin coating | Glass | 200 | 20 | air |
| Comparative example C2 | ITO sputter film | Ag 94% by mass | PVP 5% by mass Ni acetate 1% by mass | Sputter | Spin coating | Glass | 200 | 20 | air |

<Comparative Test C1>

The film thickness of the second transparent conductive film within each of the composite films obtained in examples C1 to C37 and comparative examples C1 and C2 was evaluated. The results of the evaluations are listed below in Table 17 and Table 18. Specifically, the thicknesses of the second transparent conductive film and the conductive reflective film following baking were measured directly from a film cross-section obtained using a SEM (scanning electron microscope S800, manufactured by Hitachi, Ltd.).

<Comparative Test C2>

Each of the substrates having a composite film formed thereon obtained in examples C1 to C37 and comparative examples C1 and C2 was evaluated for the distribution of holes at the contact surface on the side of the second transparent conductive film, the reflectance and the thickness of the conductive reflective film. The results of these evaluations are listed below in Table 17 and Table 18.

Measurement of the holes was conducted by forming the conductive reflective film by applying the conductive reflective film composition to the substrate and performing baking, and then prior to application of the transparent conductive film composition, using an atomic force microscope (AFM) to inspect the uneven surface of the conductive reflective film on which the second transparent conductive film is subsequently formed. The uneven surface was analyzed, and the average diameter, average depth and number density of the holes that appeared at the film surface were evaluated. The average diameter was determined by measuring the maximum length and minimum length across each opening, and calculating the average value.

Evaluation of the reflectance of the conductive reflective film was performed using a combination of an ultraviolet-visible spectrophotometer and an integrating sphere, by measuring the diffuse reflectance of the conductive reflective film at wavelengths of 500 nm and 1,100 nm. The reflectance was measured after formation of the second transparent conductive film, by measuring the reflectance from the upper surface.

The film thickness of the conductive reflective film was measured from a cross-sectional image obtained using a scanning electron microscope (SEM).

<Comparative Test C3>

The adhesion to the substrate of each of the composite films obtained in examples C1 to C37 and comparative examples C1 and C2 was evaluated. The results of the evaluations are listed in Table 17 and Table 18. The adhesion was evaluated qualitatively on the basis of a peel test in which an adhesive tape was bonded to, and then peeled from, the composite film formed on the substrate. A result of "good" was recorded in those cases where only the adhesive tape peeled from the substrate, a result of "fair" was recorded in those cases where a mixed state was obtained in which only the adhesive tape peeled in some portions and the substrate surface was exposed in other portions, and a result of "poor" was recorded in those cases where peeling of the adhesive tape exposed the entire substrate surface.

TABLE 17

| | Composite film | | | | | | | |
|---|---|---|---|---|---|---|---|---|
| | Transparent conductive film | Conductive reflective film | | | | | | |
| | | Hole distribution at contact surface on side of transparent conductive film | | | Reflectance [%] | | | |
| | Thickness [nm] | Average diameter [nm] | Average depth [nm] | Number density [holes/µm²] | 500 nm | 1100 nm | Thickness [nm] | Adhesion |
| Example C1 | $1.0 \times 10^2$ | 60 | 70 | 18 | 80 | 92 | $1.0 \times 10^2$ | Good |
| Example C2 | $1.0 \times 10^2$ | 70 | 70 | 8 | 82 | 94 | $5.0 \times 10^2$ | Good |

TABLE 17-continued

| | Composite film | | | | | | | |
|---|---|---|---|---|---|---|---|---|
| | Conductive reflective film | | | | | | | |
| | Transparent conductive film | Hole distribution at contact surface on side of transparent conductive film | | | Reflectance [%] | | Thickness | |
| | Thickness [nm] | Average diameter [nm] | Average depth [nm] | Number density [holes/μm²] | 500 nm | 1100 nm | [nm] | Adhesion |
| Example C3 | $1.0 \times 10^2$ | 80 | 60 | 12 | 86 | 93 | $1.0 \times 10^3$ | Good |
| Example C4 | $1.3 \times 10^2$ | 50 | 90 | 14 | 87 | 94 | $1.1 \times 10^3$ | Good |
| Example C5 | $1.3 \times 10^2$ | 80 | 50 | 6 | 83 | 92 | $1.0 \times 10^3$ | Good |
| Example C6 | $1.0 \times 10^2$ | 70 | 70 | 8 | 81 | 91 | $1.2 \times 10^3$ | Good |
| Example C7 | $1.0 \times 10^2$ | 60 | 50 | 12 | 84 | 95 | $1.0 \times 10^3$ | Good |
| Example C8 | $1.0 \times 10^2$ | 50 | 50 | 11 | 90 | 96 | $1.0 \times 10^3$ | Good |
| Example C9 | $1.0 \times 10^2$ | 80 | 80 | 9 | 89 | 93 | $1.9 \times 10^3$ | Good |
| Example C10 | $1.0 \times 10^2$ | 70 | 60 | 17 | 92 | 97 | $1.8 \times 10^3$ | Good |
| Example C11 | $1.0 \times 10^2$ | 65 | 40 | 20 | 83 | 90 | $2.0 \times 10^3$ | Good |
| Example C12 | $1.0 \times 10^2$ | 60 | 80 | 14 | 84 | 93 | $2.0 \times 10^3$ | Good |
| Example C13 | $1.0 \times 10^2$ | 40 | 50 | 12 | 91 | 96 | $2.0 \times 10^3$ | Good |
| Example C14 | $1.0 \times 10^2$ | 70 | 70 | 19 | 84 | 93 | $1.9 \times 10^3$ | Good |
| Example C15 | $1.0 \times 10^2$ | 60 | 60 | 24 | 91 | 94 | $1.0 \times 10^3$ | Good |
| Example C16 | $1.0 \times 10^2$ | 60 | 70 | 23 | 83 | 90 | $1.1 \times 10^3$ | Good |
| Example C17 | $1.0 \times 10^2$ | 50 | 50 | 14 | 92 | 95 | $1.0 \times 10^3$ | Good |
| Example C18 | $1.0 \times 10^2$ | 40 | 40 | 27 | 91 | 95 | $1.2 \times 10^3$ | Good |
| Example C19 | $1.0 \times 10^2$ | 30 | 40 | 25 | 87 | 92 | $1.2 \times 10^3$ | Good |
| Example C20 | $1.0 \times 10^2$ | 40 | 30 | 18 | 88 | 95 | $1.0 \times 10^3$ | Good |

TABLE 18

| | Composite film | | | | | | | |
|---|---|---|---|---|---|---|---|---|
| | Conductive reflective film | | | | | | | |
| | Transparent conductive film | Hole distribution at contact surface on side of transparent conductive film | | | Back side reflectance [%] | | Thickness | |
| | Thickness [nm] | Average diameter [nm] | Average depth [nm] | Number density [holes/μm²] | 500 nm | 1100 nm | [nm] | Adhesion |
| Example C21 | $1.0 \times 10^2$ | 70 | 70 | 23 | 89 | 94 | $1.0 \times 10^3$ | Good |
| Example C22 | $1.0 \times 10^2$ | 80 | 80 | 21 | 92 | 93 | $1.0 \times 10^3$ | Good |
| Example C23 | $1.0 \times 10^2$ | 60 | 60 | 9 | 91 | 95 | $1.0 \times 10^3$ | Good |
| Example C24 | $1.0 \times 10^2$ | 50 | 80 | 12 | 93 | 96 | $1.1 \times 10^3$ | Good |
| Example C25 | $1.0 \times 10^2$ | 40 | 70 | 13 | 86 | 93 | $1.0 \times 10^3$ | Good |
| Example C26 | $1.0 \times 10^2$ | 30 | 90 | 9 | 87 | 92 | $1.1 \times 10^3$ | Good |
| Example C27 | $1.0 \times 10^2$ | 40 | 50 | 15 | 88 | 94 | $1.0 \times 10^3$ | Good |
| Example C28 | $0.7 \times 10^2$ | 80 | 70 | 21 | 89 | 95 | $1.1 \times 10^3$ | Good |
| Example C29 | $0.7 \times 10^2$ | 70 | 80 | 15 | 86 | 93 | $1.0 \times 10^3$ | Good |
| Example C30 | $0.7 \times 10^2$ | 40 | 70 | 21 | 85 | 95 | $1.0 \times 10^3$ | Good |
| Example C31 | $0.7 \times 10^2$ | 30 | 90 | 19 | 91 | 94 | $1.2 \times 10^3$ | Good |
| Example C32 | $0.7 \times 10^2$ | 70 | 60 | 27 | 90 | 94 | $1.1 \times 10^3$ | Good |
| Example C33 | $0.7 \times 10^2$ | 50 | 50 | 25 | 86 | 95 | $1.0 \times 10^3$ | Good |
| Example C34 | $0.7 \times 10^2$ | 70 | 60 | 24 | 85 | 95 | $1.0 \times 10^3$ | Good |
| Example C35 | $0.7 \times 10^2$ | 60 | 80 | 17 | 87 | 96 | $1.0 \times 10^3$ | Good |
| Example C36 | $0.5 \times 10^2$ | 50 | 70 | 14 | 86 | 97 | $1.1 \times 10^3$ | Good |
| Example C37 | $0.2 \times 10^2$ | 80 | 40 | 15 | 92 | 94 | $1.0 \times 10^3$ | Good |
| Comparative example C1 | $0.7 \times 10^2$ | 60 | 70 | 18 | 75 | 83 | $1.0 \times 10^2$ | Good |
| Comparative example C2 | $2.0 \times 10^2$ | 60 | 70 | 18 | 78 | 87 | $1.0 \times 10^3$ | Fair |

As is evident from Table 17 and Table 18, of the comparative examples C1 and C2 in which the second transparent conductive film was formed by a sputtering method that represents a vacuum deposition method, comparative example C2 exhibited inferior adhesion to examples C1 to C37. In comparative example C1, the reflectance at 500 nm was a low value of only 75%, and even at 1,100 nm, the reflectance tended to be low. Furthermore, although the reflectance at 1,100 nm in comparative example C2 was a high value of 87%, the reflectance at 500 nm was a comparatively low value of only 78%, confirming that the reflectance varied considerably depending on the wavelength. In contrast, in examples C1 to C37, high reflectance values of not less than 80% were achieved at both the 500 nm wavelength and the 1,100 nm wavelength.

Examples D1 to D32

Conductive oxide microparticles dispersions and binder dispersions were prepared using the components and amounts listed for the classifications D1 to D8 detailed below in Table 19. The classification numbers from Table 19 for the dispersions used within the various examples are listed in Table 20 and Table 21.

In classification D1, as detailed below in Table 19, a total of 60 g of a mixture composed of 20% by mass of an IZO powder having an average particle size of 0.025 μm as conductive oxide microparticles and 80% by mass of isopropanol as a dispersion medium was placed in a 100 cc glass bottle, and using 100 g of zirconia beads with a diameter of 0.3 mm (MICRO HICA, manufactured by Showa Shell Sekiyu K.K.), the mixture was dispersed for 6 hours using a paint shaker, thus yielding a dispersion of conductive oxide microparticles. Further, in a separate preparation, 10% by mass of a mixed liquid of the non-polymeric binders 2-n-butoxyethanol and 3-isopropyl-2,4-pentanedione as the binder, 88.2% by mass of isopropanol as a dispersion medium, and 1.8% by mass of a mixture of indium nitrate and lead acetate (mass ratio 1:1) as a resistance reducer were combined and stirred for one hour at room temperature at a rotational rate of 200 rpm, thus forming a binder dispersion.

In classification D2, as detailed below in Table 19, a dispersion of conductive oxide microparticles was prepared in the same manner as the classification D1, using a mixture composed of 7.5% by mass of an ITO powder having an average particle size of 0.025 μm as the conductive oxide microparticles, 0.2% by mass of a titanium coupling agent represented by the above formula (19) as a coupling agent, and 92.3% by mass of a first mixed liquid composed of isopropanol, ethanol and N,N-dimethylformamide (mass ratio 4:2:1) as a dispersion medium. Further, a binder dispersion was prepared in the same manner as the classification D1, using 10% by mass of the non-polymeric binder 2,4-pentanedione as the binder and 90% by mass of the above first mixed liquid as a dispersion medium.

In classification D3, as detailed below in Table 19, a dispersion of conductive oxide microparticles was prepared in the same manner as the classification D1, using a mixture composed of 10% by mass of an ATO powder having an average particle size of 0.025 μm as the conductive oxide microparticles, 0.02% by mass of a titanium coupling agent represented by the above formula (19) as a coupling agent, and 89.98% by mass of the above first mixed liquid as a dispersion medium. Further, a binder dispersion was prepared in the same manner as the classification D1, using 10% by mass of the non-polymeric binder 2-n-propoxyethanol as the binder and 90% by mass of the above first mixed liquid as a dispersion medium.

In classification D4, as detailed below in Table 19, a dispersion of conductive oxide microparticles was prepared in the same manner as the classification D1, using a mixture composed of 10% by mass of an AZO powder having an average particle size of 0.025 μm as the conductive oxide microparticles, 1% by mass of a titanium coupling agent represented by the above formula (18) as a coupling agent, and 89% by mass of the above first mixed liquid as a dispersion medium. Further, a binder dispersion was prepared in the same manner as the classification D1, using 10% by mass of a mixed liquid of 2,2-dimethyl-3,5-hexanedione and isopropyl acetate (mass ratio 1:1) as the binder, and 90% by mass of the above first mixed liquid as a dispersion medium.

In classification D5, as detailed below in Table 19, a dispersion of conductive oxide microparticles was prepared in the same manner as the classification D1, using a mixture composed of 5% by mass of a TZO powder having an average particle size of 0.025 μm as the conductive oxide microparticles, 0.5% by mass of a titanium coupling agent represented by the above formula (20) as a coupling agent, and 94.5% by mass of the above first mixed liquid as a dispersion medium. Further, a binder dispersion was prepared in the same manner as the classification D1, using 10% by mass of a mixed liquid of 2-isobutoxyethanol, 2-hexyloxyethanol and n-propyl acetate (mass ratio 4:1:1) as the binder, and 90% by mass of the above first mixed liquid as a dispersion medium.

In classification D6, first, an ATO powder having an average particle size of 0.010 μm was suspended in water, the pH of the suspension was adjusted to a value of 7, and the suspension was treated for 30 minutes using a beads mill. The above first mixed liquid was added to the treated suspension as a dispersion medium, and the solid fraction concentration was adjusted to 18.5%, thus yielding a dispersion of conductive oxide microparticles. Further, a mixture containing 5% of gelatin as a binder, 1% by mass of hydroxypropylcellulose as a water-soluble cellulose derivative, and 94% by mass of water as the dispersion medium was stirred for one hour at a temperature of 30° C. at a rotational rate of 200 rpm, thus forming a binder dispersion.

In classification D7, as detailed below in Table 19, a dispersion of conductive oxide microparticles was prepared in the same manner as the classification D1, using a mixture composed of 6% by mass of an ATO powder having an average particle size of 0.025 μm as the conductive oxide microparticles, 85% by mass of a second mixed liquid composed of ethanol and butanol (mass ratio 98:2) as a dispersion medium, and 9.0% by mass of a titanium coupling agent represented by the above formula (18) as a coupling agent. Further, in a separate preparation, a binder dispersion was prepared by mixing 10% by mass of a $SiO_2$ binding agent as a binder and 90% by mass of the above second mixed liquid as a dispersion medium. The $SiO_2$ binding agent used as a binder was prepared using a 500 ml four-neck glass flask, by charging the flask with 140 g of tetraethoxysilane and 240 g of ethyl alcohol, adding 1.0 g of 12N-HCl dissolved in 25 g of pure water in a single batch with constant stirring, and then reacting the resulting mixture for 6 hours at 80° C.

In classification D8, as detailed below in Table 19, a dispersion of conductive oxide microparticles was prepared in the same manner as the classification D1, using 8% by mass of an ITO powder having an average particle size of 0.025 μm as the conductive oxide microparticles, 2.0% by mass of a titanium coupling agent represented by the above formula (17) as a coupling agent, and 90% by mass of the above second mixed liquid as a dispersion medium. Further, in a separate preparation, a binder dispersion was prepared by mixing 10% by mass of a $SiO_2$ binding agent as a binder and 90% by mass of the above second mixed liquid as a dispersion medium.

Next, using the procedure described below, conductive reflective film compositions were prepared.

First, silver nitrate was dissolved in deionized water to prepare a metal salt aqueous solution. Further, in a separate preparation, sodium citrate was dissolved in deionized water to prepare an aqueous solution of sodium citrate having a concentration of 26% by mass. A particulate ferrous sulfate was then added directly to, and dissolved in, the sodium citrate aqueous solution under a stream of nitrogen gas held at a temperature of 35° C., thus preparing a reducing agent aqueous solution containing a 3:2 molar ratio of citrate ions and ferrous ions.

Subsequently, with the stream of nitrogen gas held at 35° C., a magnetic stirrer bar was placed in the reducing agent aqueous solution, and with the reducing agent aqueous solution undergoing constant stirring by rotating the stirrer bar at a rate of 100 rpm, the metal salt aqueous solution was added dropwise to the reducing agent aqueous solution and mixed thoroughly. For this addition, the concentration of each of the solutions was altered so that the amount of the metal salt aqueous solution added to the reducing agent aqueous solution was not more than $\frac{1}{10}$th of the amount of the reducing agent aqueous solution, thereby ensuring that the reaction temperature was maintained at 40° C. even though the added metal salt aqueous solution was at room temperature. Furthermore, the mixing ratio between the reducing agent aqueous solution and the metal salt aqueous solution was adjusted so that the molar ratios of both the citrate ions and the ferrous ions within the reducing agent aqueous solution, relative to the total atomic valence number of metal ions within the metal salt aqueous solution, was a 3-fold molar excess. Following completion of the dropwise addition of the metal salt aqueous solution to the reducing agent aqueous solution, stirring of the resulting mixed liquid was continued for a further 15 minutes, thereby generating metal particles within the mixed liquid and forming a metal particles dispersion containing dispersed metal particles. The pH of the metal particles dispersion was 5.5, and the stoichiometric amount of generated metal particles within the dispersion was 5 g/liter.

The thus obtained dispersion was left to stand at room temperature to allow the metal particles within the dispersion to settle out, and the settled metal particle aggregates were isolated by decantation. Deionized water was added to the isolated metal aggregates to form a dispersion, a demineralization treatment was conducted using ultrafiltration, and displacement washing was then performed using methanol, so as to achieve a metal (silver) content of 50% by mass. Subsequently, by using a centrifugal separator with appropriate adjustment of the centrifugal power to separate the comparatively large silver particles having a particle size exceeding 100 nm, a sample was prepared in which silver particles having a primary particle size within a range from 10 to 50 nm represented a number average of 71%. In other words, the silver nanoparticles were prepared such that relative to 100% of all the silver nanoparticles, the proportion of silver nanoparticles having a primary particle size within a range from 10 to 50 nm was a number average of 71%. The thus obtained silver nanoparticles were chemically modified with a protective agent having an organic molecular main chain with a carbon skeleton containing 3 carbon atoms.

Next, 10 parts by mass of the obtained metal nanoparticles were added to and dispersed within 90 parts by mass of a mixed solution of ethanol and methanol, and by subsequently adding the additives listed below in Table 20 to Table 22 in the proportions shown in Table 20 to Table 22, a series of conductive reflective film compositions was obtained. The metal nanoparticles used in forming these conductive reflective film compositions contained at least 75% of silver nanoparticles.

In those cases where silver nanoparticles and metal nanoparticles other than silver nanoparticles were combined as the metal nanoparticles, then the dispersion containing silver nanoparticles produced using the above method was deemed the first dispersion, a dispersion containing metal nanoparticles other than silver nanoparticles was prepared using the same method as the above method used for producing the silver nanoparticles, but with the exception of replacing the silver nitrate with a metal salt listed in Table 20 to Table 22 that is capable of forming metal nanoparticles other than silver nanoparticles, and this dispersion of metal nanoparticles was deemed the second dispersion, and the first dispersion and second dispersion were then mixed together, prior to the addition of additives, in the proportions listed in Table 20 to Table 22, thus forming a conductive reflective film composition.

Finally, composite films were formed using the conductive oxide microparticles dispersions, binder dispersions and conductive reflective film compositions prepared above. Specifically, one of the prepared conductive reflective film compositions was applied to the substrate listed in Table 20 to Table 22 using one of a variety of different coating methods in an amount sufficient to generate a film thickness following baking of 0.05 to 2.0 μm, and was then dried at a temperature of 25° C. for 5 minutes to form a conductive reflective coating. Next, a prepared dispersion of conductive oxide microparticles was applied to the conductive reflective coating using one of a variety of different coating methods in an amount sufficient to generate a film thickness following baking of 0.01 to 0.5 μm, and was then dried at a temperature of 25° C. for 5 minutes to form a coating of the conductive oxide microparticles. Next, this coating of conductive oxide microparticles was impregnated with one of the prepared binder dispersions using one of a variety of different coating methods so that, following baking, the entire surface of the conductive oxide microparticles layer was covered with the binder layer, and the binder dispersion was then dried at a temperature of 25° C. for 5 minutes to form a transparent conductive coating. The binder dispersion was applied in such a manner that the mass of the binder component within the binder dispersion, relative to the total mass of microparticles contained within the applied coating of the conductive oxide microparticles was a mass ratio (mass of binder component within applied binder dispersion/mass of conductive oxide microparticles) listed below in Table 20 to Table 22. By subsequently performing baking under the conditions detailed below in Table 20 to Table 22, a composite film was formed on the substrate.

In Table 20 to Table 22, PVP represents a polyvinylpyrrolidone having a Mw of 360,000, and PET represents a polyethylene terephthalate.

Comparative Example D1

With the exception of forming the second transparent conductive film with a thickness of $0.7 \times 10^2$ nm using a sputtering method that represents one example of a vacuum deposition method, a composite film was formed in the same manner as example D1.

Comparative Example D2

With the exception of forming the second transparent conductive film with a thickness of $2.0 \times 10^2$ nm using a sputtering method that represents one example of a vacuum deposition method, a composite film was formed in the same manner as example D1.

TABLE 19

| Classification | Conductive oxide microparticles dispersion | | | | | |
|---|---|---|---|---|---|---|
| | Conductive oxide | | | Binder dispersion | | |
| | microparticles | Dispersion medium | Coupling agent | Binder | Dispersion medium | Other |
| D1 | IZO<br>20% by mass | Isopropanol<br>80% by mass | None | Non-polymeric binder<br>10% by mass | Isopropanol<br>88.2% by mass | Resistance reducer<br>1.8% by mass |
| D2 | ITO<br>7.5% by mass | First mixed liquid<br>92.3% by mass | Titanium coupling agent<br>0.2% by mass | Non-polymeric binder<br>10% by mass | First mixed liquid<br>90% by mass | None |
| D3 | ATO<br>10% by mass | First mixed liquid<br>89.98% by mass | Titanium coupling agent<br>0.02% by mass | Non-polymeric binder<br>10% by mass | First mixed liquid<br>90% by mass | None |
| D4 | AZO<br>10% by mass | First mixed liquid<br>89% by mass | Titanium coupling agent<br>1% by mass | Non-polymeric binder<br>10% by mass | First mixed liquid<br>90% by mass | None |
| D5 | TZO<br>5% by mass | First mixed liquid<br>94.5% by mass | Titanium coupling agent<br>0.5% by mass | Non-polymeric binder<br>10% by mass | First mixed liquid<br>90% by mass | None |
| D6 | ATO<br>18.5% by mass | First mixed liquid<br>81.5% by mass | None | Gelatin<br>5% by mass | Water<br>94% by mass | Water-soluble cellulose derivative<br>% by mass |
| D7 | ATO<br>6% by mass | Second mixed liquid<br>85% by mass | Titanium coupling agent<br>9.0% by mass | $SiO_2$ binding agent<br>10% by mass | Second mixed liquid<br>90% by mass | None |
| D8 | ITO<br>8% by mass | Second mixed liquid<br>90% by mass | Titanium coupling agent<br>2.0% by mass | $SiO_2$ binding agent<br>10% by mass | Second mixed liquid<br>90% by mass | None |

TABLE 20

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example D1 | D1 | 60 | Ag 94% by mass | PVP 5% by mass<br>Ni acetate 1% by mass | Spin coating | | Glass | 200 | 20 | air |
| Example D2 | D2 | 50 | Ag 96% by mass | PVP 3% by mass<br>Cu acetate 1% by mass | Spin coating | | Glass | 200 | 20 | air |
| Example D3 | D3 | 55 | Ag 89% by mass<br>Au 5% by mass | PVP-dimethylaminoethyl methacrylate 5% by mass<br>Zn acetate 1% by mass | Spin coating | | Glass | 200 | 20 | air |
| Example D4 | D6 | 60 | Ag 72% by mass<br>Pd 24% by mass | Methylcellulose 3% by mass<br>Mo acetate 1% by mass | Spin coating | | Glass | 200 | 20 | air |
| Example D5 | D6 | 70 | Ag 94% by mass<br>Ru 2% by mass | Hydroxypropylmethyl-cellulose 3% by mass<br>Sn acetate 1% by mass | Spin coating | | Glass | 200 | 20 | air |
| Example D6 | D4 | 55 | Ag 92% by mass<br>Cu 4% by mass | PVP 3% by mass<br>Sn acetate 1% by mass | Dispenser coating | | Glass | 130 | 20 | $N_2$ |
| Example D7 | D5 | 80 | Ag 95.8% by mass<br>Sn 0.2% by mass | PVP 3% by mass<br>Sn acetate 1% by mass | Dispenser coating | | Glass | 200 | 20 | air |
| Example D8 | D1 | 90 | Ag 96.8% by mass<br>In 0.2% by mass | PVP 2% by mass<br>Sn acetate 1% by mass | Dispenser coating | | Glass | 130 | 20 | air |
| Example D9 | D1 | 100 | Ag 95.8% by mass<br>Zn 0.2% by mass | PVP 3% by mass<br>Sn acetate 1% by mass | Offset printing | | Glass | 320 | 20 | air |
| Example D10 | D1 | 70 | Ag 95.8% by mass<br>Fe 0.2% by mass | PVP 3% by mass<br>Zn acetate 1% by mass | Offset printing | | Glass | 320 | 20 | air |
| Example D11 | D1 | 80 | Ag 95.8% by mass<br>Fe 0.2% by mass | PVP 3% by mass<br>Ni acetate 1% by mass | Screen printing | | Glass | 150 | 20 | air |
| Example D12 | D1 | 85 | Ag 96.8% by mass<br>Mn 0.2% by mass | PVP 3% by mass | Screen printing | | Glass | 150 | 20 | air |
| Example D13 | D2 | 75 | Ag 90% by mass | PVP 9% by mass<br>$Al_2O_3$ 1% by mass | Knife coating | | Glass | 150 | 60 | air |
| Example D14 | D2 | 55 | Ag 99% by mass | PVP 0.9% by mass<br>$SiO_2$ 0.1% by mass | Slit coating | | Glass | 400 | 60 | air |
| Example D15 | D2 | 65 | Ag 95% by mass | PVP 4% by mass<br>$TiO_2$ 1% by mass | Spin coating | | Glass | 150 | 20 | air |

TABLE 21

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example D16 | D2 | 70 | Ag 95% by mass | PVP 4% by mass<br>Cr₂O₃ 1% by mass | | Spin coating | Glass | 150 | 20 | air |
| Example D17 | D2 | 95 | Ag 95% by mass | PVP 4% by mass<br>MnO₂ 1% by mass | | Spin coating | Glass | 150 | 20 | air |
| Example D18 | D2 | 75 | Ag 95% by mass | PVP 4% by mass<br>Fe₂O₃ 0.5% by mass<br>Cr₃O₄ 0.5% by mass | | Spin coating | Glass | 150 | 20 | air |
| Example D19 | D2 | 80 | Ag 95% by mass | PVP 4% by mass<br>Ag₂O 1% by mass | | Spin coating | Glass | 150 | 20 | air |
| Example D20 | D3 | 85 | Ag 95% by mass | PVP 4% by mass<br>Cu(OH)₂ 1% by mass | | Spin coating | Glass | 150 | 20 | Ar |
| Example D21 | D3 | 90 | Ag 95% by mass | PVP 4% by mass<br>ZnO 1% by mass | | Spin coating | PET | 150 | 20 | air |
| Example D22 | D3 | 95 | Ag 95% by mass | PVP 4% by mass<br>MoO₂ 1% by mass | | Spin coating | PET | 150 | 20 | air |
| Example D23 | D3 | 60 | Ag 95% by mass | PVP 4% by mass<br>SnO₂ 1% by mass | | Spin coating | PET | 150 | 20 | air |
| Example D24 | D3 | 100 | Ag 95% by mass | PVP 4% by mass<br>ITO 1% by mass | | Spin coating | PET | 150 | 20 | air |
| Example D25 | D3 | 90 | Ag 95% by mass | PVP 4% by mass<br>ATO 1% by mass | | Spin coating | PET | 150 | 20 | air |
| Example D26 | D3 | 55 | Ag 95% by mass | PVP 4% by mass<br>Methyl silicate 1% by mass | | Spin coating | PET | 150 | 20 | air |
| Example D27 | D7 | 80 | Ag 95% by mass | PVP 4% by mass<br>Titanium isopropoxide 1% by mass | | Spin coating | PET | 150 | 20 | air |
| Example D28 | D7 | 90 | Ag 95% by mass | PVP 4% by mass<br>Ammonium chromate 1% by mass | | Spin coating | PET | 150 | 20 | air |
| Example D29 | D7 | 95 | Ag 95.9% by mass | PVP 4% by mass Mn formate 0.1% by mass | | Spin coating | PET | 150 | 20 | air |
| Example D30 | D7 | 105 | Ag 95.9% by mass | PVP 4% by mass<br>Fe citrate 0.1% by mass | | Spin coating | PET | 150 | 20 | air |

TABLE 22

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example D31 | D7 | 55 | Ag 95.9% by mass | PVP 4% by mass<br>Co formate 0.1% by mass | | Spin coating | PET | 200 | 20 | air |
| Example D32 | D8 | 70 | Ag 95% by mass | Ni acetate 5% by mass | | Spin coating | PET | 150 | 20 | air |
| Example D33 | D8 | 65 | Ag 95% by mass | PVP 4% by mass<br>Ag citrate 1% by mass | | Spin coating | PET | 150 | 20 | air |
| Example D34 | D8 | 55 | Ag 95% by mass | Cu acetate 5% by mass | | Spin coating | PET | 150 | 20 | N₂ |
| Example D35 | D8 | 80 | Ag 95% by mass | Zn acetate 5% by mass | | Spin coating | PET | 150 | 20 | air |
| Example D36 | D8 | 70 | Ag 95% by mass | Mn acetate 5% by mass | | Spin coating | PET | 150 | 20 | air |
| Example D37 | D8 | 60 | Ag 95% by mass | Sn acetate 5% by mass | | Die coating | PET | 150 | 20 | air |
| Comparative example D1 | ITO sputter film | | Ag 94% by mass | PVP 5% by mass<br>Ni acetate 1% by mass | Sputter | Spin coating | Glass | 200 | 20 | air |
| Comparative example D2 | ITO sputter film | | Ag 94% by mass | PVP 5% by mass<br>Ni acetate 1% by mass | Sputter | Spin coating | Glass | 200 | 20 | air |

<Comparative Test D1>

The film thickness of the second transparent conductive film within each of the composite films obtained in examples D1 to D37 and comparative examples D1 and D2 was evaluated. The results of the evaluations are listed below in Table 23 and Table 24. First, the thickness of the second transparent conductive film following baking was measured directly from a film cross-section obtained using a SEM (scanning electron microscope 5800, manufactured by Hitachi, Ltd.).

<Comparative Test D2>

Each of the substrates having a conductive reflective film formed thereon obtained in examples D1 to D37 and comparative examples D1 and D2 was evaluated for the distribution of holes at the substrate-side contact surface, the reflectance and the thickness of the conductive reflective film. The results of these evaluations are listed below in Table 23 and Table 24.

Measurement of the holes was conducted by forming the conductive reflective film by applying the conductive reflective film composition to the substrate and performing baking, and then prior to application of the transparent conductive film composition, using an atomic force microscope (AFM) to inspect the uneven surface of the conductive reflective film on which the second transparent conductive film is subsequently formed. The uneven surface was analyzed, and the average diameter, average depth and number density of the holes that appeared at the film surface were evaluated. The average diameter was determined by measuring the maximum length and minimum length across each opening, and calculating the average value.

Evaluation of the reflectance of the conductive reflective film was performed using a combination of an ultraviolet-visible spectrophotometer and an integrating sphere, by measuring the diffuse reflectance of the conductive reflective film at wavelengths of 500 nm and 1,100 nm. The reflectance was measured after formation of the second transparent conductive film, by measuring the reflectance from the upper surface.

The film thickness of the conductive reflective film was measured from a cross-sectional image obtained using a scanning electron microscope (SEM).

<Comparative Test D3>

The adhesion to the substrate of each of the composite films obtained in examples D1 to D37 and comparative examples D1 and D2 was evaluated. The results of the evaluations are listed in Table 23 and Table 24. The adhesion was evaluated qualitatively on the basis of a peel test in which an adhesive tape was bonded to, and then peeled from, the composite film formed on the substrate. A result of "good" was recorded in those cases where only the adhesive tape peeled from the substrate, a result of "fair" was recorded in those cases where a mixed state was obtained in which only the adhesive tape peeled in some portions and the substrate surface was exposed in other portions, and a result of "poor" was recorded in those cases where peeling of the adhesive tape exposed the entire substrate surface.

TABLE 23

| | Composite film | | | | | | | |
|---|---|---|---|---|---|---|---|---|
| | | Conductive reflective film | | | | | | |
| | Transparent conductive film | Hole distribution at substrate-side contact surface | | | Reflectance [%] | | | |
| | Thickness [nm] | Average diameter [nm] | Average depth [nm] | Number density [holes/μm$^2$] | 500 nm | 1100 nm | Thickness [nm] | Adhesion |
| Example D1 | $1.0 \times 10^2$ | 60 | 70 | 18 | 82 | 93 | $1.0 \times 10^2$ | Good |
| Example D2 | $1.0 \times 10^2$ | 70 | 70 | 8 | 86 | 93 | $5.0 \times 10^2$ | Good |
| Example D3 | $1.0 \times 10^2$ | 80 | 60 | 12 | 82 | 90 | $1.0 \times 10^3$ | Good |
| Example D4 | $1.3 \times 10^2$ | 50 | 90 | 14 | 83 | 90 | $1.1 \times 10^3$ | Good |
| Example D5 | $1.3 \times 10^2$ | 80 | 50 | 6 | 88 | 92 | $1.0 \times 10^3$ | Good |
| Example D6 | $1.0 \times 10^2$ | 70 | 70 | 8 | 84 | 94 | $1.2 \times 10^3$ | Good |
| Example D7 | $1.0 \times 10^2$ | 60 | 50 | 12 | 83 | 91 | $1.0 \times 10^3$ | Good |
| Example D8 | $1.0 \times 10^2$ | 50 | 50 | 11 | 85 | 92 | $1.0 \times 10^3$ | Good |
| Example D9 | $1.0 \times 10^2$ | 80 | 80 | 9 | 85 | 93 | $1.9 \times 10^3$ | Good |
| Example D10 | $1.0 \times 10^2$ | 70 | 60 | 17 | 81 | 95 | $1.8 \times 10^3$ | Good |
| Example D11 | $1.0 \times 10^2$ | 65 | 40 | 20 | 82 | 92 | $2.0 \times 10^3$ | Good |
| Example D12 | $1.0 \times 10^2$ | 60 | 80 | 14 | 85 | 94 | $2.0 \times 10^3$ | Good |
| Example D13 | $1.0 \times 10^2$ | 40 | 50 | 12 | 85 | 92 | $2.0 \times 10^3$ | Good |
| Example D14 | $1.0 \times 10^2$ | 70 | 70 | 19 | 83 | 95 | $1.9 \times 10^3$ | Good |
| Example D15 | $1.0 \times 10^2$ | 60 | 60 | 24 | 88 | 92 | $1.0 \times 10^3$ | Good |
| Example D16 | $1.0 \times 10^2$ | 60 | 70 | 23 | 80 | 93 | $1.1 \times 10^3$ | Good |
| Example D17 | $1.0 \times 10^2$ | 50 | 50 | 14 | 82 | 95 | $1.0 \times 10^3$ | Good |
| Example D18 | $1.0 \times 10^2$ | 40 | 40 | 27 | 81 | 93 | $1.2 \times 10^3$ | Good |
| Example D19 | $1.0 \times 10^2$ | 30 | 40 | 25 | 85 | 96 | $1.2 \times 10^3$ | Good |
| Example D20 | $1.0 \times 10^2$ | 40 | 30 | 18 | 84 | 94 | $1.0 \times 10^3$ | Good |

TABLE 24

| | Transparent conductive film | Composite film — Conductive reflective film | | | | | | |
|---|---|---|---|---|---|---|---|---|
| | | Hole distribution at contact surface on side of transparent conductive film | | | Reflectance [%] | | Thickness | |
| | Thickness [nm] | Average diameter [nm] | Average depth [nm] | Number density [holes/μm²] | 500 nm | 1100 nm | [nm] | Adhesion |
| Example D21 | $1.0 \times 10^2$ | 70 | 70 | 23 | 84 | 93 | $1.0 \times 10^3$ | Good |
| Example D22 | $1.0 \times 10^2$ | 80 | 80 | 21 | 88 | 93 | $1.0 \times 10^3$ | Good |
| Example D23 | $1.0 \times 10^2$ | 60 | 60 | 9 | 82 | 96 | $1.0 \times 10^3$ | Good |
| Example D24 | $1.0 \times 10^2$ | 50 | 80 | 12 | 85 | 94 | $1.1 \times 10^3$ | Good |
| Example D25 | $1.0 \times 10^2$ | 40 | 70 | 13 | 86 | 95 | $1.0 \times 10^3$ | Good |
| Example D26 | $1.0 \times 10^2$ | 30 | 90 | 9 | 85 | 96 | $1.1 \times 10^3$ | Good |
| Example D27 | $1.0 \times 10^2$ | 40 | 50 | 15 | 85 | 96 | $1.0 \times 10^3$ | Good |
| Example D28 | $0.7 \times 10^2$ | 80 | 70 | 21 | 82 | 90 | $1.1 \times 10^3$ | Good |
| Example D29 | $0.7 \times 10^2$ | 70 | 80 | 15 | 84 | 92 | $1.0 \times 10^3$ | Good |
| Example D30 | $0.7 \times 10^2$ | 40 | 70 | 21 | 85 | 94 | $1.0 \times 10^3$ | Good |
| Example D31 | $0.7 \times 10^2$ | 30 | 90 | 19 | 85 | 95 | $1.2 \times 10^3$ | Good |
| Example D32 | $0.7 \times 10^2$ | 70 | 60 | 27 | 83 | 93 | $1.1 \times 10^3$ | Good |
| Example D33 | $0.7 \times 10^2$ | 50 | 50 | 25 | 86 | 96 | $1.0 \times 10^3$ | Good |
| Example D34 | $0.7 \times 10^2$ | 70 | 60 | 24 | 83 | 95 | $1.0 \times 10^3$ | Good |
| Example D35 | $0.7 \times 10^2$ | 60 | 80 | 17 | 81 | 93 | $1.0 \times 10^3$ | Good |
| Example D36 | $0.5 \times 10^2$ | 50 | 70 | 14 | 84 | 92 | $1.1 \times 10^3$ | Good |
| Example D37 | $0.2 \times 10^2$ | 80 | 40 | 15 | 87 | 97 | $1.0 \times 10^3$ | Good |
| Comparative example D1 | $0.7 \times 10^2$ | 60 | 70 | 18 | 75 | 83 | $1.0 \times 10^2$ | Good |
| Comparative example D2 | $2.0 \times 10^2$ | 60 | 70 | 18 | 78 | 87 | $1.0 \times 10^3$ | Fair |

As is evident from Table 23 and Table 24, of the comparative examples D1 and D2 in which the second transparent conductive film was formed by a sputtering method that represents a vacuum deposition method, comparative example D2 exhibited inferior adhesion to examples D1 to D37. In comparative example D1, the reflectance at 500 nm was a low value of only 75%, and even at 1,100 nm, the reflectance tended to be low. Furthermore, although the reflectance at 1,100 nm in comparative example D2 was a high value of 87%, the reflectance at 500 nm was a comparatively low value of only 78%, confirming that the reflectance varied considerably depending on the wavelength. In contrast, in examples D1 to D37, high reflectance values of not less than 80% were achieved at both the 500 nm wavelength and the 1,100 nm wavelength.

Examples E1 to E32

Conductive oxide microparticles dispersions and binder dispersions were prepared using the components and amounts listed for the classifications E1 to E8 detailed below in Table 25. The classification numbers from Table 25 for the dispersions used within the various examples are listed in Table 26 and Table 27.

In classification E1, as detailed below in Table 25, a total of 60 g of a mixture composed of 20% by mass of an IZO powder having an average particle size of 0.025 μm as conductive oxide microparticles and 80% by mass of isopropanol as a dispersion medium was placed in a 100 cc glass bottle, and using 100 g of zirconia beads with a diameter of 0.3 mm (MICRO HICA, manufactured by Showa Shell Sekiyu K.K.), the mixture was dispersed for 6 hours using a paint shaker, thus yielding a dispersion of conductive oxide microparticles. Further, in a separate preparation, 10% by mass of a mixed liquid of the non-polymeric binders 2-n-butoxyethanol and 3-isopropyl-2,4-pentanedione as the binder, 88.2% by mass of isopropanol as a dispersion medium, and 1.8% by mass of a mixture of indium nitrate and lead acetate (mass ratio 1:1) as a resistance reducer were combined and stirred for one hour at room temperature at a rotational rate of 200 rpm, thus forming a binder dispersion.

In classification E2, as detailed below in Table 25, a dispersion of conductive oxide microparticles was prepared in the same manner as the classification E1, using a mixture composed of 7.5% by mass of an ITO powder having an average particle size of 0.025 μm as the conductive oxide microparticles, 0.2% by mass of a titanium coupling agent represented by the above formula (24) as a coupling agent, and 92.3% by mass of a first mixed liquid composed of isopropanol, ethanol and N,N-dimethylformamide (mass ratio 4:2:1) as a dispersion medium. Further, a binder dispersion was prepared in the same manner as the classification E1, using 10% by mass of the non-polymeric binder 2,4-pentanedione as the binder and 90% by mass of the above first mixed liquid as a dispersion medium.

In classification E3, as detailed below in Table 25, a dispersion of conductive oxide microparticles was prepared in the same manner as the classification E1, using a mixture composed of 10% by mass of an ATO powder having an average particle size of 0.025 μm as the conductive oxide microparticles, 0.02% by mass of a titanium coupling agent represented by the above formula (24) as a coupling agent, and 89.98% by mass of the above first mixed liquid as a dispersion medium. Further, a binder dispersion was prepared in the same manner as the classification E1, using 10% by mass of the non-polymeric binder 2-n-propoxyethanol as the binder and 90% by mass of the above first mixed liquid as a dispersion medium.

In classification E4, as detailed below in Table 25, a dispersion of conductive oxide microparticles was prepared in the same manner as the classification E1, using a mixture composed of 10% by mass of an AZO powder having an average particle size of 0.025 μm as the conductive oxide microparticles, 1% by mass of a titanium coupling agent represented by the above formula (23) as a coupling agent, and 89% by mass of the above first mixed liquid as a dispersion medium. Further, a binder dispersion was prepared in the same manner as the classification E1, using 10% by mass of a mixed liquid of 2,2-dimethyl-3,5-hexanedione and isopropyl acetate (mass ratio 1:1) as the binder, and 90% by mass of the above first mixed liquid as a dispersion medium.

In classification E5, as detailed below in Table 25, a dispersion of conductive oxide microparticles was prepared in the same manner as the classification E1, using a mixture composed of 5% by mass of a TZO powder having an average particle size of 0.025 μm as the conductive oxide microparticles, 0.5% by mass of a titanium coupling agent represented by the above formula (25) as a coupling agent, and 94.5% by mass of the above first mixed liquid as a dispersion medium. Further, a binder dispersion was prepared in the same manner as the classification E1, using 10% by mass of a mixed liquid of 2-isobutoxyethanol, 2-hexyloxyethanol and n-propyl acetate (mass ratio 4:1:1) as the binder, and 90% by mass of the above first mixed liquid as a dispersion medium.

In classification E6, first, an ATO powder having an average particle size of 0.010 μm was suspended in water, the pH of the suspension was adjusted to a value of 7, and the suspension was treated for 30 minutes using a beads mill. The above first mixed liquid was added to the treated suspension as a dispersion medium, and the solid fraction concentration was adjusted to 18.5%, thus yielding a dispersion of conductive oxide microparticles. Further, a mixture containing 5% of gelatin as a binder, 1% by mass of hydroxypropylcellulose as a water-soluble cellulose derivative, and 94% by mass of water as the dispersion medium was stirred for one hour at a temperature of 30° C. at a rotational rate of 200 rpm, thus forming a binder dispersion.

In classification E7, as detailed below in Table 25, a dispersion of conductive oxide microparticles was prepared in the same manner as the classification E1, using a mixture composed of 6% by mass of an ATO powder having an average particle size of 0.025 μm as the conductive oxide microparticles, 85% by mass of a second mixed liquid composed of ethanol and butanol (mass ratio 98:2) as a dispersion medium, and 9.0% by mass of a titanium coupling agent represented by the above formula (23) as a coupling agent. Further, in a separate preparation, a binder dispersion was prepared by mixing 10% by mass of a $SiO_2$ binding agent as a binder and 90% by mass of the above second mixed liquid as a dispersion medium. The $SiO_2$ binding agent used as a binder was prepared using a 500 ml four-neck glass flask, by charging the flask with 140 g of tetraethoxysilane and 240 g of ethyl alcohol, adding 1.0 g of 12N-HCl dissolved in 25 g of pure water in a single batch with constant stirring, and then reacting the resulting mixture for 6 hours at 80° C.

In classification E8, as detailed below in Table 25, a dispersion of conductive oxide microparticles was prepared in the same manner as the classification E1, using 8% by mass of an ITO powder having an average particle size of 0.025 μm as the conductive oxide microparticles, 2.0% by mass of a titanium coupling agent represented by the above formula (22) as a coupling agent, and 90% by mass of the above second mixed liquid as a dispersion medium. Further, in a separate preparation, a binder dispersion was prepared by mixing 10% by mass of a $SiO_2$ binding agent as a binder and 90% by mass of the above second mixed liquid as a dispersion medium.

Next, using the procedure described below, conductive reflective film compositions were prepared.

First, silver nitrate was dissolved in deionized water to prepare a metal salt aqueous solution. Further, in a separate preparation, sodium citrate was dissolved in deionized water to prepare an aqueous solution of sodium citrate having a concentration of 26% by mass. A particulate ferrous sulfate was then added directly to, and dissolved in, the sodium citrate aqueous solution under a stream of nitrogen gas held at a temperature of 35° C., thus preparing a reducing agent aqueous solution containing a 3:2 molar ratio of citrate ions and ferrous ions.

Subsequently, with the stream of nitrogen gas held at 35° C., a magnetic stirrer bar was placed in the reducing agent aqueous solution, and with the reducing agent aqueous solution undergoing constant stirring by rotating the stirrer bar at a rate of 100 rpm, the metal salt aqueous solution was added dropwise to the reducing agent aqueous solution and mixed thoroughly. For this addition, the concentration of each of the solutions was altered so that the amount of the metal salt aqueous solution added to the reducing agent aqueous solution was not more than ¹⁄₁₀th of the amount of the reducing agent aqueous solution, thereby ensuring that the reaction temperature was maintained at 40° C. even though the added metal salt aqueous solution was at room temperature. Furthermore, the mixing ratio between the reducing agent aqueous solution and the metal salt aqueous solution was adjusted so that the molar ratios of both the citrate ions and the ferrous ions within the reducing agent aqueous solution, relative to the total atomic valence number of metal ions within the metal salt aqueous solution, was a 3-fold molar excess. Following completion of the dropwise addition of the metal salt aqueous solution to the reducing agent aqueous solution, stirring of the resulting mixed liquid was continued for a further 15 minutes, thereby generating metal particles within the mixed liquid and forming a metal particles dispersion containing dispersed metal particles. The pH of the metal particles dispersion was 5.5, and the stoichiometric amount of generated metal particles within the dispersion was 5 g/liter.

The thus obtained dispersion was left to stand at room temperature to allow the metal particles within the dispersion to settle out, and the settled metal particle aggregates were isolated by decantation. Deionized water was added to the isolated metal aggregates to form a dispersion, a demineralization treatment was conducted using ultrafiltration, and displacement washing was then performed using methanol, so as to achieve a metal (silver) content of 50% by mass. Subsequently, by using a centrifugal separator with appropriate adjustment of the centrifugal power to separate the comparatively large silver particles having a particle size exceeding 100 nm, a sample was prepared in which silver particles having a primary particle size within a range from 10 to 50 nm represented a number average of 71%. In other words, the silver nanoparticles were prepared such that relative to 100% of all the silver nanoparticles, the proportion of silver nanoparticles having a primary particle size within a range from 10 to 50 nm was a number average of 71%. The thus obtained silver nanoparticles were chemically modified with a protective agent having an organic molecular main chain with a carbon skeleton containing 3 carbon atoms.

Next, 10 parts by mass of the obtained metal nanoparticles were added to and dispersed within 90 parts by mass of a mixed solution of ethanol and methanol, and by subsequently adding the additives listed below in Table 26 to Table 28 in the proportions shown in Table 26 to Table 28, a series of conductive reflective film compositions was obtained. The metal nanoparticles used in forming these conductive reflective film compositions contained at least 75% of silver nanoparticles.

In those cases where silver nanoparticles and metal nanoparticles other than silver nanoparticles were combined as the metal nanoparticles, then the dispersion containing silver nanoparticles produced using the above method was deemed the first dispersion, a dispersion containing metal nanoparticles other than silver nanoparticles was prepared using the same method as the above method used for producing the silver nanoparticles, but with the exception of replacing the silver nitrate with a metal salt listed in Table 26 to Table 28 that is capable of forming metal nanoparticles other than silver nanoparticles, and this dispersion of metal nanoparticles was deemed the second dispersion, and the first dispersion and second dispersion were then mixed together, prior to the addition of additives, in the proportions listed in Table 26 to Table 28, thus forming a conductive reflective film composition.

Finally, composite films were formed using the conductive oxide microparticles dispersions, binder dispersions and conductive reflective film compositions prepared above. Specifically, first, one of the prepared dispersions of conductive oxide microparticles was applied to the substrate listed in Table 26 to Table 28 using one of a variety of different coating methods in an amount sufficient to generate a film thickness following baking of 0.01 to 0.5 µm, and was then dried at a temperature of 25° C. for 5 minutes to form a coating of the conductive oxide microparticles. Next, this coating of conductive oxide microparticles was impregnated with one of the prepared binder dispersions using one of a variety of different coating methods so that the binder dispersion penetrated to a predetermined depth of the conductive oxide microparticles coating, and the binder dispersion was then dried at a temperature of 25° C. for 5 minutes to form a transparent conductive coating. The binder dispersion was applied in such a manner that the mass of the binder component within the binder dispersion, relative to the total mass of microparticles contained within the applied coating of the conductive oxide microparticles was a mass ratio (mass of binder component within applied binder dispersion/mass of conductive oxide microparticles) listed below in Table 26 to Table 28. Subsequently, one of the prepared conductive reflective film compositions was applied to the transparent conductive coating using one of a variety of different coating methods in an amount sufficient to generate a film thickness following baking of 0.05 to 2.0 and was then dried at a temperature of 25° C. for 5 minutes to form a conductive reflective coating. By subsequently performing baking under the conditions detailed in Table 26 to Table 28, a composite film was formed on the substrate.

Figure 9:
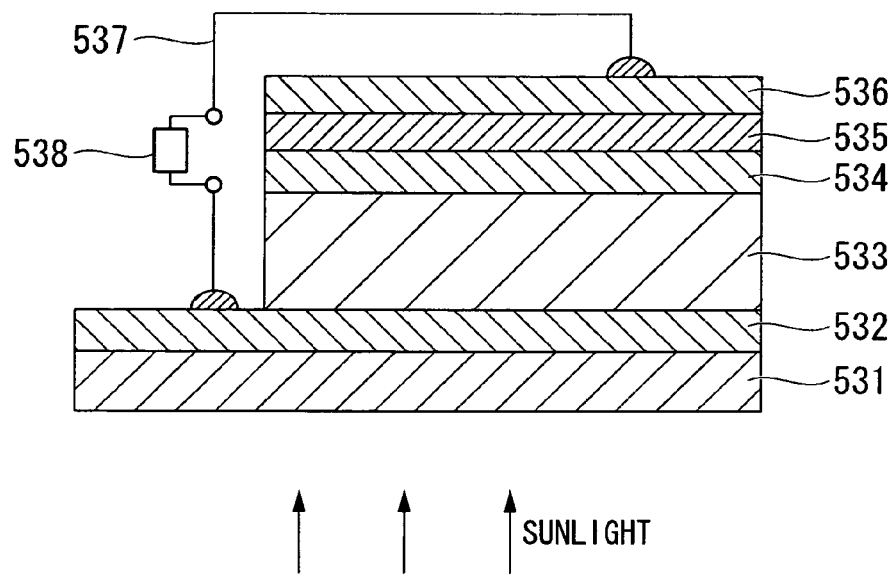
FIG. 9 is a diagram that schematically illustrates a cross-section of a thin-film solar cell formed in examples E1 to E37 and comparative examples E1 and E2.
Figure 10:
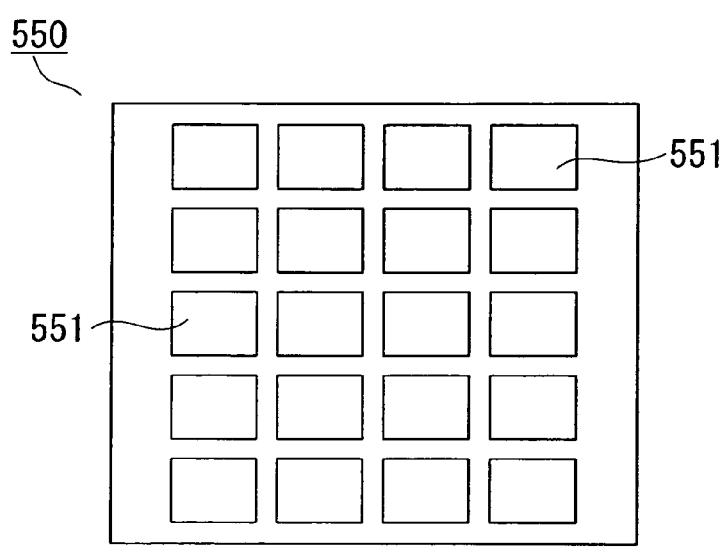
FIG. 10 is a diagram that schematically illustrates a top view of a thin-film solar cell formed in examples E1 to E37 and comparative examples E1 and E2.

Furthermore, thin-film solar cells were formed by forming a composite film according to the fifth embodiment of the present invention on top of the photovoltaic layer of a superstrate solar cell. Specifically, as illustrated in FIG. 9, a microcrystalline silicon layer having a thickness of 1.7 µm that functions as a photovoltaic layer 533 was first deposited by plasma CVD on a $SnO_2$ film 532 having a textured structure. Next, using the same conditions as those described above for forming a composite film on a substrate, a composite film composed of a second transparent conductive film 534 and a conductive reflective film 535 was formed on top of the photovoltaic layer 533. Subsequently, a mask pattern was placed over the surface of the conductive reflective film 535, a magnetron sputtering method was used to deposit an ITO film 536 of thickness 200 nm, and a laser patterning method was then used to remove those portions where the ITO film 536 had not been deposited, thus forming a thin-film solar cell of the type illustrated in the top view of FIG. 10. In FIG. 10, each of the regions indicated by the symbol 551 functions as an individual cell of the thin-film solar cell 550.

In Table 26 to Table 28, PVP represents a polyvinylpyrrolidone having a Mw of 360,000, and PET represents a polyethylene terephthalate.

Comparative Example E1

With the exception of applying the binder dispersion such that the mass ratio relative to the total mass of conductive oxide microparticles contained within the applied coating of the conductive oxide microparticles (mass of binder component within applied binder dispersion/mass of conductive oxide microparticles) was 150%, a composite film was formed on a substrate in the same manner as example E1.

Comparative Example E2

With the exception of applying the binder dispersion such that the mass ratio relative to the total mass of conductive oxide microparticles contained within the applied coating of the conductive oxide microparticles (mass of binder component within applied binder dispersion/mass of conductive oxide microparticles) was 200%, a composite film was formed on a substrate in the same manner as example E1.

TABLE 25

| | Conductive oxide microparticles dispersion | | | | | |
|---|---|---|---|---|---|---|
| | Conductive oxide | | | Binder dispersion | | |
| Classification | microparticles | Dispersion medium | Coupling agent | Binder | Dispersion medium | Other |
| E1 | IZO 20% by mass | Isopropanol 80% by mass | None | Non-polymeric binder 10% by mass | Isopropanol 88.2% by mass | Resistance reducer 1.8% by mass |
| E2 | ITO 7.5% by mass | First mixed liquid 92.3% by mass | Titanium coupling agent 0.2% by mass | Non-polymeric binder 10% by mass | First mixed liquid 90% by mass | None |
| E3 | ATO 10% by mass | First mixed liquid 89.98% by mass | Titanium coupling agent 0.02% by mass | Non-polymeric binder 10% by mass | First mixed liquid 90% by mass | None |
| E4 | AZO 10% by mass | First mixed liquid 89% by mass | Titanium coupling agent 1% by mass | Non-polymeric binder 10% by mass | First mixed liquid 90% by mass | None |
| E5 | TZO 5% by mass | First mixed liquid 94.5% by mass | Titanium coupling agent 0.5% by mass | Non-polymeric binder 10% by mass | First mixed liquid 90% by mass | None |
| E6 | ATO 18.5% by mass | First mixed liquid 81.5% by mass | None | Gelatin 5% by mass | Water 94% by mass | Water-soluble cellulose derivative 1% by mass |
| E7 | ATO 6% by mass | Second mixed liquid 85% by mass | Titanium coupling agent 9.0% by mass | $SiO_2$ binding agent 10% by mass | Second mixed liquid 90% by mass | None |

TABLE 25-continued

| | Conductive oxide microparticles dispersion | | | | Binder dispersion | | |
|---|---|---|---|---|---|---|---|
| | Conductive oxide | | | | | | |
| Classification | microparticles | Dispersion medium | Coupling agent | Binder | Dispersion medium | Other | |
| E8 | ITO 8% by mass | Second mixed liquid 90% by mass | Titanium coupling agent 2.0% by mass | SiO₂ binding agent 10% by mass | Second mixed liquid 90% by mass | None | |

TABLE 26

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example E1 | E1 | 40 | Ag 94% by mass | PVP 5% by mass<br>Ni acetate 1% by mass | | Spin coating | Glass | 200 | 20 | air |
| Example E2 | E2 | 30 | Ag 96% by mass | PVP 3% by mass<br>Cu acetate 1% by mass | | Spin coating | Glass | 200 | 20 | air |
| Example E3 | E3 | 40 | Ag 89% by mass<br>Au 5% by mass | PVP-dimethylaminoethyl methacrylate 5% by mass<br>Zn acetate 1% by mass | | Spin coating | Glass | 200 | 20 | air |
| Example E4 | E6 | 25 | Ag 72% by mass<br>Pd 24% by mass | Methylcellulose 3% by mass<br>Mo acetate 1% by mass | | Spin coating | Glass | 200 | 20 | air |
| Example E5 | E6 | 20 | Ag 94% by mass<br>Ru 2% by mass | Hydroxypropylmethyl-cellulose 3% by mass<br>Sn acetate 1% by mass | | Spin coating | Glass | 200 | 20 | air |
| Example E6 | E4 | 30 | Ag 92% by mass<br>Cu 4% by mass | PVP 3% by mass<br>Sn acetate 1% by mass | | Dispenser coating | Glass | 130 | 20 | N2 |
| Example E7 | E5 | 30 | Ag 95.8% by mass<br>Sn 0.2% by mass | PVP 3% by mass<br>Sn acetate 1% by mass | | Dispenser coating | Glass | 200 | 20 | air |
| Example E8 | E1 | 30 | Ag 96.8% by mass<br>In 0.2% by mass | PVP 2% by mass<br>Sn acetate 1% by mass | | Dispenser coating | Glass | 130 | 20 | air |
| Example E9 | E1 | 40 | Ag 95.8% by mass<br>Zn 0.2% by mass | PVP 3% by mass<br>Sn acetate 1% by mass | | Offset printing | Glass | 320 | 20 | air |
| Example E10 | E1 | 30 | Ag 95.8% by mass<br>Fe 0.2% by mass | PVP 3% by mass<br>Zn acetate 1% by mass | | Offset printing | Glass | 320 | 20 | air |
| Example E11 | E1 | 40 | Ag 95.8% by mass<br>Fe 0.2% by mass | PVP 3% by mass<br>Ni acetate 1% by mass | | Screen printing | Glass | 150 | 20 | air |
| Example E12 | E1 | 30 | Ag 96.8% by mass<br>Mn 0.2% by mass | PVP 3% by mass | | Screen printing | Glass | 150 | 20 | air |
| Example E13 | E2 | 15 | Ag 90% by mass | PVP 9% by mass<br>Al₂O₃ 1% by mass | | Knife coating | Glass | 150 | 60 | air |
| Example E14 | E2 | 40 | Ag 99% by mass | PVP 0.9% by mass<br>SiO₂ 0.1% by mass | | Slit coating | Glass | 400 | 60 | air |
| Example E15 | E2 | 20 | Ag 95% by mass | PVP 4% by mass<br>TiO₂ 1% by mass | | Spin coating | Glass | 150 | 20 | air |

TABLE 27

| | Dispersion | | Conductive reflective film composition | | Coating method | | | Baking treatment | | |
|---|---|---|---|---|---|---|---|---|---|---|
| | Classification | Mass ratio [%] | Metal nanoparticles | Additives | Transparent conductive film | Conductive reflective film | Substrate | Temperature [° C.] | Time [min.] | Atmosphere |
| Example E16 | E2 | 30 | Ag 95% by mass | PVP 4% by mass<br>Cr₂O₃ 1% by mass | | Spin coating | Glass | 150 | 20 | air |
| Example E17 | E2 | 10 | Ag 95% by mass | PVP 4% by mass<br>MnO₂ 1% by mass | | Spin coating | Glass | 150 | 20 | air |
| Example E18 | E2 | 45 | Ag 95% by mass | PVP 4% by mass<br>Fe₂O₃ 0.5% by mass<br>Cr₃O₄ 0.5% by mass | | Spin coating | Glass | 150 | 20 | air |
| Example E19 | E2 | 35 | Ag 95% by mass | PVP 4% by mass<br>Ag₂O 1% by mass | | Spin coating | Glass | 150 | 20 | air |
| Example E20 | E3 | 25 | Ag 95% by mass | PVP 4% by mass<br>Cu(OH)₂ 1% by mass | | Spin coating | Glass | 150 | 20 | Ar |
| Example E21 | E3 | 45 | Ag 95% by mass | PVP 4% by mass<br>ZnO 1% by mass | | Spin coating | PET | 150 | 20 | air |

TABLE 27-continued

| | Dispersion | | Conductive reflective film composition | | Coating method | | | Baking treatment | | |
|---|---|---|---|---|---|---|---|---|---|---|
| | Classi-fication | Mass ratio [%] | Metal nanoparticles | Additives | Transparent conductive film | Conductive reflective film | Substrate | Temperature [° C.] | Time [min.] | Atmos-phere |
| Example E22 | E3 | 35 | Ag 95% by mass | PVP 4% by mass MoO₂ 1% by mass | | Spin coating | PET | 150 | 20 | air |
| Example E23 | E3 | 20 | Ag 95% by mass | PVP 4% by mass SnO₂ 1% by mass | | Spin coating | PET | 150 | 20 | air |
| Example E24 | E3 | 25 | Ag 95% by mass | PVP 4% by mass ITO 1% by mass | | Spin coating | PET | 150 | 20 | air |
| Example E25 | E3 | 15 | Ag 95% by mass | PVP 4% by mass ATO 1% by mass | | Spin coating | PET | 150 | 20 | air |
| Example E26 | E3 | 25 | Ag 95% by mass | PVP 4% by mass Methyl silicate 1% by mass | | Spin coating | PET | 150 | 20 | air |
| Example E27 | E7 | 30 | Ag 95% by mass | PVP 4% by mass Titanium isopropoxide 1% by mass | | Spin coating | PET | 150 | 20 | air |
| Example E28 | E7 | 40 | Ag 95% by mass | PVP 4% by mass Ammonium chromate 1% by mass | | Spin coating | PET | 150 | 20 | air |
| Example E29 | E7 | 35 | Ag 95.9% by mass | PVP 4% by mass Mn formate 0.1% by mass | | Spin coating | PET | 150 | 20 | air |
| Example E30 | E7 | 15 | Ag 95.9% by mass | PVP 4% by mass Fe citrate 0.1% by mass | | Spin coating | PET | 150 | 20 | air |

TABLE 28

| | Dispersion | | Conductive reflective film composition | | Coating method | | | Baking treatment | | |
|---|---|---|---|---|---|---|---|---|---|---|
| | Classi-fication | Mass ratio [%] | Metal nanoparticles | Additives | Transparent conductive film | Conductive reflective film | Substrate | Temperature [° C.] | Time [min.] | Atmos-phere |
| Example E31 | E7 | 25 | Ag 95.9% by mass | PVP 4% by mass Co formate 0.1% by mass | | Spin coating | PET | 200 | 20 | air |
| Example E32 | E8 | 20 | Ag 95% by mass | Ni acetate 5% by mass | | Spin coating | PET | 150 | 20 | air |
| Example E33 | E8 | 35 | Ag 95% by mass | PVP 4% by mass Ag citrate 1% by mass | | Spin coating | PET | 150 | 20 | air |
| Example E34 | E8 | 25 | Ag 95% by mass | Cu acetate 5% by mass | | Spin coating | PET | 150 | 20 | N₂ |
| Example E35 | E8 | 45 | Ag 95% by mass | Zn acetate 5% by mass | | Spin coating | PET | 150 | 20 | air |
| Example E36 | E8 | 35 | Ag 95% by mass | Mn acetate 5% by mass | | Spin coating | PET | 150 | 20 | air |
| Example E37 | E8 | 20 | Ag 95% by mass | Sn acetate 5% by mass | | Die coating | PET | 150 | 20 | air |
| Comparative example E1 | E1 | 150 | Ag 94% by mass | PVP 5% by mass Ni acetate 1% by mass | | Spin coating | Glass | 200 | 20 | air |
| Comparative example E2 | E5 | 200 | Ag 94% by mass | PVP 5% by mass Ni acetate 1% by mass | | Spin coating | Glass | 200 | 20 | air |

<Comparative Test E1>

The film thickness of the second transparent conductive film within each of the composite films obtained in examples E1 to E37 and comparative examples E1 and E2 were evaluated. The results of the evaluations are listed below in Table 29 and Table 30. First, the thickness of the second transparent conductive film following baking was measured directly from a film cross-section obtained using a SEM (scanning electron microscope S800, manufactured by Hitachi, Ltd.). Further, the proportion of protrusion of the second layer within the second transparent conductive film was also measured. Specifically, each sample was processed using a focused ion beam (FIB) method to expose a sample cross-section, and this sample cross-section was then inspected using a scanning electron microscope (SEM).

<Comparative Test E2>

Each of the substrates having a conductive reflective film formed thereon obtained in examples E1 to E37 and comparative examples E1 and E2 was evaluated for the distribution of holes at the substrate-side contact surface, the back side reflectance and the thickness of the conductive reflective film. The results of these evaluations are listed below in Table 29 and Table 30.

Measurement of the holes was conducted using different methods, depending on whether or not the conductive reflective film was able to be pulled away from the second transparent conductive film.

In those examples where the conductive reflective film was able to be pulled away from the second transparent conductive film, first, an adhesive was applied to a jig having a flat surface, and the jig was pressed against the conductive reflective film bonded to the second transparent conductive film. Following a holding period to allow the adhesive to dry and generate a powerful adhesion, the jig was pulled perpendicularly away from the second transparent conductive film using a pull tester (EZ-TEST, manufactured by Shimadzu Corporation), thereby pulling the conductive reflective film away from the second transparent conductive film.

Subsequently, the uneven surface of the conductive reflective film exposed on the jig that had been peeled away from the second transparent conductive film, which prior to peeling was the substrate-side contact surface of the conductive reflective film, was inspected using an atomic force microscope (AFM). The uneven surface was analyzed, and the average diameter, average depth and number density of the holes that appeared at the film surface were evaluated. The average diameter was determined by measuring the maximum length and minimum length across each opening, and calculating the average value.

Further, another method of pulling the conductive reflective film away from the second transparent conductive film, in which a double-sided tape was bonded to the conductive reflective film, and one end of this tape was then pulled up, thereby peeling the conductive reflective film away from the second conductive reflective film, was also used.

In those examples where the conductive reflective film was not able to be pulled away from the second transparent conductive film, first the conductive reflective film bonded to the second transparent conductive film was processed using a focused ion beam (FIB) to expose a cross-section of the sample. This sample cross-section was inspected using a scanning electron microscope (SEM), and the shape of the interface between the conductive reflective film and the second transparent conductive film was observed. The diameter, average depth and number density of openings within this interface image were evaluated. For each of the evaluated openings, the diameter was taken as being the maximum length across the opening within the cross-sectional image.

Evaluation of the back side reflectance of the conductive reflective film was performed using a combination of an ultraviolet-visible spectrophotometer and an integrating sphere, by measuring the diffuse reflectance of the conductive reflective film at wavelengths of 500 nm and 1,100 nm.

The film thickness of the conductive reflective film was measured from a cross-sectional image obtained using a scanning electron microscope (SEM).

<Comparative Test E3>

The adhesion to the substrate of each of the composite films obtained in examples E1 to E37 and comparative examples E1 and E2 was evaluated. The results of the evaluations are listed below in Table 29 and Table 30. The adhesion was evaluated qualitatively on the basis of a peel test in which an adhesive tape was bonded to, and then peeled from, the composite film formed on the substrate. A result of "good" was recorded in those cases where only the adhesive tape peeled from the substrate, a result of "fair" was recorded in those cases where a mixed state was obtained in which only the adhesive tape peeled in some portions and the substrate surface was exposed in other portions, and a result of "poor" was recorded in those cases where peeling of the adhesive tape exposed the entire substrate surface.

<Comparative Test E4>

Each of the individual cells 551 of a thin-film solar cell illustrated in FIG. 10 obtained in examples E1 to E37 and comparative examples E1 and E2 was evaluated and a cell failure rate was recorded. The results are shown below in Table 29 and Table 30. Specifically, as illustrated in FIG. 9, a laser patterning method was used to remove the photovoltaic layer 533 and the like, a probe 537 was provided to connect the surface of the exposed $SnO_2$ film 532 and the ITO film 536, and an I-V tracer 538 was installed between the two films. In this state, the electric power generated when a light of AM 1.5 was irradiated with an intensity of 100 W/cm² onto the solar cell from the side of the glass substrate 531 was evaluated. A fill factor result of 0.5 or less was deemed a fail, and the number of individual cell failures relative to the total individual cell count of 50 was reported as a cell failure rate for each of the examples and comparative examples.

TABLE 29

| | Composite film | | | | | | | | |
|---|---|---|---|---|---|---|---|---|---|
| | Transparent conductive film | | Conductive reflective film | | | | | | |
| | | Degree of protrusion of second layer | Hole distribution at substrate-side contact surface | | | Reflectance [%] | | | | |
| | Thickness [nm] | [%] | Average diameter [nm] | Average depth [nm] | Number density [holes/μm²] | 500 nm | 1100 nm | Thickness [nm] | Adhesion | Cell failure rate [%] |
| Example E1 | $1.0 \times 10^2$ | 5 | 70 | 70 | 20 | 85 | 94 | $1.0 \times 10^2$ | Good | 5% or less |
| Example E2 | $1.0 \times 10^2$ | 10 | 80 | 50 | 10 | 83 | 91 | $5.0 \times 10^2$ | Good | 5% or less |
| Example E3 | $1.0 \times 10^2$ | 5 | 89 | 50 | 10 | 87 | 96 | $1.0 \times 10^3$ | Good | 5% or less |
| Example E4 | $1.3 \times 10^2$ | 15 | 70 | 90 | 5 | 83 | 95 | $1.1 \times 10^3$ | Good | 5% or less |
| Example E5 | $1.3 \times 10^2$ | 7 | 90 | 50 | 10 | 82 | 93 | $1.0 \times 10^3$ | Good | 5% or less |
| Example E6 | $1.0 \times 10^2$ | 10 | 90 | 70 | 20 | 84 | 93 | $1.2 \times 10^3$ | Good | 5% or less |
| Example E7 | $1.0 \times 10^2$ | 15 | 80 | 60 | 15 | 83 | 92 | $1.0 \times 10^3$ | Good | 5% or less |
| Example E8 | $1.0 \times 10^2$ | 10 | 70 | 45 | 22 | 81 | 91 | $1.0 \times 10^3$ | Good | 5% or less |
| Example E9 | $1.0 \times 10^2$ | 2 | 90 | 70 | 16 | 86 | 95 | $1.9 \times 10^3$ | Good | 5% or less |
| Example E10 | $1.0 \times 10^2$ | 15 | 80 | 60 | 20 | 85 | 97 | $1.8 \times 10^3$ | Good | 5% or less |
| Example E11 | $1.0 \times 10^2$ | 3 | 70 | 50 | 20 | 86 | 92 | $2.0 \times 10^3$ | Good | 5% or less |
| Example E12 | $1.0 \times 10^2$ | 10 | 60 | 90 | 10 | 82 | 89 | $2.0 \times 10^3$ | Good | 5% or less |
| Example E13 | $1.0 \times 10^2$ | 30 | 50 | 95 | 5 | 80 | 90 | $2.0 \times 10^3$ | Good | 5% or less |
| Example E14 | $1.0 \times 10^2$ | 2 | 90 | 80 | 20 | 84 | 92 | $1.9 \times 10^3$ | Good | 5% or less |

TABLE 29-continued

| | Composite film | | | | | | | | | |
|---|---|---|---|---|---|---|---|---|---|---|
| | Transparent conductive film | | | | | | | | | |
| | | Degree of protrusion of second layer | Conductive reflective film | | | | | | | |
| | | | Hole distribution at substrate-side contact surface | | | Reflectance [%] | | | | |
| | Thickness | | Average diameter | Average depth | Number density | 500 nm | 1100 nm | Thickness | Adhesion | Cell failure rate [%] |
| | [nm] | [%] | [nm] | [nm] | [holes/μm²] | | | [nm] | | |
| Example E15 | $1.0 \times 10^2$ | 15 | 70 | 60 | 25 | 83 | 93 | $1.0 \times 10^3$ | Good | 5% or less |
| Example E16 | $1.0 \times 10^2$ | 10 | 80 | 65 | 15 | 85 | 94 | $1.1 \times 10^3$ | Good | 5% or less |
| Example E17 | $1.0 \times 10^2$ | 25 | 90 | 60 | 20 | 80 | 90 | $1.0 \times 10^3$ | Good | 5% or less |
| Example E18 | $1.0 \times 10^2$ | 1 | 40 | 50 | 10 | 85 | 95 | $1.2 \times 10^3$ | Good | 5% or less |
| Example E19 | $1.0 \times 10^2$ | 8 | 30 | 30 | 10 | 86 | 96 | $1.2 \times 10^3$ | Good | 5% or less |
| Example E20 | $1.0 \times 10^2$ | 10 | 50 | 50 | 10 | 82 | 92 | $1.0 \times 10^3$ | Good | 5% or less |

TABLE 30

| | Composite film | | | | | | | | | |
|---|---|---|---|---|---|---|---|---|---|---|
| | Transparent conductive film | | | | | | | | | |
| | | Degree of protrusion of second layer | Conductive reflective film | | | | | | | |
| | | | Hole distribution at substrate-side contact surface | | | Reflectance [%] | | | | |
| | Thickness | | Average diameter | Average depth | Number density | 500 nm | 1100 nm | Thickness | Adhesion | Cell failure rate [%] |
| | [nm] | [%] | [nm] | [nm] | [holes/μm²] | | | [nm] | | |
| Example E21 | $1.0 \times 10^2$ | 2 | 80 | 80 | 20 | 83 | 95 | $1.0 \times 10^3$ | Good | 5% or less |
| Example E22 | $1.0 \times 10^2$ | 10 | 90 | 90 | 28 | 81 | 97 | $1.0 \times 10^3$ | Good | 5% or less |
| Example E23 | $1.0 \times 10^2$ | 25 | 80 | 75 | 25 | 86 | 97 | $1.0 \times 10^3$ | Good | 5% or less |
| Example E24 | $1.0 \times 10^2$ | 20 | 50 | 90 | 20 | 83 | 94 | $1.1 \times 10^3$ | Good | 5% or less |
| Example E25 | $1.0 \times 10^2$ | 10 | 70 | 80 | 15 | 85 | 92 | $1.0 \times 10^3$ | Good | 5% or less |
| Example E26 | $1.0 \times 10^2$ | 6 | 60 | 90 | 20 | 80 | 96 | $1.1 \times 10^3$ | Good | 5% or less |
| Example E27 | $1.0 \times 10^2$ | 10 | 40 | 50 | 15 | 88 | 95 | $1.0 \times 10^3$ | Good | 5% or less |
| Example E28 | $0.7 \times 10^2$ | 5 | 95 | 95 | 12 | 88 | 90 | $1.1 \times 10^3$ | Good | 5% or less |
| Example E29 | $0.7 \times 10^2$ | 10 | 80 | 85 | 5 | 84 | 92 | $1.0 \times 10^3$ | Good | 5% or less |
| Example E30 | $0.7 \times 10^2$ | 30 | 55 | 80 | 10 | 82 | 94 | $1.0 \times 10^3$ | Good | 5% or less |
| Example E31 | $0.7 \times 10^2$ | 20 | 50 | 90 | 5 | 84 | 90 | $1.2 \times 10^3$ | Good | 5% or less |
| Example E32 | $0.7 \times 10^2$ | 20 | 80 | 80 | 10 | 81 | 91 | $1.1 \times 10^3$ | Good | 5% or less |
| Example E33 | $0.7 \times 10^2$ | 15 | 70 | 60 | 15 | 86 | 94 | $1.0 \times 10^3$ | Good | 5% or less |
| Example E34 | $0.7 \times 10^2$ | 20 | 90 | 60 | 20 | 85 | 92 | $1.0 \times 10^3$ | Good | 5% or less |
| Example E35 | $0.5 \times 10^2$ | 1 | 80 | 90 | 10 | 89 | 92 | $1.0 \times 10^3$ | Good | 5% or less |
| Example E36 | $0.3 \times 10^2$ | 10 | 80 | 70 | 20 | 83 | 93 | $1.1 \times 10^3$ | Good | 5% or less |
| Example E37 | $0.2 \times 10^2$ | 20 | 90 | 50 | 10 | 85 | 94 | $1.0 \times 10^3$ | Good | 5% or less |
| Comparative example E1 | $0.5 \times 10^2$ | 0 | 70 | 70 | 20 | 86 | 80 | $1.0 \times 10^2$ | Good | 20% |
| Comparative example E2 | $1.0 \times 10^2$ | 0 | 70 | 70 | 20 | 87 | 90 | $1.0 \times 10^3$ | Fair | 50% |

As is evident from Table 29 and Table 30, of the comparative examples E1 and E2, comparative example E2 exhibited inferior adhesion to examples E1 to E37. In comparative example E1 and E2, although the reflectance values at 500 nm and the reflectance values at 1,100 nm were high values similar to those obtained in examples E1 to E37, the cell failure rate was very high in both cases. In contrast, in examples E1 to E37, excellent cell failure rates of 5% or less were obtained.

INDUSTRIAL APPLICABILITY

One aspect of the present invention is extremely useful as a technique for producing, at low cost, an electrode which is ideal for use within a superstrate solar cell in which a transparent substrate such as glass functions as the light receiving surface, wherein the electrode is provided on the opposite side from the light receiving surface.

Another aspect of the present invention is extremely useful as a technique for producing, at low cost, an electrode that is provided on the back side (the opposite side from the light receiving surface) of a so-called substrate solar cell in which the opposite surface from the substrate of glass or the like functions as the light receiving surface.

Furthermore, by employing the present invention, transparent conductive films and conductive reflective films that have conventionally been formed by vacuum deposition methods can be formed by using coating and baking processes, meaning a dramatic reduction in production costs can be expected.

The invention claimed is:

1. A composite film for a superstrate thin-film solar cell, having two layers composed of a transparent conductive film formed on a photovoltaic layer of a superstrate thin-film solar cell, and a conductive reflective film formed on top of said transparent conductive film, wherein said transparent conductive film is formed by using a wet coating method to apply a transparent conductive film composition comprising microparticles of a conductive oxide and either one or both of a polymeric binder and a non-polymeric binder that cure upon heating, said polymeric binder is one or more selected from acrylic resins, polycarbonates, polyesters, alkyd resins, polyurethanes, acrylic urethanes, polystyrenes, polyacetals, polyamides, polyvinyl alcohols, polyvinyl acetates, and celluloses, said non-polymeric binder is one or more selected from metal soaps, metal complexes, metal alkoxides, 2-alkoxyethanols, β-diketones, and alkyl acetates, metal contained within said metal soap, said metal complex, or said metal alkoxide is aluminum, titanium, chromium, manganese, iron, cobalt, nickel, silver, copper, zinc, molybdenum, tin, indium, or antimony, said conductive reflective film is formed by using a wet coating method to apply a conductive reflective film composition comprising metal nanoparticles, an average diameter of holes occurring at a surface of said conductive reflective film in direct contact with said transparent conductive film is not more than 100 nm, an average depth at which said holes are positioned is not more than 100 nm, and a number density of said holes is not more than 30 holes/$\mu m^2$, said conductive reflective film comprises one or more materials selected from the group consisting of polyvinylpyrrolidones, polyvinylpyrrolidone copolymers and water-soluble celluloses, and said composite film is manufactured by a method comprising:

forming a transparent conductive coating by applying said transparent conductive film composition to said photovoltaic layer and drying an applied coating at a temperature of 20 to 120° C.;

forming a conductive reflective coating by applying said conductive reflective film composition to said transparent conductive coating and drying an applied coating at a temperature of 20 to 120° C.; and baking both of said transparent conductive coating and said conductive reflective coating at a temperature of 130 to 400° C. in a state where said conductive reflective coating is directly on said transparent conductive coating.

* * * * *